United States Patent [19]
Onozawa

[11] Patent Number: 5,903,036
[45] Date of Patent: May 11, 1999

[54] SEMICONDUCTOR DEVICE HAVING MISFET SRAM CELLS IN WHICH ACTIVE REGIONS AND GATE ELECTRODES ARE DIMENSIONED FOR INCREASING STORAGE NODE CAPACITANCES WITHOUT INCREASING MEMORY CELL SIZE

[75] Inventor: Kazunori Onozawa, Takasaki, Japan

[73] Assignee: Hitachi, Ltd., Tokyo, Japan

[21] Appl. No.: 08/820,247

[22] Filed: Mar. 18, 1997

Related U.S. Application Data

[63] Continuation of application No. 08/343,994, Nov. 18, 1994, abandoned.

[30] Foreign Application Priority Data

Nov. 22, 1993 [JP] Japan ................................. 5-291948

[51] Int. Cl.⁶ .............................................. H01L 27/112
[52] U.S. Cl. ........................................ 257/390; 257/903
[58] Field of Search ..................................... 257/903, 390

[56] References Cited

U.S. PATENT DOCUMENTS 5,239,196  8/1993  Ikeda et al. .............................. 257/903
5,461,251  10/1995  Yang et al. ............................. 257/903

Primary Examiner—David B. Hardy
Attorney, Agent, or Firm—Antonelli, Terry, Stout & Kraus, LLP

[57] ABSTRACT

A semiconductor device is constituted by an arrangement of MISFET type SRAM cells structured such that near the edge of active regions of the driver MISFETs in each memory cell, at least one of the source and drain regions of each driver MISFET is offset against the gate electrode of that MISFET. This offset structure is formed by implantation of impurities using a mask covering the edge proximity of the active regions. Moreover, near one edge of the gate electrode of each driver MISFET in an SRAM memory cell, the gate length of that driver MISFET is at least twice the gate length of the MISFET which has the shortest gate length and which constitutes part of a memory cell or a peripheral circuit. Also, at one edge of the gate electrode of each driver MISFET in an SRAM memory cell, the spacing distance between the gate electrode of that driver MISFET and the gate electrode (word line) of a transfer MISFET is made substantially the same in at least two directions. Also, the spacing distance between the gate electrode of each driver MISFET and the gate electrode of a corresponding driver MISFET in an adjacent memory cell is made substantially the same as the spacing distance between the gate electrode of each driver MISFET and the gate electrode (word line) of the transfer MISFET connected thereto.

18 Claims, 43 Drawing Sheets

SEMICONDUCTOR DEVICE HAVING MISFET SRAM CELLS IN WHICH ACTIVE REGIONS AND GATE ELECTRODES ARE DIMENSIONED FOR INCREASING STORAGE NODE CAPACITANCES WITHOUT INCREASING MEMORY CELL SIZE

This application is a continuation of application Ser. No. 08/343,994, filed on Nov. 18, 1994, now abandoned.

BACKGROUND OF THE INVENTION

The present invention relates to a semiconductor integrated circuit device and, more particularly, to improvements applied advantageously to a semiconductor integrated circuit device having an SRAM (static random access memory).

Recently, efforts have been made at various institutions to develop SRAMs having as large as 1 to 4 megabits of memory capacity. The design rules being applied envisage carrying out fabrication to about 0.4 μm.

As shown in FIG. 44, the general SRAM chip layout is composed of memory cell arrays for holding data. At the periphery of the memory cell arrays are word drivers, pre-decoders and Y-switches, i.e., direct peripheral circuits that select appropriate memory cells when data is written or read thereto or therefrom. These circuits are, in turn, surrounded by input and output buffers, i.e., peripheral circuits for controlling actual circuit operations. In the description that follows, the direct peripheral circuits and their associated peripheral circuits will be referred to simply as peripheral circuits.

The memory cells in the above-mentioned memory cell arrays are of one of two types: high resistance load type, and complete CMOS (complementary metal oxide semiconductor) type. The high resistance load type memory cell combines resistor elements with n-channel MISFETs (metal insulator semiconductor field effect transistors); the complete CMOS type memory cell combines n-channel MISFETs with p-channel MISFETs. These memory cells are designed for high degrees of integration and high yield in fabrication.

The so-called CMOS SRAM is used as the main memory for systems for which low costs are emphasized, such as mainframe computers and workstations. The CMOS SRAM combines high resistance load type or complete CMOS type memory cells with peripheral circuits composed of MISFETs. For the mainframe computers and workstations to operate at high speed, it is necessary to have a cache memory outside their main memory, the cache accommodating data temporarily for fast access thereto. The cache memory is made up of what is known as a bipolar CMOS SRAM. The bipolar CMOS SRAM combines high resistance load type or complete CMOS type memory cells with peripheral circuits composed of bipolar transistors and CMOSFETs. The SRAM is discussed illustratively in IEDM (International Electron Device Meeting), Tech. Dig., pp. 447–480, 1991.

As depicted in FIG. 45, a high resistance load type memory cell of the SRAM typically comprises a pair of driver MISFETs $Qd_1$ and $Qd_2$, a pair of resistor elements (load elements) R1 and R2, a pair of transistor MISFETs $Qt_1$ and $Qt_2$, a pair of complementary data lines (DL, bar DL), and a pair of word lines $WL_1$ and $WL_2$. The driver MISFETs $Qd_1$ and $Qd_2$ as well as the transfer MISFETs $Qt_1$ and $Qt_2$ are an n-channel MISFET each.

The two driver MISFETs $Qd_1$ and $Qd_2$ and the pair of resistor elements $R_1$ and $R_2$ constitute a flip-flop circuit that acts as a data storage part. That is, when both transfer MISFETs $Qt_1$ and $Qt_2$ are off, this storage part stores one-bit data by stabilizing in one of two states. In one state, a storage node A (one of two I/O terminals of the flip-flop circuit) is at the high potential level while a storage node B (the other of the two I/O terminals) is at the low potential level (at this point, the driver MISFET $Qd_1$ is turned off, preventing currents from flowing through the resistor element $R_1$; the driver MISFET $Qd_2$ is turned on, allowing a holding current to flow through the resistor element $R_2$). In the other state in which the data storage part is stabilized to retain one-bit data, the storage node A is at the low potential level while the storage node B is at the high potential level (at this point, the driver MISFET $Qd_1$ is turned on, allowing the holding current to flow through the resistor element $R_1$; the driver MISFET $Qd_2$ is turned off, preventing currents from flowing through the resistor element $R_2$).

To write data to the above memory cell requires setting the word lines $WL_1$ and $WL_2$ at the high potential level and turning on the transfer MISFETs $Qt_1$ and $Qt_2$. This causes the data on the data lines DL and bar DL to be transmitted to the storage nodes A and B. To read data from the memory cell involves setting the word lines $WL_1$ and $WL_2$ at the high potential level and turning on the transfer MISFETs $Qt_1$ and $Qt_2$. This transmits the data on the storage nodes A and B to the data lines DL and bar DL.

In the memory cell, a pn junction capacitance ($Cpn_1$) and a gate capacitance ($Cox_1$) shown in FIG. 45 are generated between the storage node A and the substrate (p-type semiconductor substrate or p-type well). Thus when the storage node A is illustratively at the high potential level, the pn junction capacitance ($Cpn_1$) and gate capacitance ($Cox_1$) are charged electrically. The greater the pn junction capacitance ($Cpn_1$) and the gate capacity ($Cox_1$), the more stable the high potential level held in the storage node A. Likewise, another pn junction capacitance ($Cpn_2$) and another gate capacitance ($Cox_2$) are formed between the storage node B and the substrate. In the latter case, too, the greater the capacitances, the more stable the high potential level held in the storage node B.

FIG. 46 is a plan view of a typical layout pattern including active regions 50, gate electrodes 51 of the driver MISFETs $Qd_1$ and $Qd_2$, gate electrodes 52 (word lines $WL_1$ and $WL_2$) of the transfer MISFETs $Qt_1$ and $Qt_2$ in a memory cell formed on the semiconductor substrate. The driver MISFETs $Qd_1$ and $Qd_2$, transfer MISFETs $Qt_1$ and $Qt_2$, storage nodes A and B, and word lines $WL_1$ and $WL_2$ correspond to their counterpart circuits in FIG. 45.

FIG. 47A is a plan view schematically showing the gate capacitances (Cox) in effect when the storage node A of the memory cell is at the high potential level. As illustrated, the gate capacity ($Cox_2$) of the driver MISFET $Qd_2$ being turned on comprises two components: one formed in a channel forming region (indicated by hatching pattern), the other in a capacitance-dedicated region (indicated by shadow pattern). The gate capacitance ($Cox_1$) of the driver MISFET $Qd_1$ being turned off is generated in the overlapping area between the gate electrode and the drain region (indicated by hatching pattern).

As shown in FIG. 47A, one edge of each of the gate electrodes 51 for the driver MISFETs $Qd_1$ and $Qd_2$ extends in the direction of a field insulating film. The electrode extension corresponds to an allowance (x) for mask alignment provided when the gate electrodes 51 are formed by etching a conductive layer deposited on the semiconductor substrate. As will be explained later, too small allowance (x)

for mask alignment would leave the edges of the gate electrodes 51 shrunk toward the active regions 50. Should this occur, the drain and source regions would come too close to each other at the edge of each active region 50, thereby making it difficult to ward off leaks therebetween and to retain data stably.

The high resistance load type memory cell mentioned above is fabricated illustratively in the process to be described below. Of the figures (FIGS. 48 through 67) showing how the memory cell is fabricated, the plan views give only the conductive layers of the cell and not the insulating layer between these layers.

As shown in FIG. 48, FIG. 49 (cross-sectional view taken on line A–A' in FIG. 48) and FIG. 50 (cross-sectional view taken on line B–B' in FIG. 48), a field insulating film 55 is first formed illustratively by the LOCOS (localized oxidation of silicon) method on a p-type well 54 over a p-type semiconductor substrate 53 made of silicon single crystal. After the field insulating film 55 is formed, a gate insulating film 56 is deposited on the surface of the active regions 50 surrounded by the field insulating film 55.

Next, a first layer polycrystal silicon film deposited on the semiconductor substrate 53 is patterned by optical lithography and etching techniques into the gate electrodes 51 of the driver MISFETs $Qd_1$ and $Qd_2$ and the gate electrodes 52 (word lines $WL_1$ and $WL_2$) of the transfer MISFETs $Qt_1$ and $Qt_2$. After the gate electrodes 51 and 52 are formed, they are used as the mask with which n-type impurity ions (e.g., phosphorus (P)) are implanted into the semiconductor substrate 53. This produces $n^-$ type semiconductor regions 57 of low impurity density. The $n^-$ type semiconductor regions 57 constitute part of the source and drain regions of the driver MISFETs $Qd_1$ and $Qd_2$, and part of the source and drain regions of the transfer MISFETs $Qt_1$ and $Qt_2$.

Then as shown in FIGS. 51 and 52, a silicon oxide film deposited on the semiconductor substrate 53 is etched anisotropically into side wall spacers 58 of the side walls for both the gate electrodes 51 of the driver MISFETs $Qd_1$ and $Qd_2$ and the gate electrodes 52 (word lines $WL_1$ and $WL_2$) of the transfer MISFETs $Qt_1$ and $Qt_2$. With the side wall spacers 58 thus formed, the gate electrodes 51 and 52 and the side wall spacers 58 are used as the mask with which n-type impurity ions (such as arsenic (As)) are implanted into the semiconductor substrate 53. This produces $n^+$ type semiconductor regions 59 of high impurity density. The $n^+$ type semiconductor regions 59 constitute part of the source and drain regions for the driver MISFETs $Qd_1$ and $Qd_2$, and part of the source and drain regions for the transfer MISFETs $Qt_1$ and $Qt_2$.

Then as shown in FIG. 53, FIG. 54 (cross-sectional view taken on line A–A' in FIG. 53) and FIG. 55 (cross-sectional view taken on line B–B' in FIG. 53), a silicon oxide film 60 is deposited on the semiconductor substrate 53 so as to form connecting holes 61, 62 and 63 spanning the $n^+$ type semiconductor regions 59 and the gate electrodes 51 of the driver MISFETs $Qd_1$ and $Qd_2$. After this, a second layer polycrystal silicon film 64 is deposited on the silicon oxide film 60. This film is patterned into the plane layout shown in FIG. 57.

Thereafter, as shown in FIG. 56, FIG. 57 (cross-sectional view taken on line A–A' in FIG. 56) and FIG. 58 (cross-sectional view taken on line B–B' in FIG. 56), a photo resist film 65 is used as the mask with which n-type impurity ions (phosphorus (P), arsenic (As), antimony (Sb), etc.) are implanted into part of the polycrystal silicon film 64. The ion implantation splits the polycrystal silicon film 64 into low-resistance wiring 64A, pad layers 64B and 64C, and resistor elements $R_1$ and $R_2$, as depicted in FIG. 59, FIG. 60 (cross-sectional view taken on line A–A' in FIG. 59), and FIG. 61 (cross-sectional view taken on line B–B' in FIG. 59).

One end of each of the resistor elements $R_1$ and $R_2$ is supplied with a circuit power source voltage Vcc via the wiring 64A. The other end of each of the resistor elements $R_1$ and $R_2$ is connected via connecting holes 63 both to the drain regions ($n^+$ type semiconductor regions 59) on one side of the driver MISFETs $Qd_1$ and $Qd_2$, and to the gate electrodes 51 on the other side thereof. In this manner, the high resistance load type memory cell is made smaller than ever by locating the resistor elements $R_1$ and $R_2$ in the layer above the driver MISFETs $Qd_1$ and $Qd_2$.

Then as shown in FIG. 62, FIG. 63 (cross-sectional view taken on line A–A' in FIG. 62) and FIG. 64 (cross-sectional view taken on line B–B' in FIG. 62), a first layer insulating film 66 is deposited on top of the wiring 64A, the pad layers 64B and 64C, and the resistor elements $R_1$ and $R_2$. This produces connecting holes 67 reaching the pad layer 64B and connecting holes 68 reaching the pad layer 64C. With the connecting holes produced, a first layer aluminum (Al) film is deposited over the layer insulating film 66, and is patterned into wiring 69A, a pad layer 69B and word shunts 69C. The wiring 69A is connected to the source regions ($n^+$ type semiconductor regions 59) of the driver MISFETs $Qd_1$ and $Qd_2$ via the connecting holes 68, pad layer 64C and connecting holes 62. The source regions are in turn connected via the wiring 69A to a circuit reference voltage Vss. The word shunts 69C are connected to the word lines $WL_1$ and $WL_2$ via connecting holes formed in regions, not shown, of the layer insulating film 66. For the ease of viewing, FIG. 62 omits showing the active regions, the gate electrodes 51 of the driver MISFETs $Qd_1$ and $Qd_2$, and the gate electrodes 52 (word lines $WL_1$ and $WL_2$) of the transfer MISFETs $Qt_1$ and $Qt_2$.

Then as shown in FIG. 65, FIG. 66 (cross-sectional view taken on line A–A' in FIG. 65) and FIG. 67 (cross-sectional view taken on line B–B' in FIG. 65), a second layer insulating film 70 is deposited on top of the wiring 69A, the pad layer 69B, and the word shunts 69C. This produces connecting holes 71 reaching the pad layer 69B. With the connecting holes 71 produced, a second layer aluminum (Al) film is deposited over the layer insulating film 70, and is patterned into the data lines (DL, bar DL). For the ease of viewing, FIG. 65 omits showing the active regions, the gate electrodes 51 of the driver MISFETs $Qd_1$ and $Qd_2$, the gate electrodes 52 (word lines $WL_1$ and $WL_2$) of the transfer MISFETs $Qt_1$ and $Qt_2$, the wiring layer 64A, the pad layers 64B and 64C, and the resistor elements $R_1$ and $R_2$.

The data line (DL) is connected to the drain regions ($n^+$ type semiconductor regions 59) of the transfer MISFET $Qt_2$ via the connecting holes 71, pad layer 69B, connecting holes 67, pad layer 64B and connecting holes 61. The data line (bar DL) is connected to the drain regions ($n^+$ type semiconductor regions 59) of the transfer MISFET $Qt_1$ via the connecting holes 71, pad layer 69B, connecting holes 67, pad layer 64B and connecting holes 61. After this, a final passivation film 72 is deposited over the data lines (DL, bar DL), whereby the high resistance load type memory cell is completed.

Suppose that the above-described memory cell of a dual-layer polycrystal silicon film, dual-layer aluminum wiring structure is to be designed illustratively under rules on fabrication to 0.4 µm. In that case, the source and drain regions ($n^+$ type semiconductor regions 59) of the driver MISFETs Qd$_1$ and Qd$_2$ and of the transfer MISFETs Qt$_1$ and Qt$_2$ need to be 0.15 μm in junction depth.

In the above process where the first layer insulating film 66 is etched to form the connecting holes 68 for connecting the first layer aluminum wiring (wiring 69A) with the second layer polycrystal silicon film (pad layer 64C), the second layer polycrystal silicon film (pad layer 64C) under the layer insulating film 66 is etched by about 0.1 μm through over-etching action. Since the wiring 69A made of aluminum has the p-type conductivity, an attempt to connect the wiring 69A to the source regions (n$^+$ type semiconductor regions 59) of the driver MISFETs Qd$_1$ and Qd$_2$ without the intermediary of the pad layer 64C can result in leaks or short-circuits between the wiring 69A and the p-type well 54 under the shallow n$^+$ type semiconductor regions 59. With that taken into account, it is indispensable to form the pad layer 64C using the second layer polycrystal silicon film.

As described, where the above-described memory cell of the dual-layer polycrystal silicon film, dual-layer aluminum wiring structure is designed illustratively under rules on fabrication to about 0.4 μm, the memory cell size is determined by two factors. One of the two determining factors is the accuracy in fabricating the second layer polycrystal silicon film constituting the wiring layer 64A, pad layer 64B and 64C, and resistor elements R$_1$ and R$_2$. The other factor that determines the memory cell size is the accuracy of photo resist film alignment in effect when impurity ions are implanted into the second layer polycrystal silicon film (see FIGS. 56 to 58).

SUMMARY OF THE INVENTION

Recently developed SRAMs are required to run on reduced operating voltages to permit low power dissipation of the system. However, studies conducted by this inventor have revealed that SRAMs comprising memory cells of the dual-layer polycrystal silicon film, dual-layer metal wiring structure, especially the bipolar CMOS SRAM, have difficulty meeting the low operating voltage requirement in view of the necessary resistance to the so-called soft error attributable to α-rays.

The soft error caused by α-rays is a phenomenon in which the data held in a memory cell is destroyed by α-rays entering the cell. The α-rays are included in cosmic rays (He nuclei) or are emitted from radioactive atoms contained in the resin of the LSI package.

An α-ray particle has 5 eV of energy. When incident on a silicon (Si) substrate, the α-ray particle generates 1.4×10$^{16}$ electron-hole pairs. If α-rays enter the storage node (e.g., node A) of the high potential level in a memory cell, the electrons generated by the α-rays flow into the node A (i.e., drain regions of the driver MISFETs) while the similarly generated holes flow into the p-type well of the reference potential (Vss).

Suppose that the storage node A was at the high potential level before α-rays entered it, that the node A had a charge Q$_A$ prior to the ray incidence, and that the incident α-rays have generated N electron-hole pairs, the electrons flowing to the storage node A, the holes flowing to the reference potential side (i.e., p-type well). In that case, as shown in Table 1 below, the charge and the potential of the storage node A drop momentarily, so that the data held in the memory cell can be inverted with a certain probability. This is the mechanism of the phenomenon known as the soft error.

TABLE 1

Drops in Storage Node Potential (High Potential Level) Caused by Incident α-Rays

|  | Before α-ray incidence | Immediately after α-ray incidence |
|---|---|---|
| Charge held in the node | Q$_A$ | Q$_A$ − qN |
| Node potential | Q$_A$/C$_{OX}$ + C$_{PN}$ | Q$_A$ − qN/C$_{OX}$ + C$_{PN}$ |

As mentioned earlier, the potential V$_A$ (=Q$_A$/C$_{OX}$+C$_{PN}$) of the storage node A at the high potential level drops momentarily upon incidence of α-rays by the amount of $$|\Delta V_A|=qN/C_{OX}+C_{PN} \quad (1)$$

As indicated, to improve the resistance to soft errors caused by α-rays requires minimizing the potential (|ΔQ$_A$|), i.e., increasing the gate capacitance (Cox) and the pn junction capacitance (Cpn) formed between the storage node and the p-type well. The gate capacity (Cox) and the pn junction capacitance (Cpn) are expressed respectively by the following equations (2) and (3):

$$C_{ox}=S_G\hat{\epsilon}_{ox}\epsilon_o/t_{ox} \quad (2)$$

where, SG: gate capacitance area
$\hat{\epsilon}_{ox}$: dielectric constant of SiO$_2$ film
$\epsilon_o$: dielectric constant in vacuum
$t_{ox}$: thickness of gate oxide film $$C_{pn}=S_{pn}\hat{\epsilon}_{Si}\epsilon_o/X_d \quad (3)$$

where, S$_{pn}$: pn junction area of storage node
$\hat{\epsilon}_{Si}$: dielectric constant of silicon
X$_d$: depletion layer width of pn junction From equation (2) above, it can be seen that the gate capacitance (Cox) is boosted by minimizing the thickness of the gate oxide film (Tox). The minimum allowable thickness of the gate oxide film (Tox) is determined either by the power source voltage used or by the hot carrier life of the MISFETs operating on that power source voltage. Equation (3) above indicates that raising the impurity density of the p-type well to reduce the depletion layer width (x$_d$) of the pn junction enhances the pn junction capacitance (Cpn). The maximum allowable impurity density of the p-type well is determined by that controllability of the MISFETs which is dependent on the threshold voltage.

The gate capacitance (Cox) and pn junction capacitance (Cpn) of the storage node are raised by increasing the gate area and the pn junction area. In the case of the above-described memory cell of the dual-layer polycrystal silicon film, dual-layer aluminum wiring structure, the gate capacitance (Cox) and pn junction capacitance (Cpn) may be enhanced without raising the memory cell size when the area of the active regions is enlarged to increase the effective gate width for the driver MISFETs. However, increasing the gate width of the driver MISFETs by these measures can lead to difficulties to be described below, and can drastically lower the yield in fabrication.

Specifically, as discussed earlier with reference to FIG. 47A, the gate electrodes 51 of the driver MISFETs Qd$_1$ and Qd$_2$ are formed on the p-type well active regions 50 by appropriately patterning the first layer polycrystal silicon film using optical lithography and etching techniques. During the process, one edge of each of the gate electrodes 51 is allowed to extend in the direction of the field insulating film, the extension corresponding to the allowance (x) for mask alignment in gate electrode formation. Incidentally, optical lithography is described illustratively in "VLSI Fabrication Technology" (published by Nikkei BP Ltd.; pp. 203–206, 1989). Furthermore, optical lithography and etching techniques are described illustratively in "VLSI Technology" (edited by S. M. Sze, published by McGraw-Hill Ltd.; pp. 267–281, 303–312, 1983).

When the gate width for the driver MISFETs is increased (i.e., active region area is enlarged) with the memory cell size kept unchanged, the width increase lowers the mask alignment allowance (x'<x), causing (as will be described with reference to FIG. 68) the tip of each gate electrode to shrink (by $\Delta z$) as shown in FIG. 47B. Thus the gate electrode edges on the field insulating film approach the active regions. As a result, the drain and source regions formed to flank the gate electrodes come close to one another at the edge of the active regions. With leaks liable to occur between the storage node (drain region) and the reference voltage (source region), it becomes impossible for the memory cell to hold its data stably. In the worst case scenario, the drain and source regions conduct.

The allowance (x) for mask alignment for the gate electrodes of the driver MISFETs should be set by taking the following factors into consideration:

(a) Mask alignment precision and size control precision ($x_1$) of the aligner to be used;

(b) Rounding (radius of curvature R) of corners in the photo resist pattern for gate electrode fabrication; and (c) Amount of shrink ($\Delta z$) of the gate electrode edge due to a optical wraparound effect during photo resist exposure. FIG. 68 plots data representing the dependency of the shrink ($\Delta z$) on the mask size in the traverse direction in effect when a demagnifying projection aligner pursuant to the rule on fabrication scale-down to 0.4 $\mu$m is used. In FIG. 68, the X-axis represents the mask size $Y_1$ in the traverse direction, and the Y-axis stands for the amount of one-side shrink $\Delta z$ in the longitudinal direction (one-side reduction in photo resist size). As shown in FIG. 68, the minimum fabrication increment of 0.4 $\mu$m corresponds to about 0.3 $\mu$m of shrink ($\Delta z$) for the gate electrode edge. The data in FIG. 68 constitutes shrink data obtained with discrete mask patterns.

With the factors (a) through (c) above taken into account, the allowance (x) for mask alignment of the gate electrodes for the driver MISFETs should be set so as to meet the following expression:

$$x \geq x_1 + R + \Delta z \quad (4)$$

For example, if the gate length (Lg) for the driver MISFETs is 0.5 $\mu$m, then $x_1=0.2$ $\mu$m, R=0.2 $\mu$m and $\Delta z=0.1$ $\mu$m. In that case, the mask alignment allowance (x) should be at least 0.5 $\mu$m. When dispersions in fabrication are taken into account, it is difficult to increase the gate width for the driver MISFETs at the expense of the mask alignment allowance (x).

For the reason above, it is difficult, in the case of the above-described memory cell of the dual-layer polycrystal silicon film, dual-layer metal wiring structure, to increase the gate capacitance (Cox) and pn junction capacitance (Cpn) by enlarging the gate capacitance area (Sg) and the pn junction area (Spn) of the storage nodes. This points to difficulty in enhancing the resistance to soft errors caused by $\alpha$-rays.

Generally, mainframe computers and workstations have their main memory equipped with a soft error correction feature allowing for the soft error rate of about 1000 Fit ($10^{-6}$ errors/hour; 1 Fit=$10^{-9}$ errors/hour) or less. On the other hand, the cache memory subject to high-speed access must typically meet the requirement of the soft error rate of 50 Fit (5×$10^{-8}$ errors/hour) or less. This illustrates the high degree of resistance to soft errors required of the cache memory for systems, namely the bipolar CMOS SRAM, compared with the CMOS SRAM used in the main memory of systems.

As shown in equation (1), the change in potential ($|\Delta Q_A|$) of the storage node at the high potential level upon incidence of $\alpha$-rays is inversely proportional to the sum of the gate capacity (Cox) and pn junction capacity (Cpn). However, the potential change is independent of the power source voltage (Vcc). Meanwhile, if the power source voltage (Vcc) is reduced so as to save power for the system, the high potential level of the storage node drops correspondingly, whereby the resistance to soft errors is eroded significantly. Thus in the case of the bipolar CMOS SRAM in particular, it is necessary to boost the storage node capacitances of the memory cells in keeping with any drops in the operating voltage.

The relationship between the soft error rate of the memory cells in the SRAM and the operating voltage is dependent on the resin material of the LSI package and on the material of the passivation film over the semiconductor chip surface. Where materials of general use in the art are employed, the relationship between the soft error rate and the power source voltage is as shown in FIG. 69. In FIG. 69, relationship (a) is in effect when the node capacitance is 58 fF (58×$10^{-15}$ farads); relationship (b) is in effect when the node capacitance is 13 fF (13×$10^{-5}$ farads).

As illustrated in FIG. 69, the storage node capacitance needs to be at least 13 fF if the soft error rate is to be 50 Fit or less when the power supply voltage (Vcc) is lowered from 5.0±0.3 V to 3.3±0.3 V.

When the memory cell of the above-described structure is to be designed under rules on fabrication to 0.4 $\mu$m, the size of that memory cell is about 20 $\mu m^2$ in accordance with the pattern of the second layer polycrystal silicon film 64 shown in FIG. 53. At this point, the total storage node capacitance is only 5.8 fF (gate capacitance is 2.1 fF). This means that although the soft error rate of 50 Fit is ensured while the power supply voltage Vcc is 5.0±0.3 V, the resistance to soft errors is almost gone when the power supply voltage Vcc is reduced to 3.3±0.3 V.

A method has been proposed to increase the storage node capacitance without enlarging the memory cell size. This method, known as the stacked capacitor technique, involves stacking at least three polycrystal silicon films. However, this method requires designing elaborate memory cell structures and putting complicated fabrication processes in place. In that respect, the method is not suitable for fabricating the bipolar CMOS SRAMs constituting bipolar transistors on the same semiconductor substrate.

It is therefore a primary object of the present invention to provide an SRAM offering enhanced resistance to soft errors by increasing the storage node capacitance with the memory cell size kept unchanged.

It is another object of the invention to provide SRAM techniques aimed at accomplishing the primary object without complicating the memory cell structure or the fabrication process involved.

It is a further object of the invention to provide SRAM techniques aimed at accomplishing the primary object without destabilizing the data held in the memory cell.

It is an even further object of the invention to provide SRAM techniques aimed at accomplishing the primary object without lowering the driving capability of the driver MISFETs incorporated.

These and other objects, features and advantages of the invention will become more apparent upon a reading of the following description and appended drawings.

Major features of the invention disclosed herein are as follows:

(1) There is provided an SRAM where the gate electrode of a driver MISFET of a memory cell is formed above the main surface of a semiconductor substrate. Near the edge portion of the active regions where the memory cell is formed, at least one of the source and drain regions of the driver MISFET is offset against the gate electrode of the driver MISFET. The offset structure is fabricated by implanting impurities using a mask that covers the proximity of the edge portion of the active regions.

(2) There is provided an SRAM where the gate electrode of a driver MISFET and the gate electrode (word line) of a transfer MISFET in a memory cell are each composed of a first conductive film deposited above the main surface of the semiconductor substrate. At one edge of the gate electrode for the driver MISFET, the spacing distance (or gap) between the gate electrode of the driver MISFET and the gate electrode (word line) of the transfer MISFET is made substantially the same in at least two directions. The spacing distance (or gap) between the gate electrode of the driver MISFET in this cell and that of a driver MISFET in an adjacent memory cell is made substantially the same as the space between the gate electrode of the driver MISFET and the gate electrode (word line) of the transfer MISFET.

(3) In the SRAM defined in (2) above, the spacing distance (or gap) between the gate electrode of the driver MISFET and the gate electrode (word line) of the transfer MISFET, the line width of the gate electrode (word line) of the transfer MISFET, and the spacing distance (or gap) between the gate electrode (word line) of the transfer MISFET and that of the transfer MISFET in the adjacent memory cell, are all made substantially the same.

(4) There is provided an SRAM where, at one edge of the gate electrode of a driver MISFET, the gate length of the driver MISFET is made at least double the gate length of the MISFET which has the shortest gate length and which constitutes part of a memory cell or a peripheral circuit.

Suppose that an SRAM memory cell of a dual-layer polycrystal silicon film, dual-layer metal wiring structure is to be formed. In that case, the size of the memory cell is defined by two factors. One determining factor is the accuracy in fabricating the second layer polycrystal silicon film constituting the resistor elements and other parts. The other factor that determines the memory cell size is the accuracy of photo resist film alignment in effect when impurity ions are implanted into the second layer polycrystal silicon film. This means that there is room for optimization regarding the active region pattern and the gate electrode pattern for the driver MISFETs formed by the first layer polycrystal silicon film.

According to the feature (1) outlined above, near the edge of the active regions, at least one of the source and drain regions of the driver MISFET is offset against the gate electrode. This prevents the drain and source regions of the driver MISFET from getting close to each other at the active region edge even when the mask alignment allowance for the gate electrode edge is reduced to let the edge of the gate electrode on the field insulating film approach the active regions. As a result, no leaks occur between the storage node (drain region) and the reference voltage (source region). This makes it possible to enlarge the area of the active regions without increasing the memory cell size and to enhance the effective area of the gate electrode of the driver MISFETS, whereby the gate capacitance component of the storage node capacitance is boosted. Because a mask is utilized, inadvertent implantation of impurities near the active regions is suppressed unfailingly.

The feature (2) outlined above prevents excess exposure light from sneaking to the edge of the gate electrode for the driver MISFET when the photo resist pattern is formed. The pattern is used by the demagnifying projection aligner exposing the photo resist film to fabricate the gate electrode of the driver MISFET and the gate electrode (word line) of the transfer MISFET. This prevents the conventionally experienced contraction of the photo resist pattern at the edge portion of the gate electrodes.

With the contraction of the photo resist pattern forestalled, the mask alignment allowance for the edge portion of the gate electrode is reduced. As a result, the area of the active regions is increased without enlarging the memory cell size, and the effective area of the gate electrodes for the driver MISFETS is boosted so as to raise the gate capacitance component of the storage node capacitance.

The feature (3) outlined above affords periodicity to three kinds of spacing distance (or gap): the spacing distance between the gate electrode of the driver MISFET and the gate electrode (word line) of the transfer MISFET, the line width of the gate electrode (word line) of the transfer MISFET, and the spacing distance between the gate electrode (word line) of the transfer MISFET and that of the transfer MISFET in the adjacent memory cell, near the edge of the gate electrodes for the driver MISFETS. Thus when the photo resist pattern is formed for use by the demagnifying projection aligner exposing the photo resist film to fabricate the gate electrodes of the driver MISFETs and the gate electrodes (word lines) of the transfer MISFETS, it is possible to prevent the contraction of the photo resist pattern at the edge of the gate electrodes of the driver MISFETS.

With the contraction of the photo resist pattern thus prevented, the mask alignment allowance for the edge portion of the gate electrode is reduced. As a result, the area of the active regions is increased without enlarging the memory cell size, and the effective area of the gate electrodes for the driver MISFETs is boosted so as to raise the gate capacitance component of the storage node capacitance.

According to the feature (4) outlined above, the gate length for the driver MISFET is made at least double the minimum resolution increment of the demagnifying projection aligner. This makes substantially negligible the amount of contraction of the gate electrode edge portion illustrated in FIG. 68.

With the amount of gate electrode edge contraction reduced to a negligible quantity, the mask alignment allowance for the edge portion of the gate electrode is reduced. This in turn reduces the alignment allowance (x) in FIG. 47A. It then follows that the area of the active regions is increased without enlarging the memory cell size, and that the effective area of the gate electrodes for the driver MISFETs is boosted so as to raise the gate capacitance component of the storage node capacitance.

DESCRIPTION OF THE PREFERRED EMBODIMENTS

Figure 1:
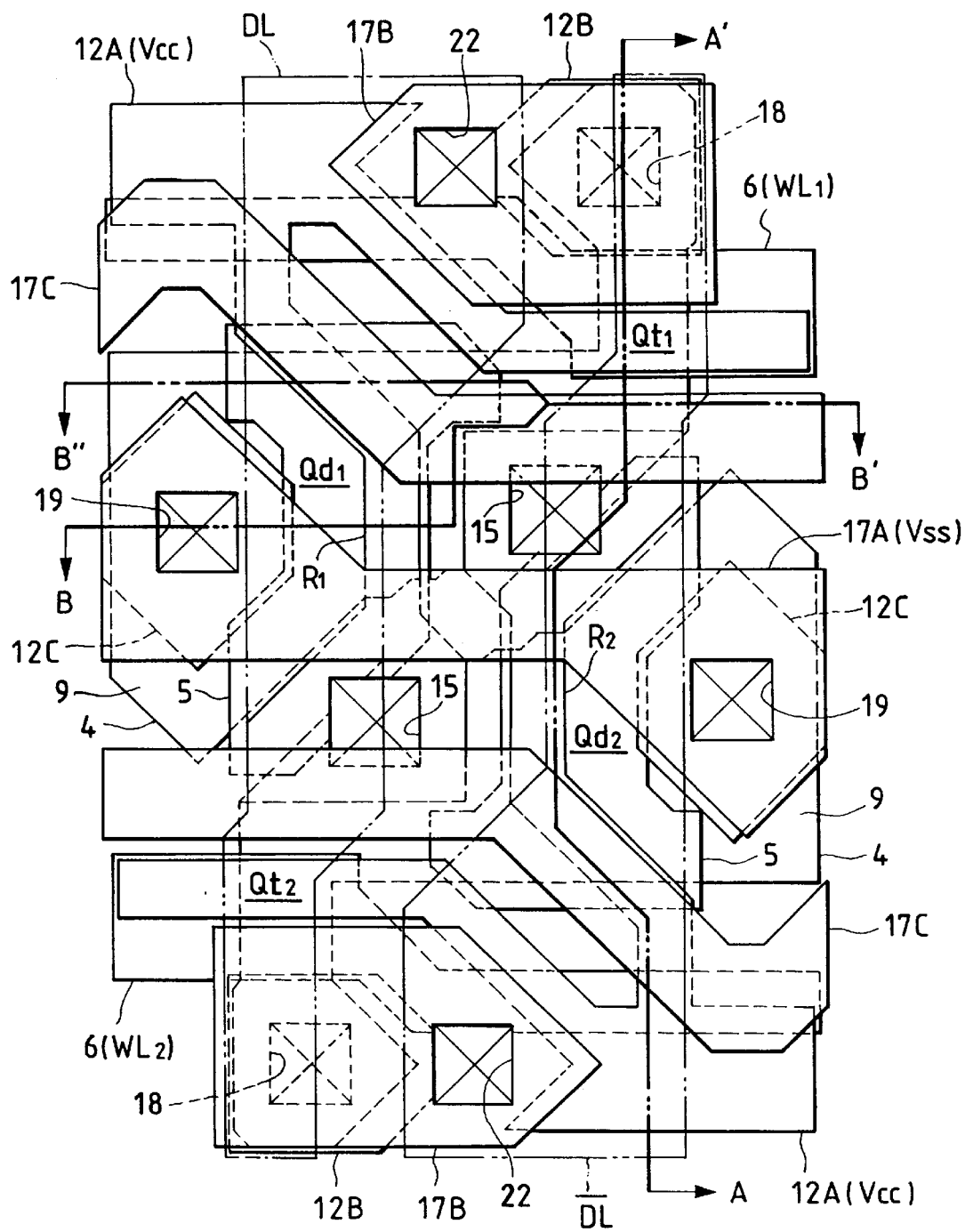
FIG. 1 is a plan view of a memory cell in an SRAM embodying the invention.

Preferred embodiments of the invention will now be described in detail with reference to the accompanying drawings. Throughout the figures, like reference characters denote like or corresponding parts. Descriptions of the parts will be omitted if they are repetitive.

Figure 2:
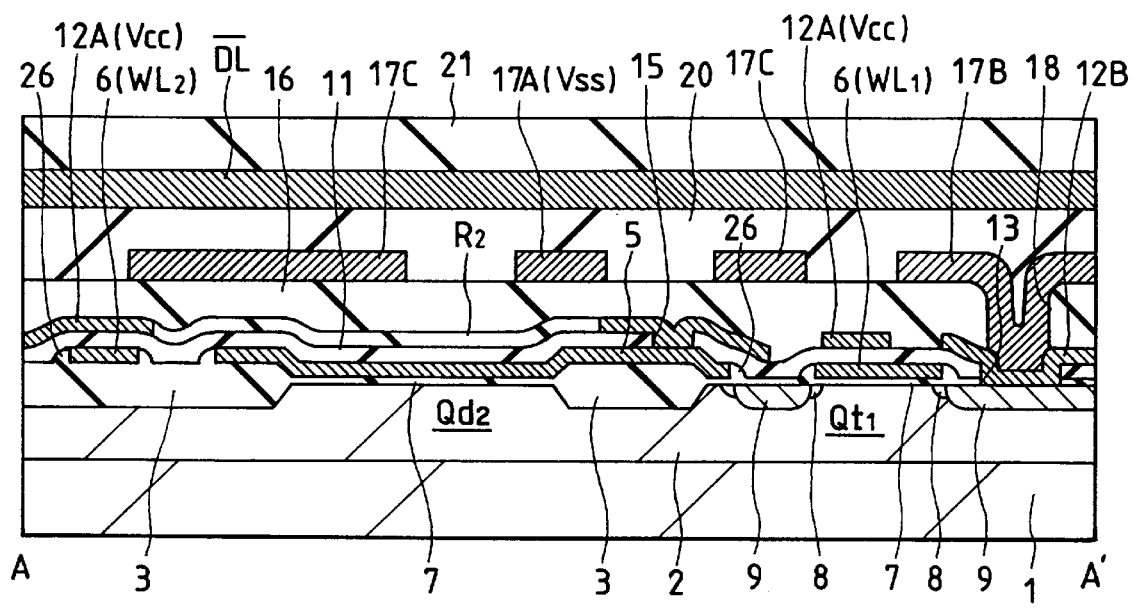
FIG. 2 is a cross-sectional view taken on line A–A' in FIG. 1.
Figure 3:
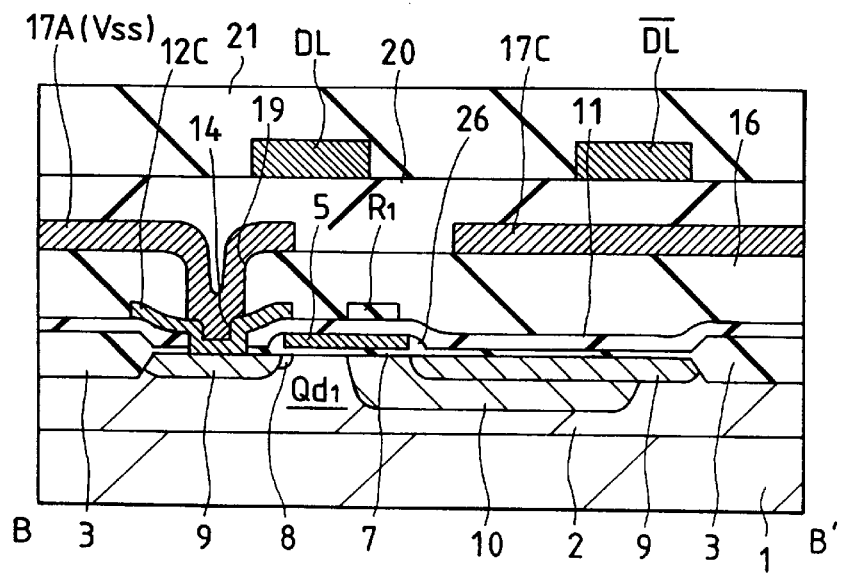
FIG. 3 is a cross-sectional view taken on line B–B' in FIG. 1.
Figure 4:
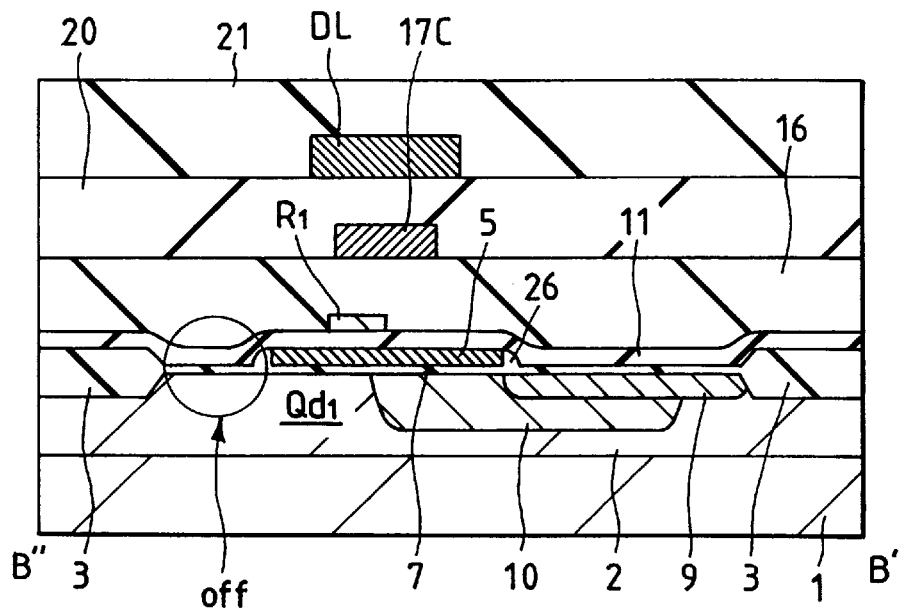
FIG. 4 is a cross-sectional view taken on line B'–B" in FIG. 1.
Figure 5:
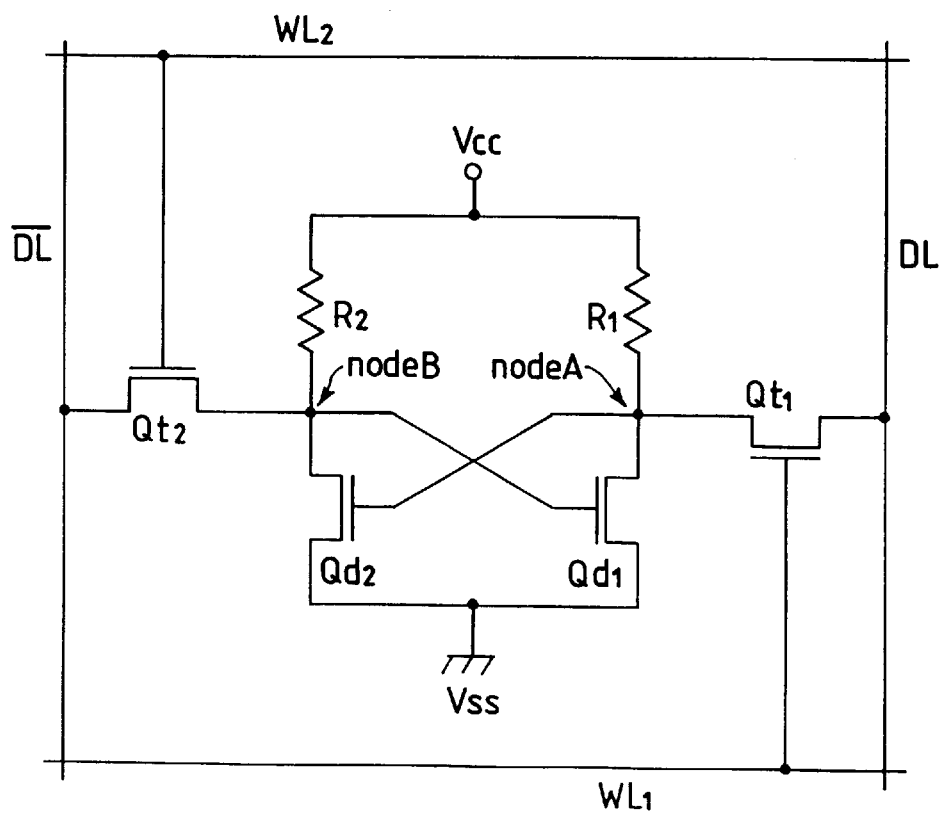
FIG. 5 is an equivalent circuit diagram of a memory cell in the SRAM.

FIG. 1 is a plan view of a memory cell in an SRAM embodying the invention, FIG. 2 is a cross-sectional view taken on line A–A' in FIG. 1, FIG. 3 is a cross-sectional view taken on line B–B' in FIG. 1, FIG. 4 is a cross-sectional view taken on line B'–B" in FIG. 1, and FIG. 5 is an equivalent circuit diagram of a memory cell in the SRAM. FIG. 1 illustrates only the conductive layers of the memory cell, and omits showing insulating films between the conductive layers as well as some other parts.

As shown in FIG. 5, a memory cell in the SRAM embodying the invention comprises a pair of driver MISFETs $Qd_1$ and $Qd_2$, a pair of resistor elements $R_1$ and $R_2$ acting as load elements, a pair of transfer MISFETs $Qt_1$ and $Qt_2$, a pair of complementary data lines (DL, bar DL), and a pair of word lines $WL_1$ and $WL_2$. This memory cell has its load elements composed of, but not limited to, high resistance load type elements.

The two driver MISFETs $Qd_1$ and $Qd_2$ and the pair of resistor elements $R_1$ and $R_2$ constitute a flip-flop circuit that acts as a data storage part for storing one-bit data. The source region of the transfer MISFET $Qt_1$ is connected to one of two input terminals of the flip-flop circuit (i.e., to storage node A); the source region of the transfer MISFET $Qt_2$ is connected to the other input terminal of the flip-flop circuit (i.e., to storage node B). The driver MISFETs $Qd_1$ and $Qd_2$ and the transfer MISFETs $Qt_1$ and $Qt_2$ are each an n-channel MISFET.

As illustrated in FIGS. 1 through 4, the driver MISFETs $Qd_1$ and $Qd_2$ and the transfer MISFETs $Qt_1$ and $Qt_2$ are formed in active regions 4 surrounded by a field insulating film 3 formed on the main surface of a p-type well 2 in the semiconductor substrate 1 illustratively composed of $p^-$ type silicon single crystal. Gate electrodes 5 of the driver MISFETs $Qd_1$ and $Qd_2$ and gate electrodes 6 (word lines $WL_1$ and $WL_2$) of the transfer MISFETs $Qt_1$ and $Qt_2$ are each made of a first layer polycrystal silicon film formed above the main surface of the p-type well 2. A dose of n-type impurities (e.g., phosphorus (P)) are implanted into the polycrystal silicon film.

The gate electrodes 5 of the driver MISFETs $Qd_1$ and $Qd_2$ and the gate electrodes 6 of the transfer MISFETs $Qt_1$ and $Qt_2$ are located mostly over the active regions with a gate insulating film 7 interposed therebetween. The gate insulating film 7 is made up of silicon oxide. The word line $WL_1$ formed integrally with the gate electrode 6 of the transfer MISFET $Qt_1$ and the word line $WL_2$ formed integrally with the gate electrode 6 of the transfer MISFET $Qt_2$ are located principally over the field insulating film 3. The word lines $WL_1$ and $WL_2$ extend perpendicularly to the direction in which the gate electrodes 5 of the driver MISFETs $Qd_1$ and $Qd_2$ extend. The gate electrodes 5 of the driver MISFETs $Qd_1$ and $Qd_2$ and the gate electrodes 6 (word lines $WL_1$ and $WL_2$) of the transfer MISFETs $Qt_1$ and $Qt_2$) may be constituted alternatively by a polycide film having a high-melting-point metal silicide film ($WSi_x$ (tungsten silicide), $MoSi_x$ (molybdenum silicide), $TiSi_x$ (titanium silicide), etc.) deposited over the polycrystal silicon film.

Figure 6:
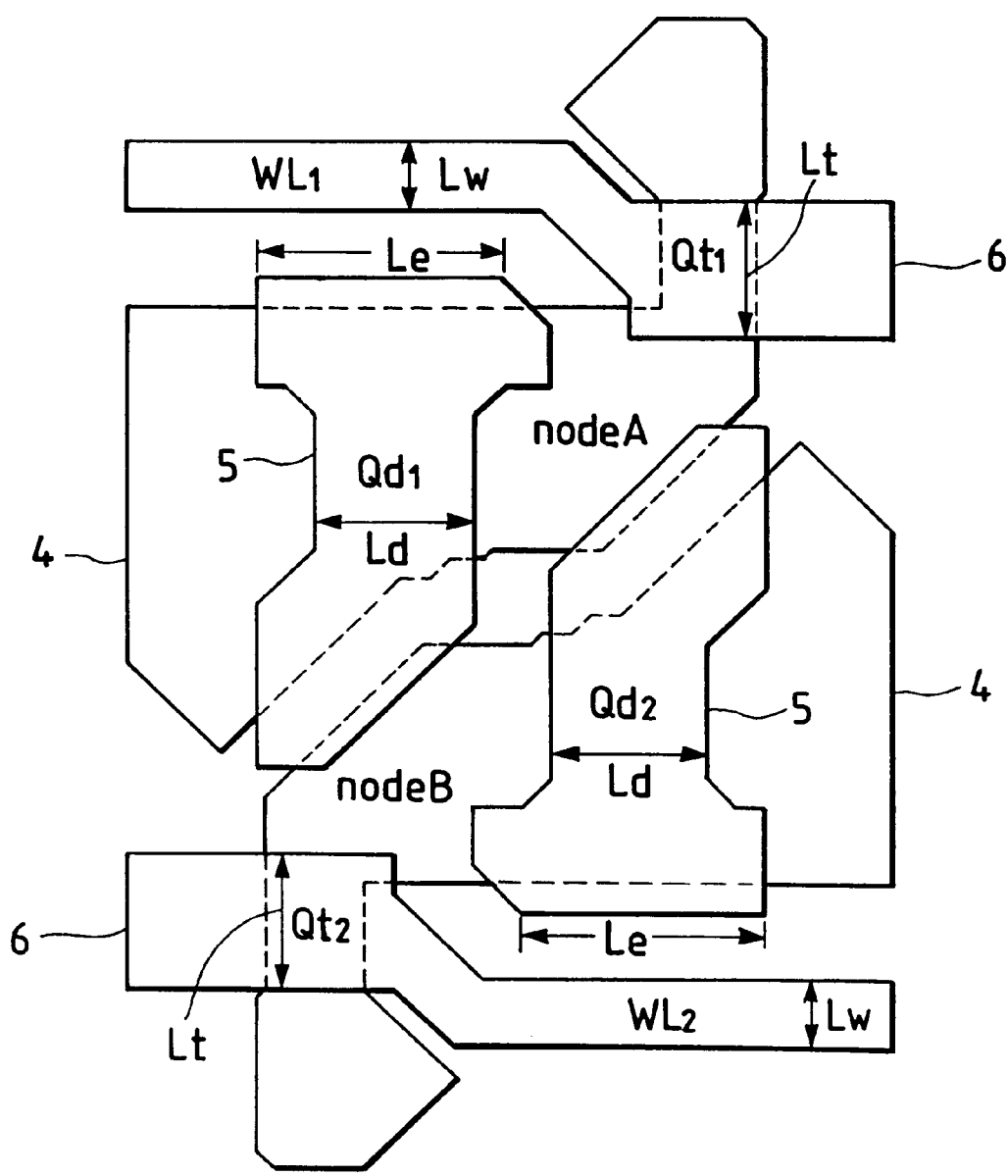
FIG. 6 is a plan view showing a layout pattern comprising active regions, gate electrodes of driver MISFETs, and gate electrodes (word lines) of transfer MISFETs constituting a memory cell.

FIG. 6 is a plan view showing a layout pattern comprising the active regions 4, the gate electrodes 5 of the driver MISFETs $Qd_1$ and $Qd_2$, and the gate electrodes 6 (word lines $WL_1$ and $WL_2$) of the transfer MISFETs $Qt_1$ and $Qt_2$ constituting a memory cell. The driver MISFETs $Qd_1$ and $Qd_2$, transfer MISFETs $Qt_1$ and $Qt_2$, storage nodes A and B, and word lines $WL_1$ and $WL_2$ correspond to their counterpart circuits in FIG. 5.

The SRAM embodying the invention is fabricated under design rules on fabrication conforming to a scaled-down design of 0.4 μm but not limited thereto. In that case, the line width Lw of the word lines $WL_1$ and $WL_2$ on the field insulating film 3 is 0.4 μm, the gate length Lt of the gate electrodes 6 for the transfer MISFETs $Qt_1$ and $Qt_2$ is 0.85 μm, and the gate length Ld of the gate electrodes 5 in a channel forming region for the driver MISFETs $Qd_1$ and $Qd_2$ is 1.0 μm. The gate length of MISFETs constituting peripheral circuits, not shown, is 0.4 μm. That is, with the SRAM embodying the invention, the gate length Ld of the driver MISFETs $Qd_1$ and $Qd_2$ in the channel forming region, and the gate length Le of the driver MISFETs $Qd_1$ and $Qd_2$ near the edge of the active regions 4, are both at least double the minimum gate length of the MISFETs constituting memory cells or peripheral circuits.

Figure 68:
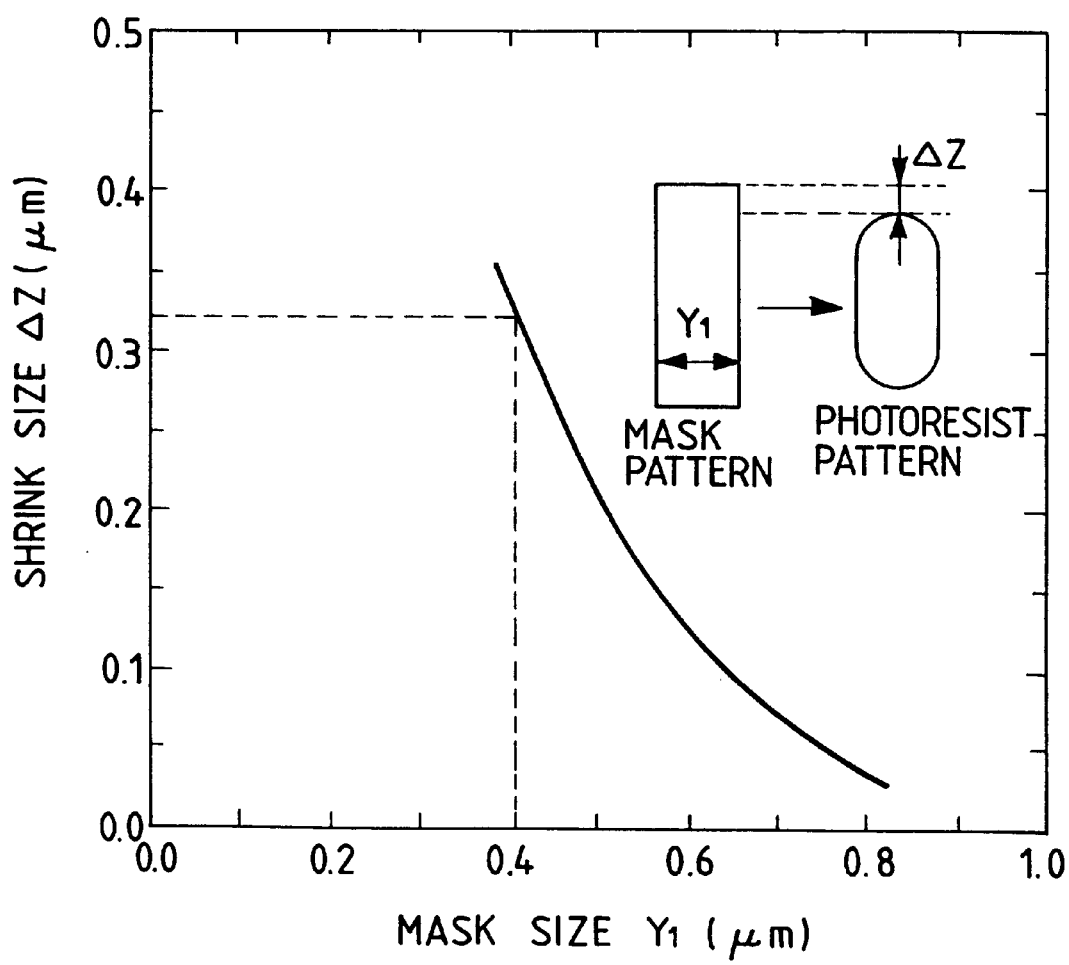
FIG. 68 is a graphic representation of data indicating how dependent the amount of gate electrode edge shrink is on the mask size in the traverse direction, the shrink being attributed to an optical wraparound effect upon photo resist exposure.

Generally for an SRAM, the line width of the word lines for the memory cells and the minimum gate length of the MISFETs constituting the peripheral circuits are designed in accordance with the minimum resolution increment of the demagnifying projection aligner in use. However, where the minimum resolution increment is adopted as the word line width and as the MISFET gate length, the amount of shrink on the word lines and gate electrodes is increased in the longitudinal direction upon optical exposure. For example, when a demagnifying projection aligner pursuant to the rule on fabrication conforming to a scaled-down design of 0.4 μm is used, the amount of shrink (Δz) on the word lines (gate electrodes) becomes 0.3 μm or more, as shown in FIG. 68.

Figure 47B:
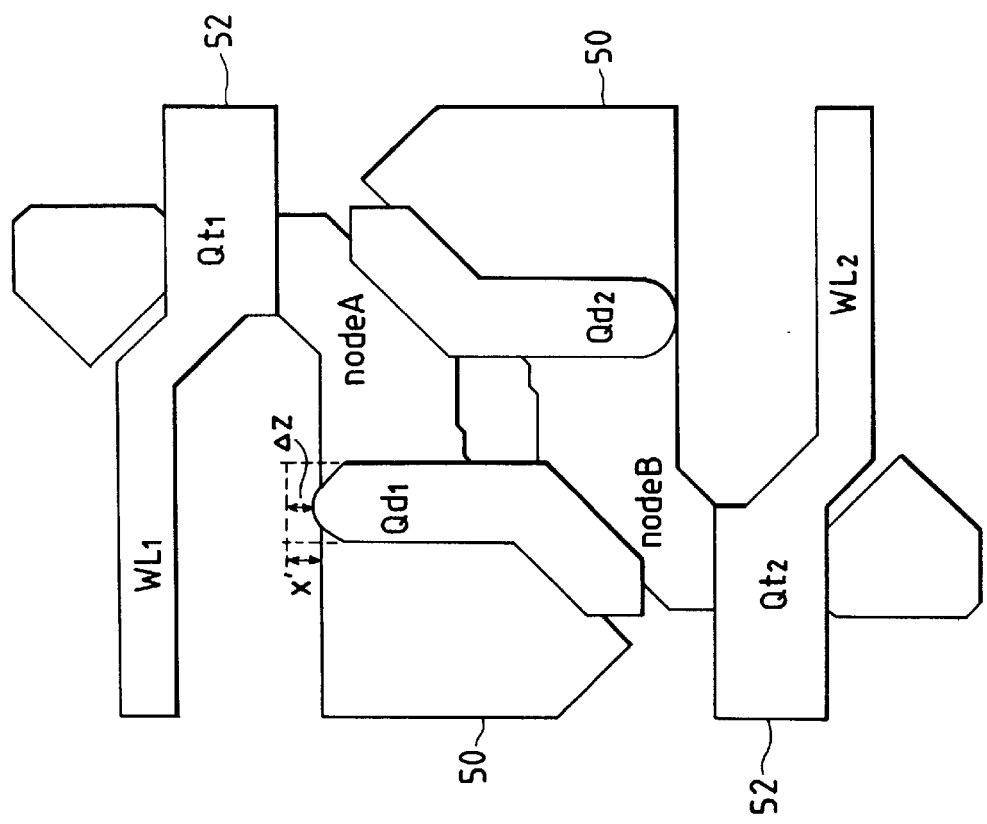
FIGS. 47A and 47B are plan views depicting schematically the gate capacitance of a memory cell.

By contrast, if the gate length (Le, Ld) of the gate electrodes 5 for the driver MISFETs $Qd_1$ and $Qd_2$ is made at least double the minimum resolution increment (0.4 μm) of the demagnifying projection aligner as in the case of the above embodiment the amount of shrink (Δz) on the edge of the gate electrodes 5 becomes practically negligible. This in turn makes it possible to reduce the mask alignment allowance (x) indicated in FIG. 47. The reduction in the mask alignment allowance (x) may be matched with an enlarged area of the active regions 4, thus permitting an effective increase in the gate width for the driver MISFETs $Qd_1$ and $Qd_2$. This allows the gate capacitance (Cox) to be raised without increasing the memory cell size.

As depicted in FIG. 6, in a memory cell of the SRAM embodying the invention, the gate length Le of the driver MISFETs $Qd_1$ and $Qd_2$ near the edge of the active regions 4 is made longer (e.g., to about 1.5 μm) than the gate length Ld (1.0 μm) in the channel forming region. This arrangement additionally enlarges the area of the gate electrodes 5 for the driver MISFETs $Qd_1$ and $Qd_2$, whereby the gate capacitance (Cox) is enhanced further.

As illustrated in FIG. 2, the source and drain regions of the transfer MISFET $Qt_1$ are made of an $n^-$ type semiconductor region 8 of low impurity density and an $n^+$ type semiconductor region 9 of high impurity density. Although not shown in FIG. 2, the source and drain regions of the transfer MISFET $Qt_2$ are also made of the $n^-$ type semiconductor region 8 of low impurity density and the $n^+$ type semiconductor region 9 of high impurity density. That is, the transfer MISFETs $Qt_1$ and $Qt_2$ have a lightly doped drain (LDD) structure.

Meanwhile, as shown in FIGS. 3 and 4, the driver MISFET $Qd_1$ has the same LDD structure as the transfer MISFETs $Qt_1$ and $Qt_2$. The drain region of the driver MISFET $Qd_1$ is composed of the $n^+$ type semiconductor region 9 of high impurity density and an n-type semiconductor region 10 overlapping considerably with the gate electrodes 5. Although not shown in FIG. 3 or 4, the drain region of the driver MISFET $Qd_2$ is composed of the $n^+$ type semiconductor region 9 of high impurity density and the n-type semiconductor region 10 overlapping considerably with the gate electrodes 5. The overlapping length of the drain regions for the driver MISFETs $Qd_1$ and $Qd_2$ is made at least double the overlapping length between the gate electrode and the drain region (or source region) of the MISFET having the minimum gate length in any peripheral circuit of the cell, not shown.

As described, in a memory cell of the SRAM embodying the invention, the n-type semiconductor region 10 (drain region) of the driver MISFETs $Qd_1$ and $Qd_2$ is made to overlap considerably with the gate electrodes 5. This arrangement compensates for that drop in driver capability which is attributable to the prolonged gate length of the driver MISFETs $Qd_1$ and $Qd_2$. Thus it is possible to raise the gate capacity (Cox) without lowering the driving capability of the driver MISFETs $Qd_1$ and $Qd_2$.

As illustrated in FIG. 3, the source region of the driver MISFET $Qd_1$ is made of the $n^-$ type semiconductor region 8 of low impurity density and the $n^+$ type semiconductor region 9 of high impurity density. But as shown in FIG. 4, this source region is not located near the edge of the active regions (encircled "OFF" location in FIG. 4). Although not shown in FIG. 4, the source region of the driver MISFET $Qd_2$ is similarly not located near the edge of the active regions. This means that the source regions of the driver MISFETs $Qd_1$ and $Qd_2$ are offset near the edge of the active regions with respect to the gate electrodes 5 (i.e., offset structure).

As described, in a memory cell of the SRAM embodying the invention, at least one of the source and drain regions of the driver MISFETs $Qd_1$ and $Qd_2$ is offset against the gate electrodes 5 near the edge of the active regions 4. With this structure in place, the drain and source regions of the driver MISFETs $Qd_1$ and $Qd_2$ do not come close to each other at the edge of the active regions 4 even when the mask alignment allowance (x) is reduced so as to let the edge of the gate electrodes 5 on the field insulating film 3 approach the active regions 4. Thus no leaks occur between the storage nodes (i.e., drain region) and the reference voltage (i.e., source region). In other words, the above structure allows the area of the active regions 4 to be enlarged without increasing the memory cell size and without destabilizing the data being held in the cell. This, in turn makes it possible to enlarge the area of the gate electrodes 5 for the driver MISFETs $Qd_1$ and $Qd_2$, thereby raising the gate capacitance (Cox). Alternatively, the above structure may be replaced by one of two other offset structures. One offset structure involves offsetting the drain region side of the driver MISFETs $Qd_1$ and $Qd_2$ near the edge of the active regions. The other alternative offset structure involves offsetting both the source and the drain region near the edge of the active regions. In any case, the effects obtained are the same.

Figure 7:
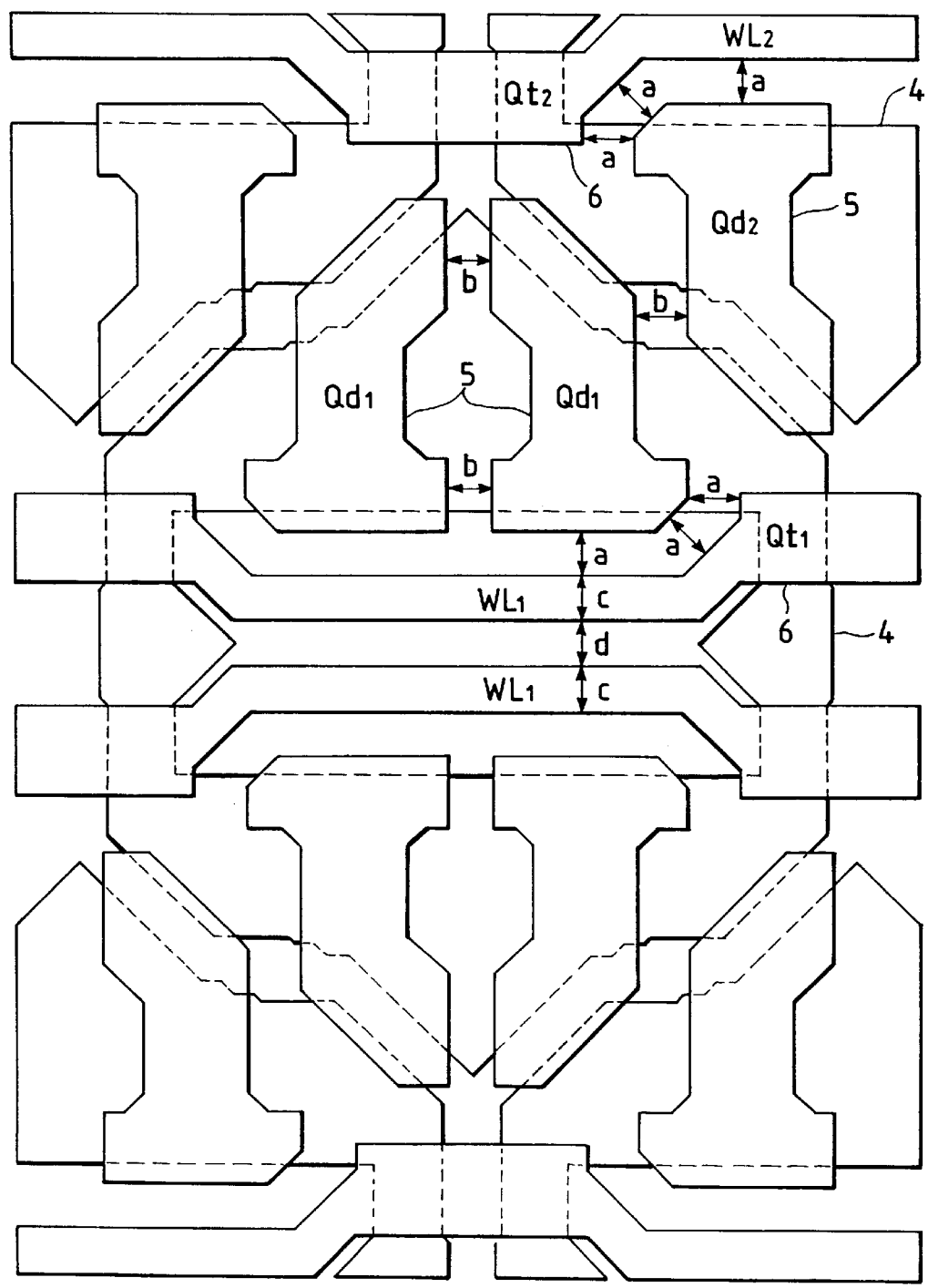
FIG. 7 is a plan view depicting a layout pattern including active regions, gate electrodes of driver MISFETs, and gate electrodes (word lines) of transfer MISFETs constituting four memory cells.

FIG. 7 is a plan view depicting a layout pattern including the active regions 4, the gate electrodes 5 of the driver MISFETs $Qd_1$ and $Qd_2$, and the gate electrodes 6 (word lines $WL_1$ and $WL_2$) of the transfer MISFETs $Qt_1$ and $Qt_2$ constituting four memory cells.

As shown in FIG. 7, at one edge of the gate electrode 5 for the driver MISFET $Qd_1$ in a memory cell of the SRAM embodying the invention, a spacing distance (or gap) (a) between the gate electrode 5 of the driver MISFET $Qd_1$ and the gate electrode 6 (word line $WL_1$) of the transfer MISFET $Qt_1$ is made the same (0.4 μm) in at least two directions; a spacing distance (or gap) (b) between the gate electrode 5 of the driver MISFET $Qd_1$ in this cell and that of a driver MISFET $Qd_1$ in an adjacent memory cell in a row (or word line) direction is made the same as the spacing distance (a) above (0.4 μm). Likewise, at one edge of the gate electrode 5 for the driver MISFET $Qd_2$, the spacing distance between the gate electrode 5 of the driver MISFET $Qd_2$ and the gate electrode 6 (word line $WL_2$) of the transfer MISFET $Qt_2$ is also made the same (0.4 μm) in at least two directions; the spacing distance between the gate electrode 5 of the driver MISFET $Qd_2$ in this cell and that of the driver MISFET $Qd_2$ in the adjacent memory cell in the word line direction is made the same as the above space (0.4 μm).

A structure as that just described results in the following benefit: the structure prevents excess exposure light from sneaking to the edge of the gate electrodes 5 when a photo resist pattern is formed. The pattern is used by the demagnifying projection aligner exposing the photo resist film to fabricate the gate electrodes 5 of the driver MISFETs $Qd_1$ and $Qd_2$ and the gate electrodes 6 (word lines $WL_1$ and $WL_2$) of the transfer MISFETs $Qt_1$ and $Qt_2$. This prevents the contraction of the photo resist pattern at the edge portion of the gate electrodes 5. With the contraction of the photo resist pattern forestalled, the mask alignment allowance (x) for the edge portion of the gate electrodes 5 is reduced. The reduction in the mask alignment allowance (x) is matched with an enlarged area of the active regions 4, whereby the gate width for the driver MISFETs $Qd_1$ and $Qd_2$ is effectively increased. This in turn allows the gate capacitance (Cox) to be raised without increasing the memory cell size.

As depicted in FIG. 7, each memory cell in the SRAM embodying of the invention has three kinds of space distances kept identical (0.4 μm): a spacing distance (a) between the gate electrode 5 of the driver MISFET $Qd_1$ and the gate electrode 6 (word line $WL_1$) of the transfer MISFET $Qt_1$; a line width (c) of the word line $WL_1$; and a spacimg distance (d) between the word line $WL_1$ and the word line $WL_1$ in the adjacent memory cell in a perpendicular, column direction. Likewise, another three kinds of spacing distances are also held identical (0.4 μm) in each memory cell: the spacing distance between the gate electrode 5 of the driver MISFET $Qd^2$ and the gate electrode 6 (word line $WL_2$) of the transfer MISFET $Qt_2$; the line width of the word line $WL_2$; and the spacing distance between the word line $WL_2$ and the word line $WL_2$ in the adjacent memory cell in the column direction.

The above structure affords pattern periodicity to three kinds of space: the space (a) between the gate electrodes 5 on the one hand and the gate electrodes 6 on the other (word line $WL_1$, $WL_2$); the line width (c) of the word lines $WL_1$ and $WL_2$; and the space (d) between the word lines $WL_1$ and $WL_2$, on the one hand, and the word lines $WL_1$ and $WL_2$ on the other in the adjacent memory cell, near the edge of the gate electrodes 5 for the driver MISFETs $Qd_1$ and $Qd_2$. Thus when the photo resist pattern is formed for use by the demagnifying projection aligner exposing the photo resist film to fabricate the gate electrodes 5 of the driver MISFETs $Qd_1$ and $Qd_2$ and the gate electrodes 6 (word lines $WL_1$ and $WL_2$) of the transfer MISFETs $Qd_1$ and $Qd_2$, it is possible to prevent the contraction of the photo resist pattern at the edge of the gate electrodes 5. With the contraction of the photo resist pattern thus prevented, the mask alignment allowance (x) for the edge portion of the gate electrodes 5 is reduced. The reduction in the mask alignment allowance (x) is matched with an enlarged area of the active regions 4, whereby the gate width for the driver MISFETs $Qd_1$ and $Qd_2$ is effectively increased. This in turn allows the gate capacitance (Cox) to be raised without increasing the memory cell size.

As shown in FIGS. 1 through 4, wiring 12A of low resistance, pad layers 12B and 12C, and resistor elements $R_1$ and $R_2$ are deposited over the gate electrodes 5 of the driver MISFETs $Qd_1$ and $Qd_2$ and over the gate electrodes 6 (word lines $WL_1$ and $WL_2$) of the transfer MISFETs $Qd_1$ and $Qd_2$, the electrodes being covered with a silicon oxide film 11. The wiring 12A, pad layers 12B and 12C, and resistor elements $R_1$ and $R_2$ are constituted by the second layer polycrystal silicon film. A dose of n-type impurities (e.g., phosphorus (P)) is implanted into the polycrystal silicon film making up the wiring 12A and the pad layers 12B and 12C.

One end of each of the resistor elements $R_1$ and $R_2$ is supplied with a circuit power source voltage (Vcc) via the wiring 12A. The other end of each of the resistor elements $R_1$ and $R_2$ is connected via connecting holes 15 both to the drain region ($n^+$ type semiconductor region 9) on one side of the driver MISFETs $Qd_1$ and $Qd_2$, and to the gate electrodes 5 on the other side thereof. In this manner, the high resistance load type memory cell is made smaller than ever by locating the resistor elements $R_1$ and $R_2$ in the layer above the driver MISFETs $Qd_1$ and $Qd_2$.

Wiring 17A, a pad layer 17B and word shunts 17C are deposited over a silicon oxide layer insulating film 16 that covers the wiring 12A, pad layers 12B and 12C, and resistor elements $R_1$ and $R_2$. The wiring 17A, pad layer 17B and word shunts 17C are composed of the first layer aluminum film. The wiring 17A is connected to the source regions ($n^+$ type semiconductor region 9) of the driver MISFETs $Qd_1$ and $Qd_2$ via the pad layer 12C and connecting holes 14 and 19. The source regions are connected to the circuit reference voltage Vss via the wiring 17A. The word shunts 17C are connected to the word lines $WL_1$ and $WL_2$ via connecting holes formed in regions not shown over the layer insulating film 16.

Data lines (DL, bar DL) are formed over a second layer insulating film 20 that covers the wiring 17A, pad layer 17B and word shunts 17C. The data lines (DL, bar DL) are made up of the second layer aluminum film. One data line (DL) is connected to the drain region ($n^+$ type semiconductor region 9) of the transfer MISFET $Qt_1$ via connecting holes 22 in the layer insulating film 20, the pad layer 17B, connecting holes 18 in the layer insulating film 16, the pad layer 12B, and connecting holes 13. The other data line (bar DL) is connected to the drain region ($n^+$ type semiconductor region 9) of the transfer MISFET $Qt_2$ via the connecting holes 22, pad layer 17B, connecting holes 18, pad layer 12B, and connecting holes 13.

A final passivation film 21 is formed over the data lines (DL, bar DL), i.e., on top of the semiconductor substrate 1, the film 21 being made of a silicon oxide film or of a layered film comprising a silicon oxide film and a silicon nitride film.

Below is a description of the method for fabricating a memory cell of the SRAM embodying the invention. Of the figures illustrating the memory cell fabrication method (FIGS. 8 through 40), the plan views show only the conductive layers of the memory cell and not the layer insulating films therebetween.

Figure 8:
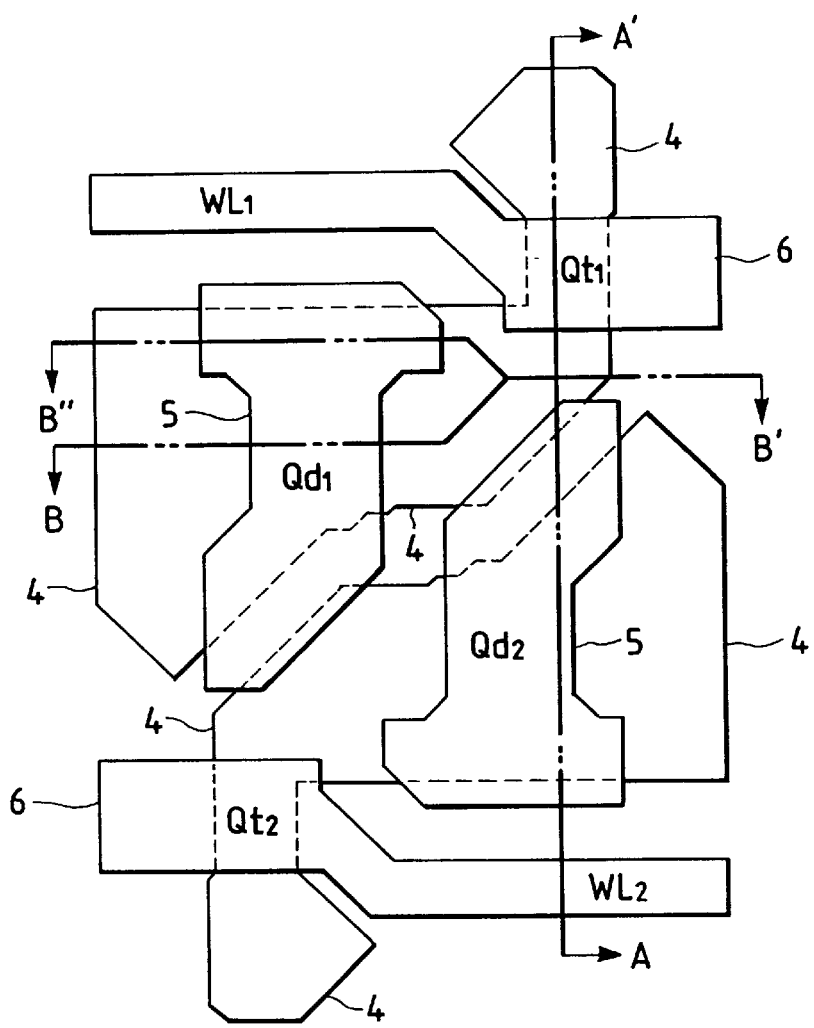
FIG. 8 is a schematic plan view of a semiconductor substrate, showing one phase of the process for fabricating a memory cell of the SRAM embodying the invention.
Figure 9:
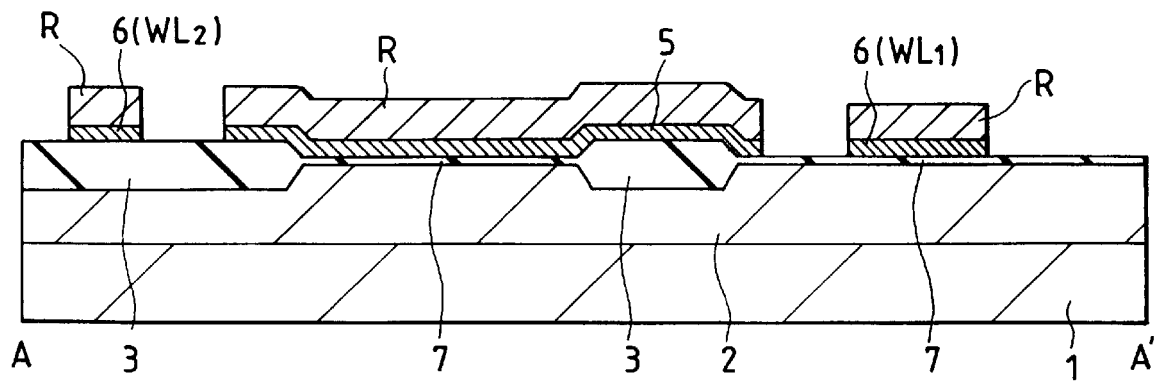
FIG. 9 is a cross-sectional view taken on line A–A' in FIG. 8.
Figure 10:
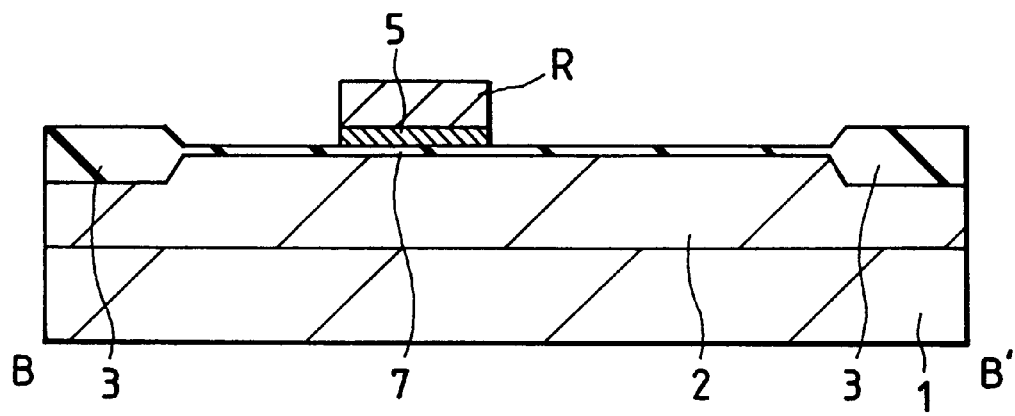
FIG. 10 is a cross-sectional view taken on line B–B' in FIG. 8.
Figure 11:
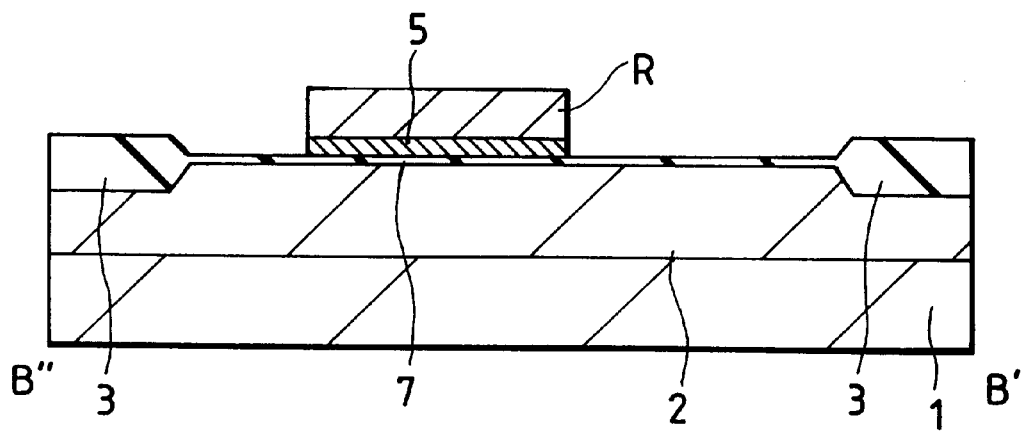
FIG. 11 is a cross-sectional view taken on line B"–B' in FIG. 8.

As depicted in FIG. 8, FIG. 9 (cross-sectional view taken on line A–A' in FIG. 8), FIG. 10 (cross-sectional view taken on line B–B' in FIG. 8) and FIG. 11 (cross-sectional view taken on line B"–B' in FIG. 8), a p-type well 2 and a field insulating film 3 are first formed on the main surface of a p-type semiconductor substrate 1. A gate insulating film 7 is then formed over the surface of active regions 4 surrounded by the field insulating film 3. After this, the first layer polycrystal silicon film deposited by CVD (chemical vapor deposition) method on the semiconductor substrate 1 is patterned into gate electrodes 5 of the driver MISFETs $Qd_1$ and $Qd_2$ and gate electrodes 6 (word lines $WL_1$ and $WL_2$) of the transfer MISFETs $Qt_1$ and $Qt_2$ over the gate insulating film 7. The patterning proceeds specifically as follows: a photo resist film is formed over the first layer polycrystal silicon film. The photo resist film is then exposed and developed to produce a photo resist pattern R. With the photo resist pattern R used as the mask, the polycrystal silicon film is removed selectively by dry etching using illustratively $CF_4$ gas or the like. The etching forms the gate electrodes 5 and 6.

Figure 12:
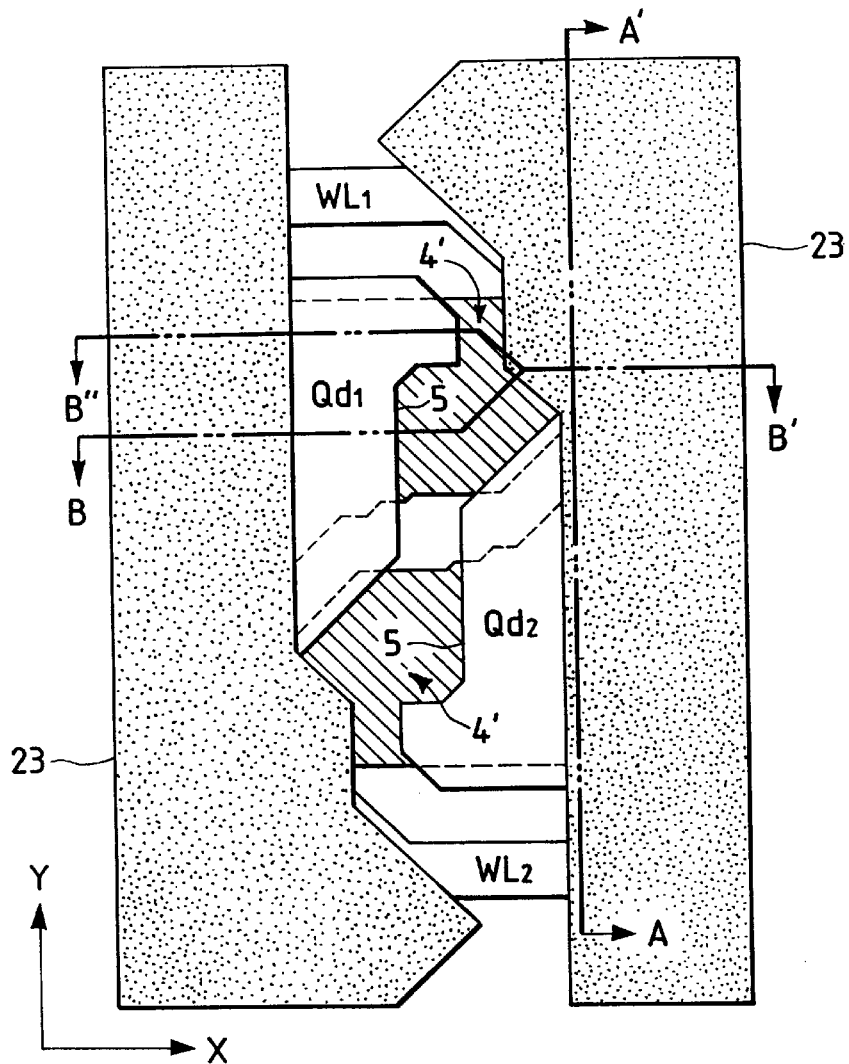
FIG. 12 is another schematic plan view of the semiconductor substrate, showing another phase of the process for fabricating a memory cell of the SRAM embodying the invention.
Figure 13:
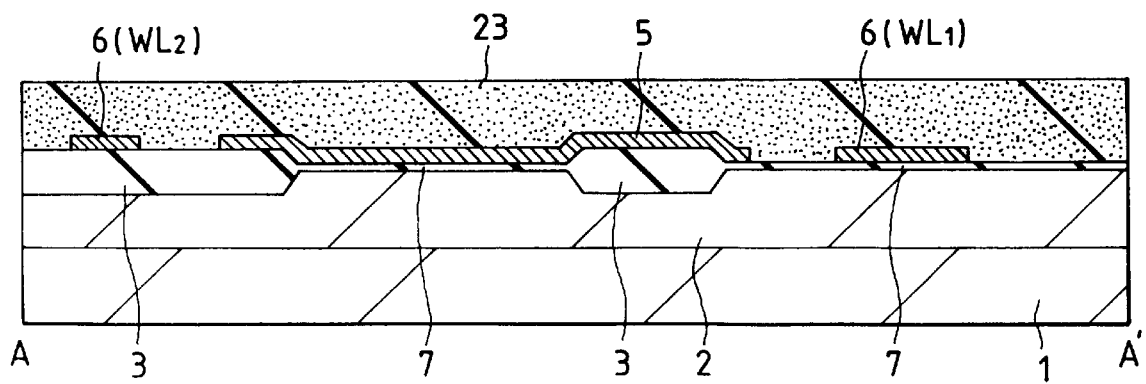
FIG. 13 is a cross-sectional view taken on line A–A' in FIG. 12.
Figure 14:
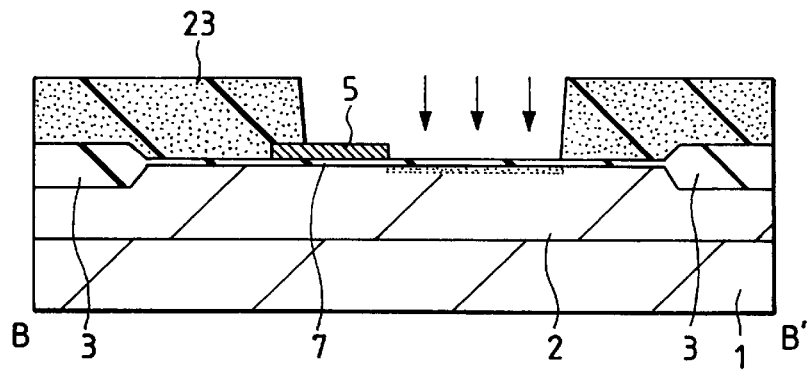
FIG. 14 is a cross-sectional view taken on line B–B' in FIG. 12.
Figure 15:
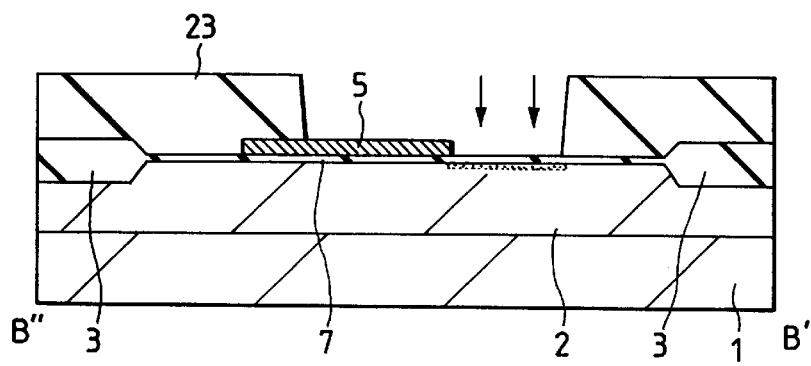
FIG. 15 is a cross-sectional view taken on line B"–B' in FIG. 12.
Figure 16:
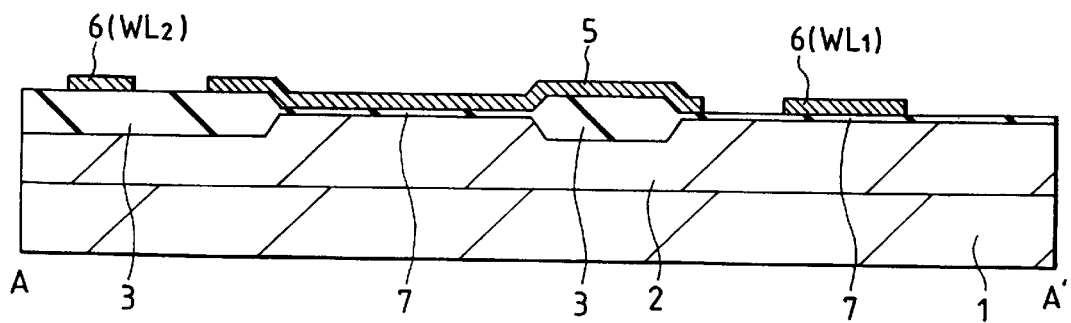
FIG. 16 is a schematic cross-sectional view of the semiconductor substrate, depicting another phase of the process for fabricating a memory cell of the SRAM embodying the invention.
Figure 17:
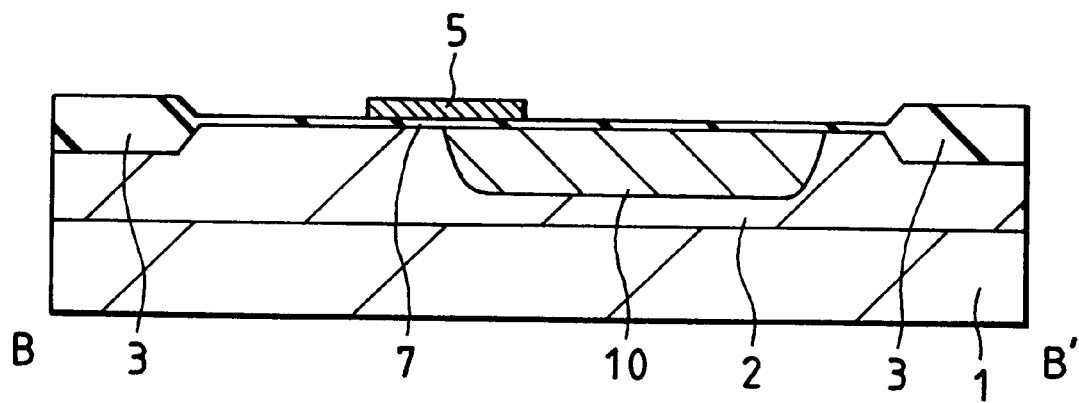
FIG. 17 is another schematic cross-sectional view of the semiconductor substrate, depicting another phase of the process for fabricating a memory cell of the SRAM embodying the invention.
Figure 18:
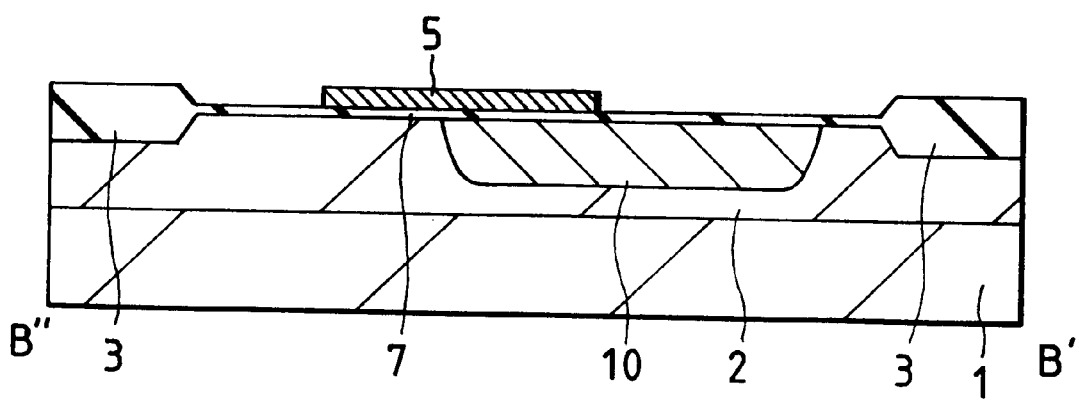
FIG. 18 is another schematic cross-sectional view of the semiconductor substrate, depicting another phase of the process for fabricating a memory cell of the SRAM embodying the invention.

Then as illustrated in FIG. 12, FIG. 13 (cross-sectional view taken on line A–A' in FIG. 12), FIG. 14 (cross-sectional view taken on line B–B' in FIG. 12) and FIG. 15 (cross-sectional view taken on line B"–B' in FIG. 12), n-type impurity ions (e.g., phosphorus (P)) are implanted into the p-type well in regions 4' that constitute the drain regions of the driver MISFETs $Qd_1$ and $Qd_2$ within the active regions 4. During the ion implantation, the field insulating film 3, photo resist film 23, gate electrodes 5 and gate electrodes 6 (word lines $WL_1$ and $WL_2$) are used as the mask. Thereafter, the semiconductor substrate 1 is annealed so as to expand and diffuse the implanted impurities sufficiently. This produces an n-type semiconductor region 10 overlapping considerably with the gate electrodes 5, as shown in FIGS. 16, 17 and 18.

The n-type semiconductor region 10 constitutes the drain edge portion of the drain regions for the driver MISFETs. In this manner, the photo resist film 23 is formed so as to cover the regions constituting the source regions of the driver MISFETs $Qd_1$ and $Qd_2$ and the source and drain regions of the transfer MISFETs $Qt_1$ and $Qt_2$. The implantation of impurities to form the n-type semiconductor region 10 is carried out in such a manner that the drain edge portion of the driver MISFETs is defined by the gate electrodes 5 and by the field insulating film 3 in the gate width direction (i.e., Y direction) of the driver MISFETS, but not by the photo resist film 23. As shown in FIG. 12, the X direction is the direction in which the word lines $WL_1$ and $WL_2$ extend. Furthermore, the X direction is in parallel with the gate length direction of the driver MISFETs. The Y direction is perpendicular to the X direction, and is parallel to the gate width direction of the driver MISFETS.

Figure 19B:
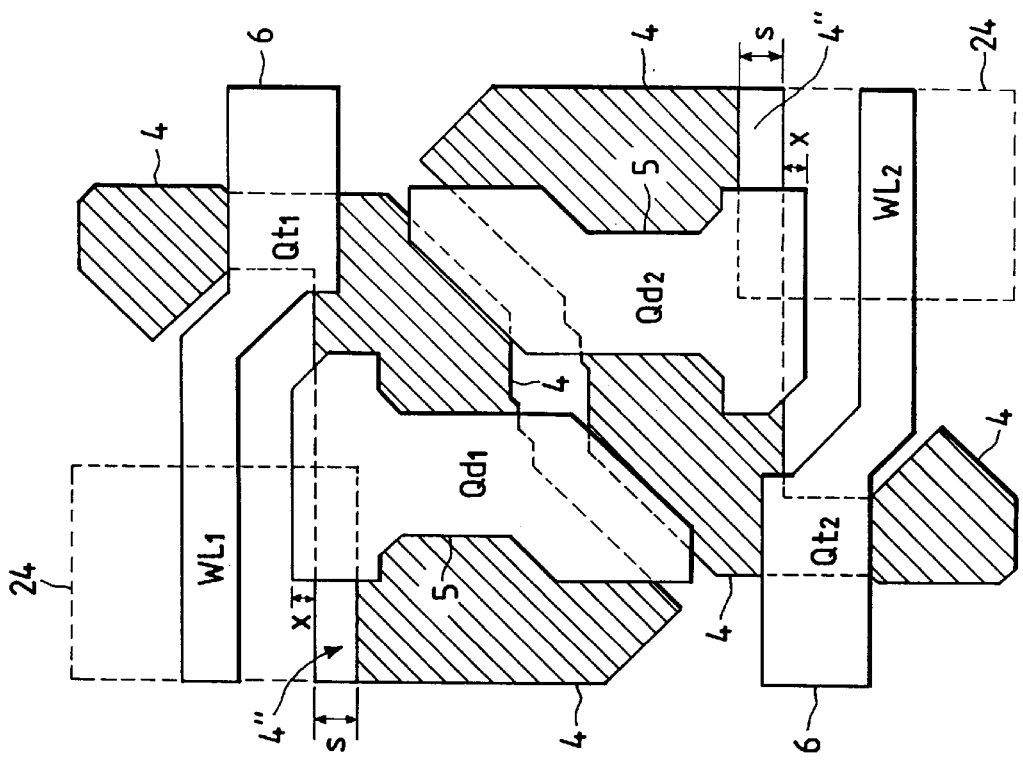
FIGS. 19A and 19B are schematic plan views of the semiconductor substrate, illustrating other phases of the process for fabricating a memory cell of the SRAM embodying the in invention.
Figure 19A:
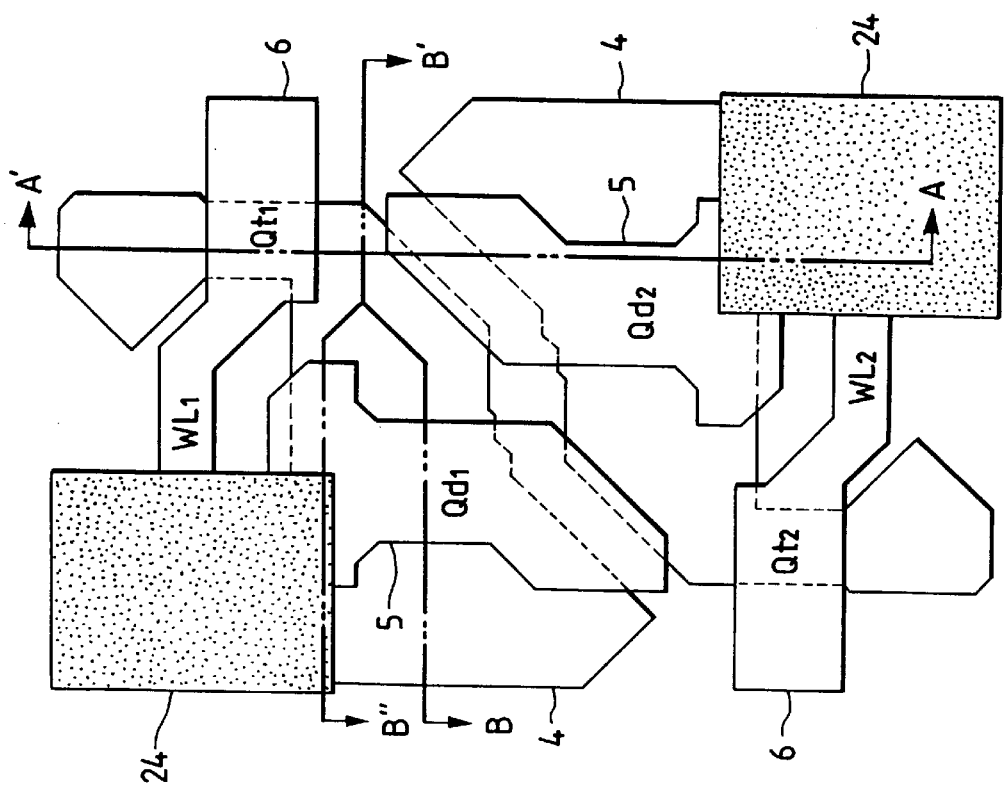
Figure 20:
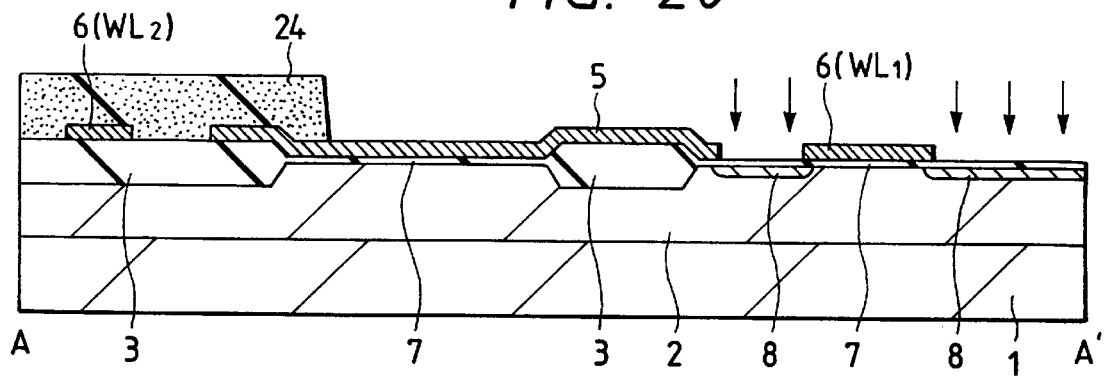
FIG. 20 is a cross-sectional view taken on line A–A' in FIG. 19A.
Figure 21:
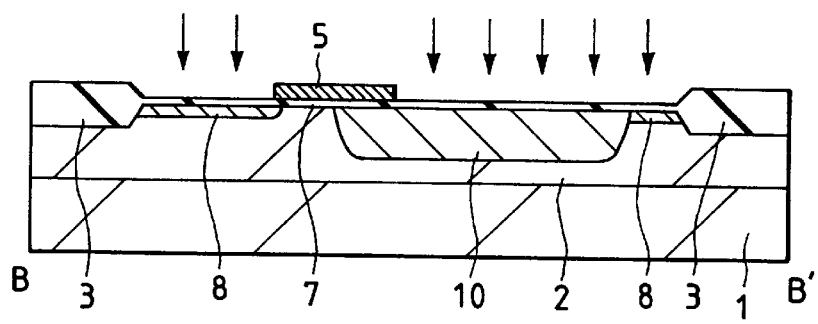
FIG. 21 is a cross-sectional view taken on line B–B' in FIG. 19A.
Figure 22:
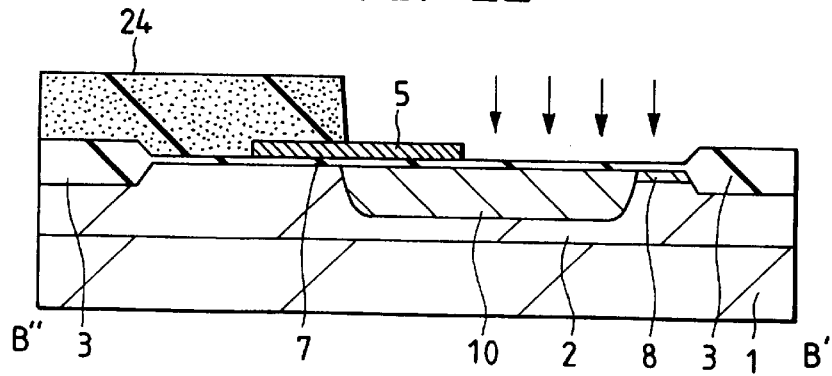
FIG. 22 is a cross-sectional view taken on line B"–B' in FIG. 19A.

Then with the photo resist film 23 removed, the p-type well 2 near the edge of the active regions constituting the source and drain regions of the driver MISFETs $Qd_1$ and $Qd_2$ is covered with a photo resist film 24, as illustrated in FIG. 19A, FIG. 20 (cross-sectional view taken on line A–A' in FIG. 19A), FIG. 21 (cross-sectional view taken on line B–B' in FIG. 19A) and FIG. 22 (cross-sectional view taken on line B"–B' in FIG. 19A). With the photo resist film 24, field insulating film 3, gate electrodes 5 and gate electrodes 6 (word lines $WL_1$ and $WL_2$) used as the mask, n-type impurity ions (e.g., phosphorus) are implanted into the p-type well 2. This produces an $n^-$ type semiconductor region 8 of low impurity density constituting the source regions of the driver MISFETs $Qd_1$ and $Qd_2$ as well as the source and drain regions of the transfer MISFETs $Qt_1$ and $Qt_2$. At this point, the $n^-$ type semiconductor region 8 is not formed near the edge of the active regions covered with the photo resist film 24, as depicted in FIG. 22. That is, as shown in FIG. 19B, with the photo resist film 24 in place, the implantation of impurities to form the $n^-$ type semiconductor region is directed only to the shaded portions in the active regions 4, and not to the regions 4". In this manner, the source regions of the driver MISFETs $Qd_1$ and $Qd_2$ are offset against the gate electrodes 5 near the edge of the active regions.

The offset structure gets the photo resist film 24 to cover the active regions 4" and the gate electrodes 5 at the edge of the active regions 4 even when edges of the gate electrodes 5 shrink on the active regions 4 as a result of mask misalignment or edge contraction of the gate electrodes 5. That is, no impurities are implanted to the regions 4" while the n-type semiconductor region is being formed. This prevents the drain and source regions of the driver MISFETs $Qd_1$ and $Qd_2$ from coming close to one another at the edge of the active regions 4. With the drain and source regions set apart, no leak current or conductance occurs therebetween. This makes it possible to reduce the mask alignment allowance and to lessen the memory cell size accordingly.

Figure 23:
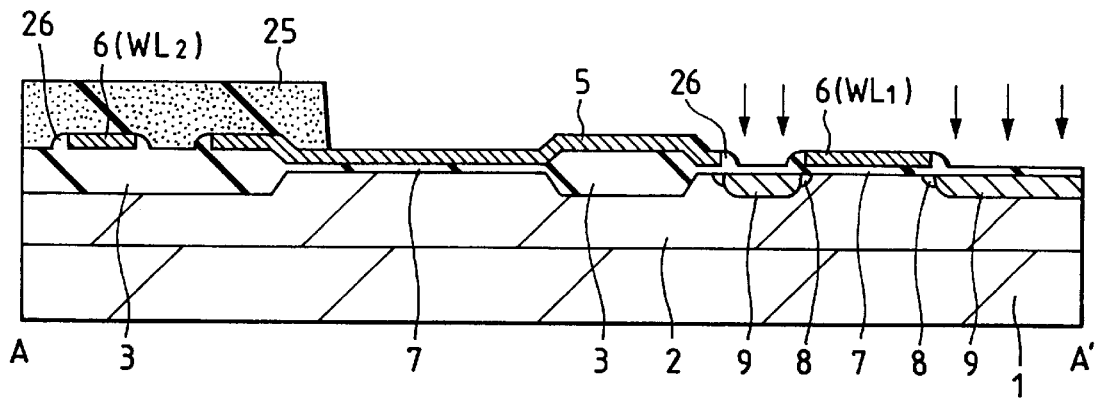
FIG. 23 is another schematic cross-sectional view of the semiconductor substrate, showing another phase of the process for fabricating a memory cell of the SRAM embodying the invention.
Figure 24:
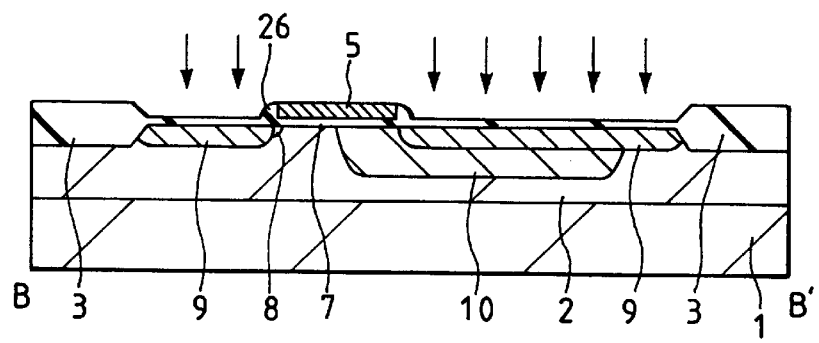
FIG. 24 is another schematic cross-sectional view of the semiconductor substrate, showing another phase of the process for fabricating a memory cell of the SRAM embodying the invention.
Figure 25:
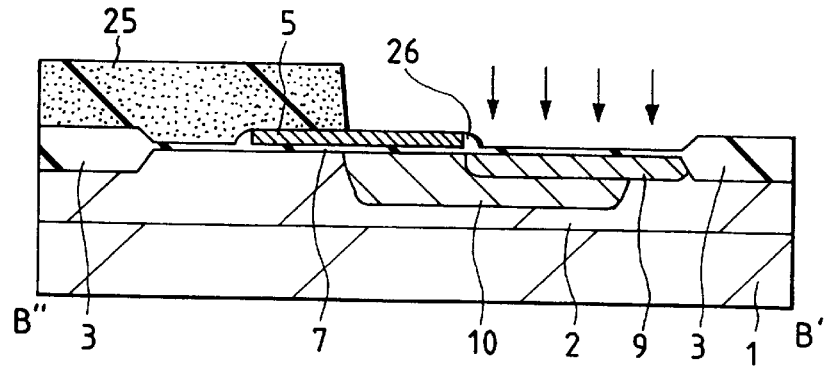
FIG. 25 is another schematic cross-sectional view of the semiconductor substrate, showing another phase of the process for fabricating a memory cell of the SRAM embodying the invention.

After the photo resist film 24 is removed, the silicon oxide film deposited by CVD method on the semiconductor substrate 1 is etched anisotropically into side wall spacers 26 of the side walls for both the gate electrodes 5 of the driver MISFETs $Qd_1$ and $Qd_2$ and the gate electrodes 6 (word lines $WL_1$ and $WL_2$) of the transfer MISFETs $Qt_1$ and $Qt_2$. With the side wall spacers 26 thus formed, the p-type well 2 near the edge of the active regions constituting the source regions of the driver MISFETs $Qd_1$ and $Qd_2$ is covered with a photo resist film 25, as shown in FIGS. 23, 24 and 25. With the photo resist film 25, side wall spacers 26, gate electrodes 5, and gate electrodes 6 (word lines $WL_1$ and $WL_2$) used as the mask, n-type impurity ions (e.g., arsenic (As)) are implanted into the p-type well 2. This produces the $n^+$ type semiconductor region 9 of high impurity density constituting the source and drain regions of the driver MISFETs $Qd_1$ and $Qd_2$ and of the transfer MISFETs $Qt_1$ and $Qt_2$. At this point, as shown in FIG. 25, the $n^+$ type semiconductor region 9 is not formed near the edge of the active regions covered with the photo resist film 25.

Figure 26:
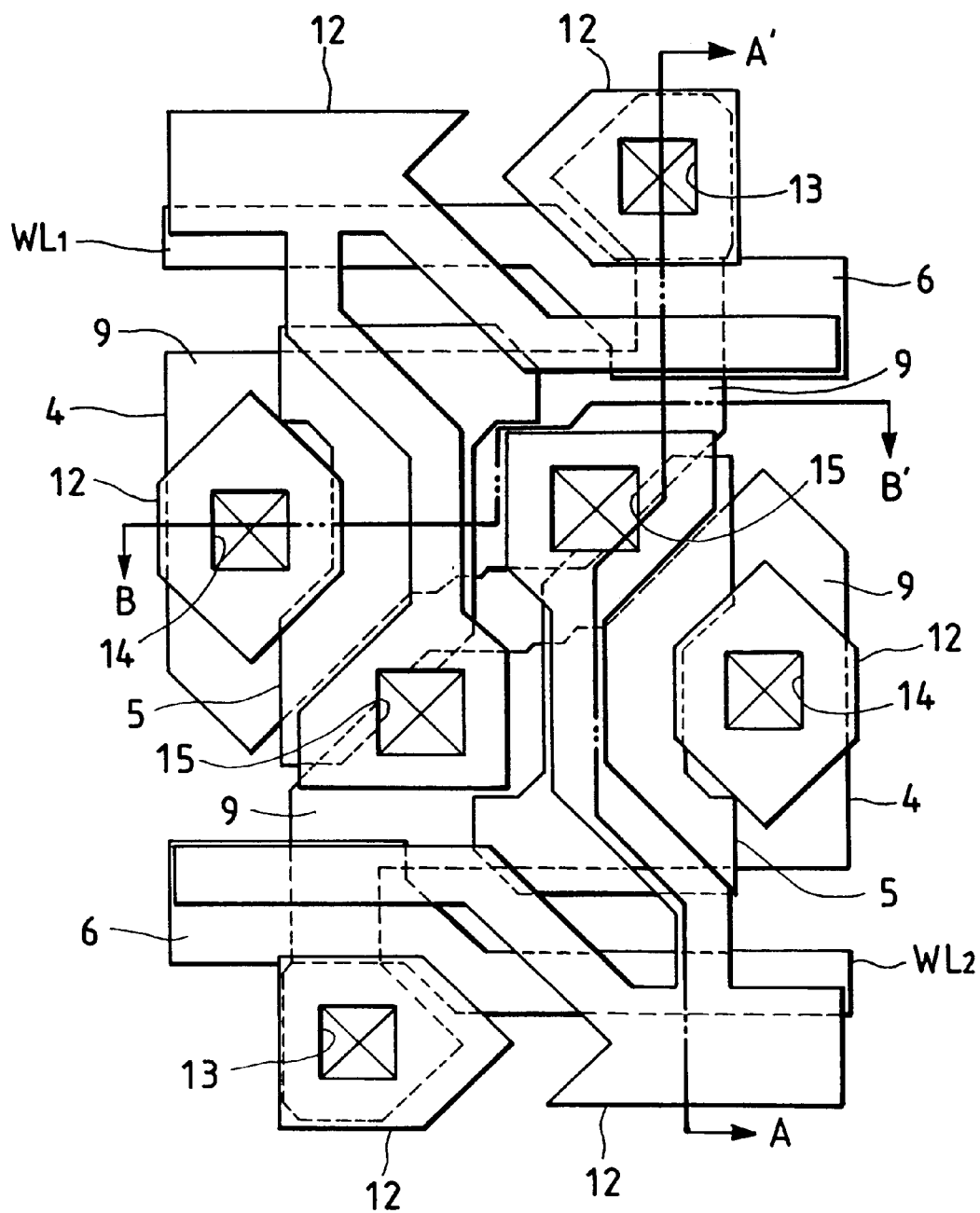
FIG. 26 is another schematic plan view of the semiconductor substrate, showing another phase of the process for fabricating a memory cell of the SRAM embodying the invention.
Figure 27:
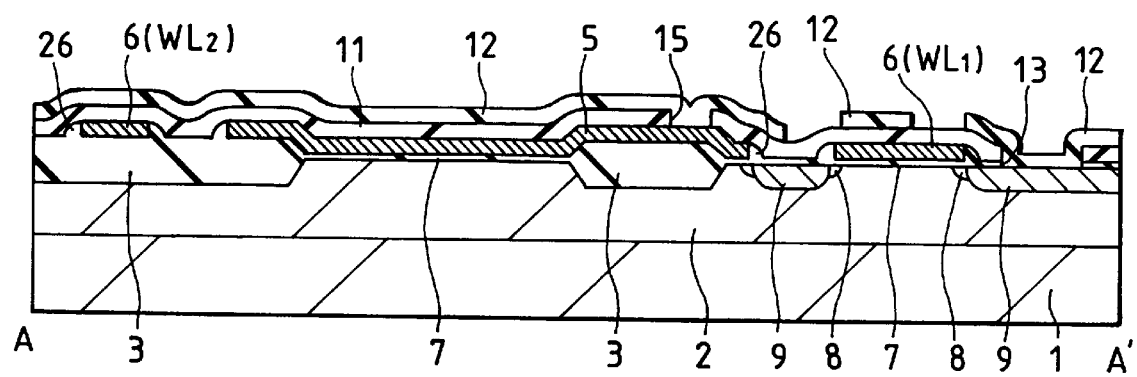
FIG. 27 is a cross-sectional view taken on line A–A' in FIG. 26.
Figure 28:
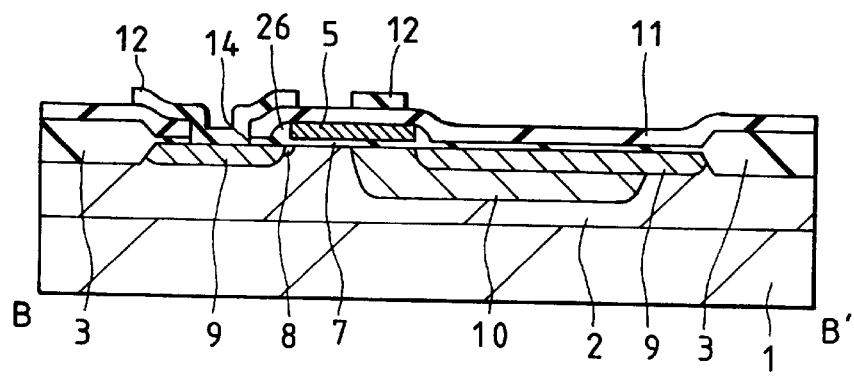
FIG. 28 is a cross-sectional view taken on line B–B' in FIG. 26.

After the photo resist film 25 is removed, a silicon oxide film 11 is deposited by CVD method over the gate electrodes 5 and gate electrodes 6 (word lines $WL_1$ and $WL_2$) to form connecting holes, as depicted in FIG. 26, FIG. 27 (cross-sectional view taken on line A–A' in FIG. 26) and FIG. 28 (cross-sectional view taken on line B–B' in FIG. 26). The connecting holes thus formed comprise connecting holes 13 and 14 reaching the $n^+$ type semiconductor region 9, and connecting holes 15 spanning the $n^+$ type semiconductor region 9 and the gate electrodes 5 of the driver MISFETs $Qd_1$ and $Qd_2$. Thereafter, a second layer polycrystal silicon film 12 is deposited by CVD method on the silicon oxide film 11. The polycrystal silicon film 12 is patterned into the plan layout shown in FIG. 26.

Figure 29:
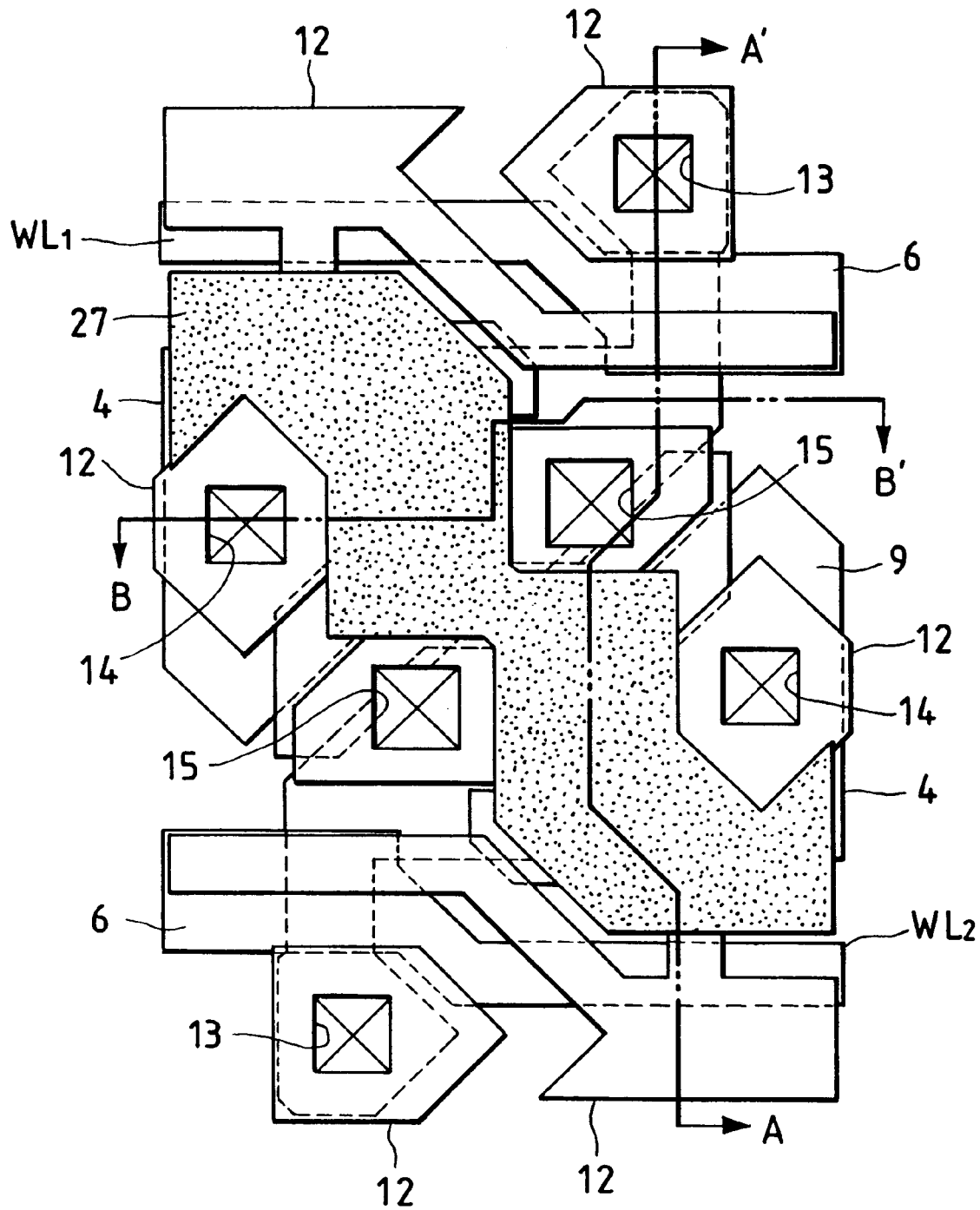
FIG. 29 is another schematic plan view of the semiconductor substrate, illustrating another phase of the process for fabricating a memory cell of the SRAM embodying the invention.
Figure 30:
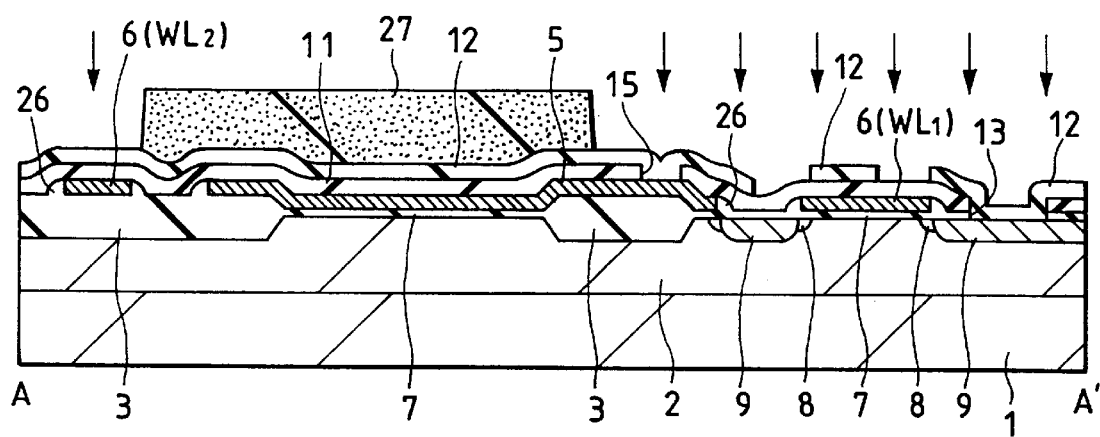
FIG. 30 is a cross-sectional view taken on line A–A' in FIG. 29.
Figure 31:
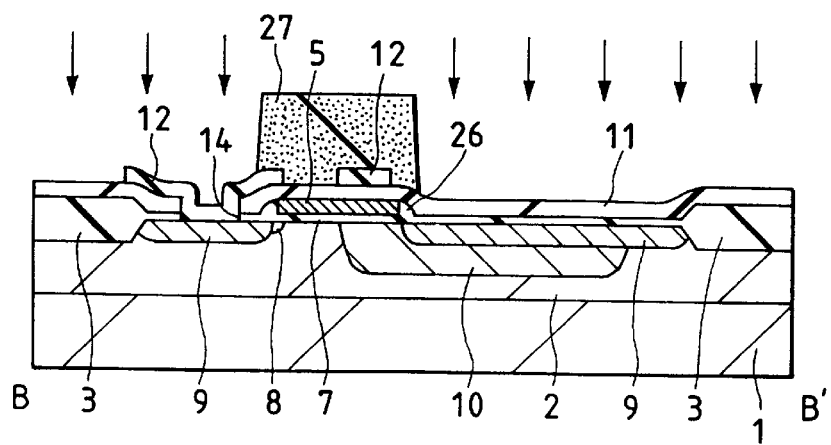
FIG. 31 is a cross-sectional view taken on line B–B' in FIG. 29.
Figure 32:
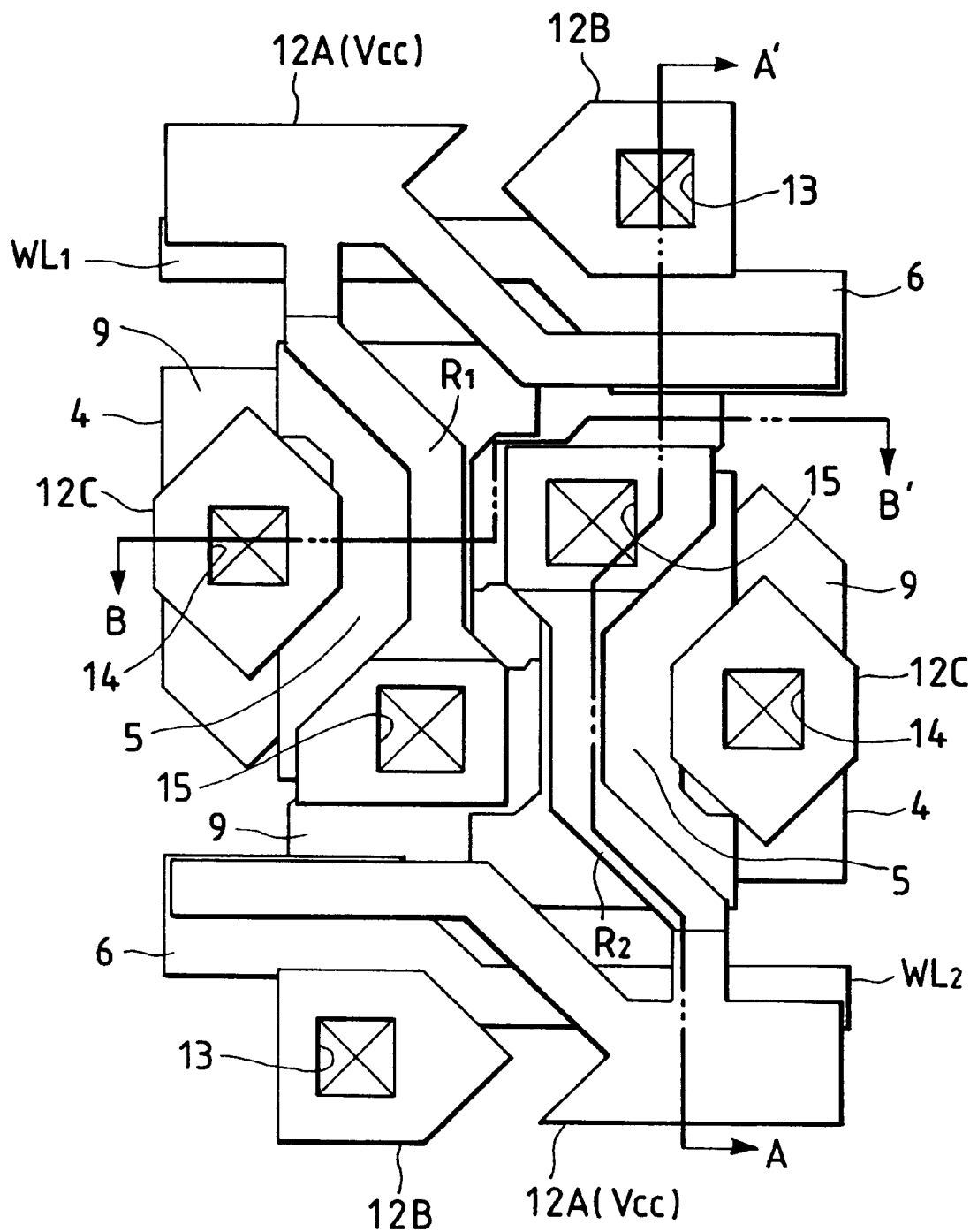
FIG. 32 is another schematic plan view of the semiconductor substrate, illustrating another phase of the process for fabricating a memory cell of the SRAM embodying the invention.
Figure 33:
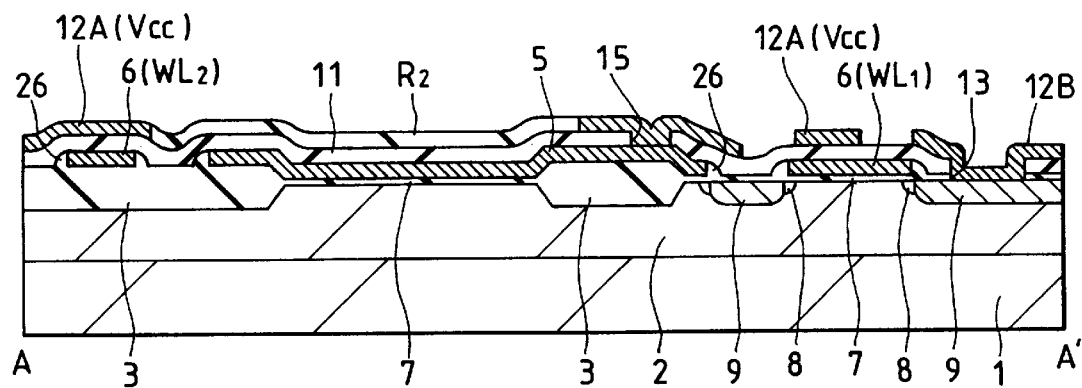
FIG. 33 is a cross-sectional view taken on line A–A' in FIG. 32.
Figure 34:
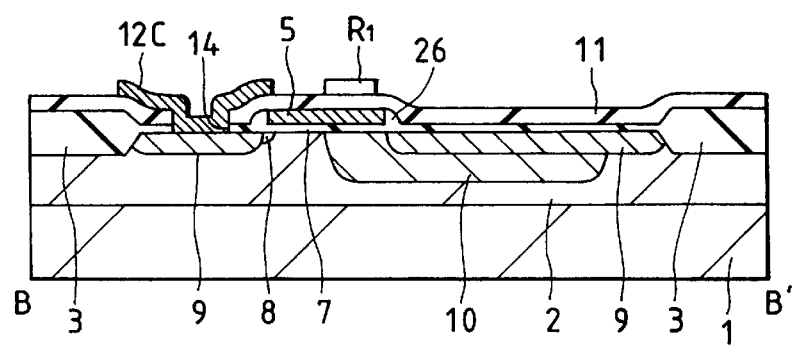
FIG. 34 is a cross-sectional view taken on line B–B' in FIG. 32.

Then as illustrated in FIG. 29, FIG. 30 (cross-sectional view taken on line A–A' in FIG. 29) and FIG. 31 (cross-sectional view taken on line B–B' in FIG. 29), a photo resist film 27 is used as the mask with which n-type impurity ions (e.g., phosphorus, arsenic, antimony (Sb)) are implanted into part of the polycrystal silicon film 12. The ion implantation forms the wiring 12A of low resistance, pad layers 12B and 12C, and resistor elements $R_1$ and $R_2$, as depicted in FIG. 32, FIG. 33 (cross-sectional view taken on line A–A' in FIG. 32) and FIG. 34 (cross-sectional view taken on line B–B' in FIG. 32).

Figure 35:
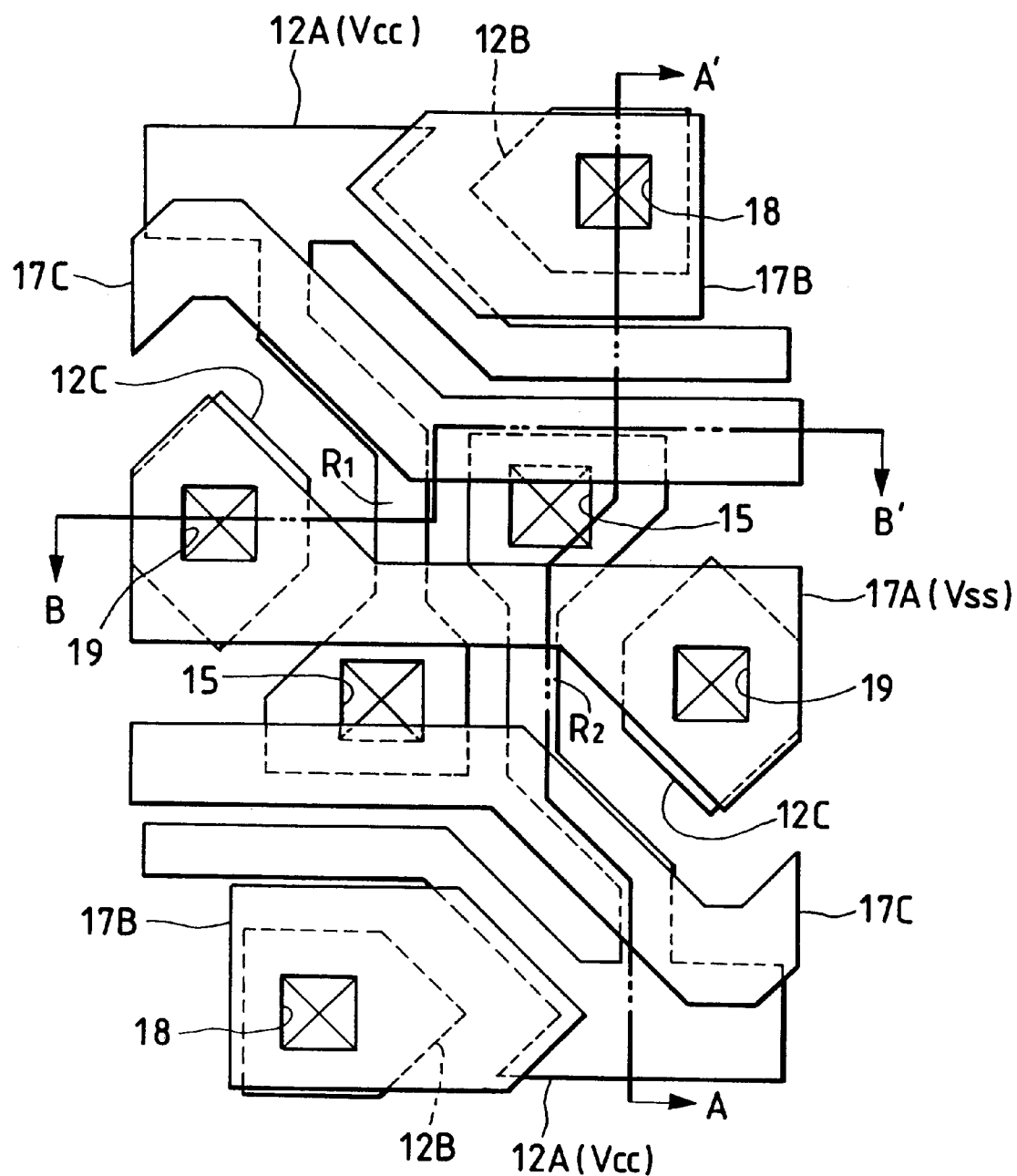
FIG. 35 is another schematic plan view of the semiconductor substrate, illustrating another phase of the process for fabricating a memory cell of the SRAM embodying the invention.
Figure 36:
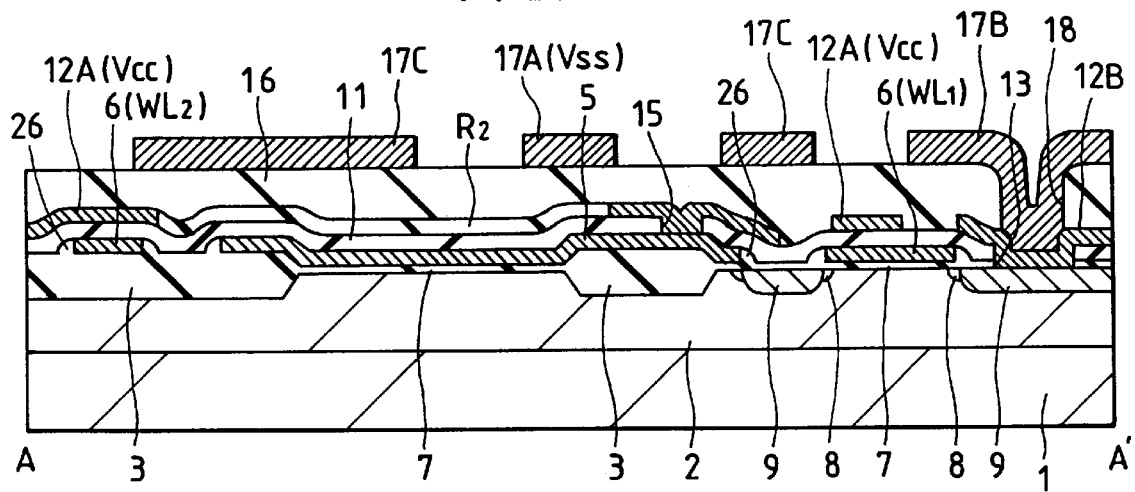
FIG. 36 is a cross-sectional view taken on line A–A' in FIG. 35.
Figure 37:
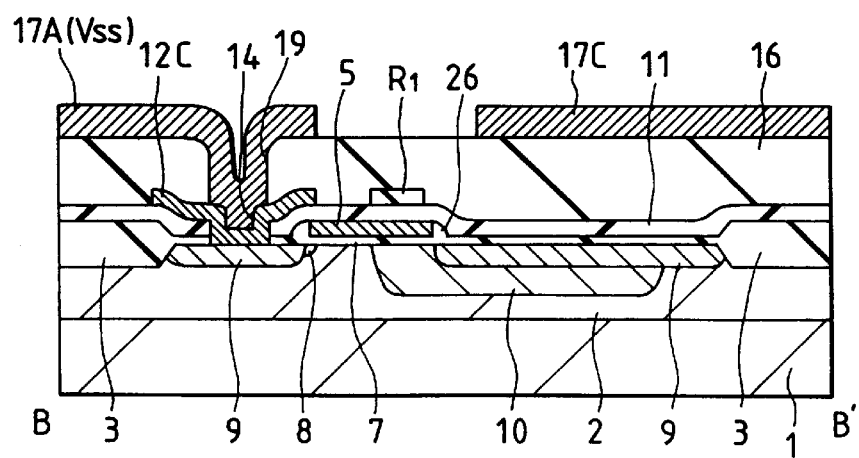
FIG. 37 is a cross-sectional view taken on line B–B' in FIG. 35.

After the photo resist film 27 is removed, the silicon oxide layer insulating film 16 is deposited by CVD method over the wiring 12A, pad layers 12B and 12C, and resistor elements $R_1$ and $R_2$ to form connecting holes, as depicted in FIG. 35, FIG. 36 (cross-sectional view taken on line A–A' in FIG. 35) and FIG. 37 (cross-sectional view taken on line B–B' in FIG. 35). The connecting holes thus formed comprise connecting holes 18 reaching the pad layer 12B, and connecting holes 19 reaching the pad layer 12C. Thereafter, a first layer aluminum film is deposited by sputtering onto the layer insulating film 16, and is patterned into the wiring 17A, pad layer 17B, and word shunts 17C. For the ease of viewing, FIG. 35 omits showing the active regions, the gate electrodes 5 of the driver MISFETs $Qd_1$ and $Qd_2$, and the gate electrodes 6 (word lines $WL_1$ and $WL_2$) of the transfer MISFETs $Qt_1$ and $Qt_2$.

Figure 38:
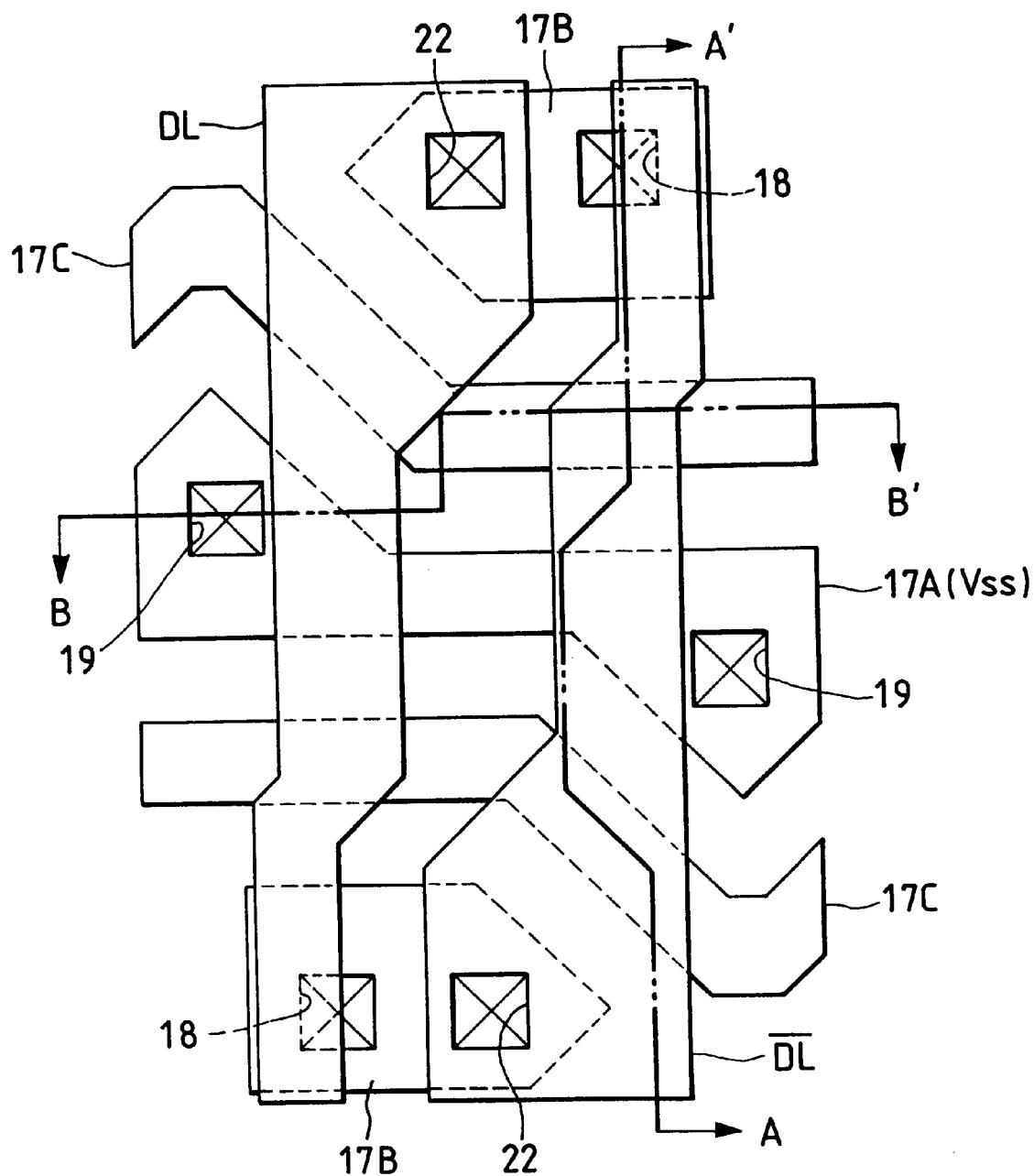
FIG. 38 is another schematic plan view of the semiconductor substrate, illustrating another phase of the process for fabricating a memory cell of the SRAM embodying the invention.
Figure 39:
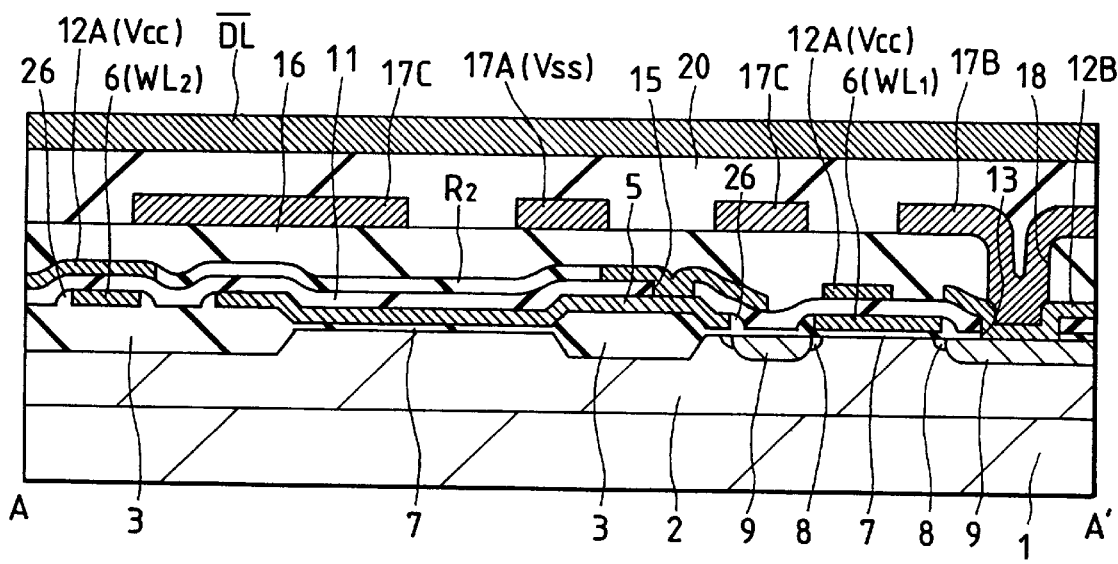
FIG. 39 is a cross-sectional view taken on line A–A' in FIG. 38.
Figure 40:
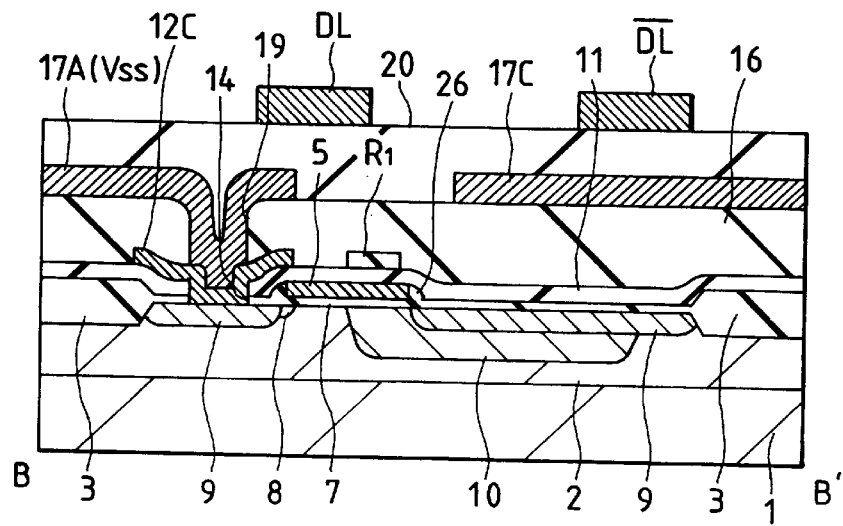
FIG. 40 a cross-sectional view taken on line B–B' in FIG. 38.

Then as shown in FIG. 38, FIG. 39 (cross-sectional view taken on line A–A' in FIG. 38) and FIG. 40 (cross-sectional view taken on line B–B' in FIG. 38), a silicon oxide layer insulating film 20 is deposited by CVD method over the wiring 17A, pad layer 17B and word shunts 17C to form connecting holes 22 reaching the pad layer 17B. After this, a second layer aluminum film is deposited by sputtering over the layer insulating film 20, and is patterned into the data lines (DL, bar DL). For the ease of viewing, FIG. 38 omits showing the active regions, the gate electrodes 5 of the driver MISFETs $Qd_1$ and $Qd_2$, the gate electrodes 6 (word lines $WL_1$ and $WL_2$) of the transfer MISFETs $Qt_1$ and $Qt_2$, wiring layer 12A, pad layers 12B and 12C, and resistor elements $R_1$ and $R_2$.

Thereafter, the final passivation film 21 is deposited by CVD method over the data lines (DL, bar DL). This completes the fabrication of the high resistance load type memory cell shown in FIGS. 1 through 4 and embodying the invention.

Figure 41:
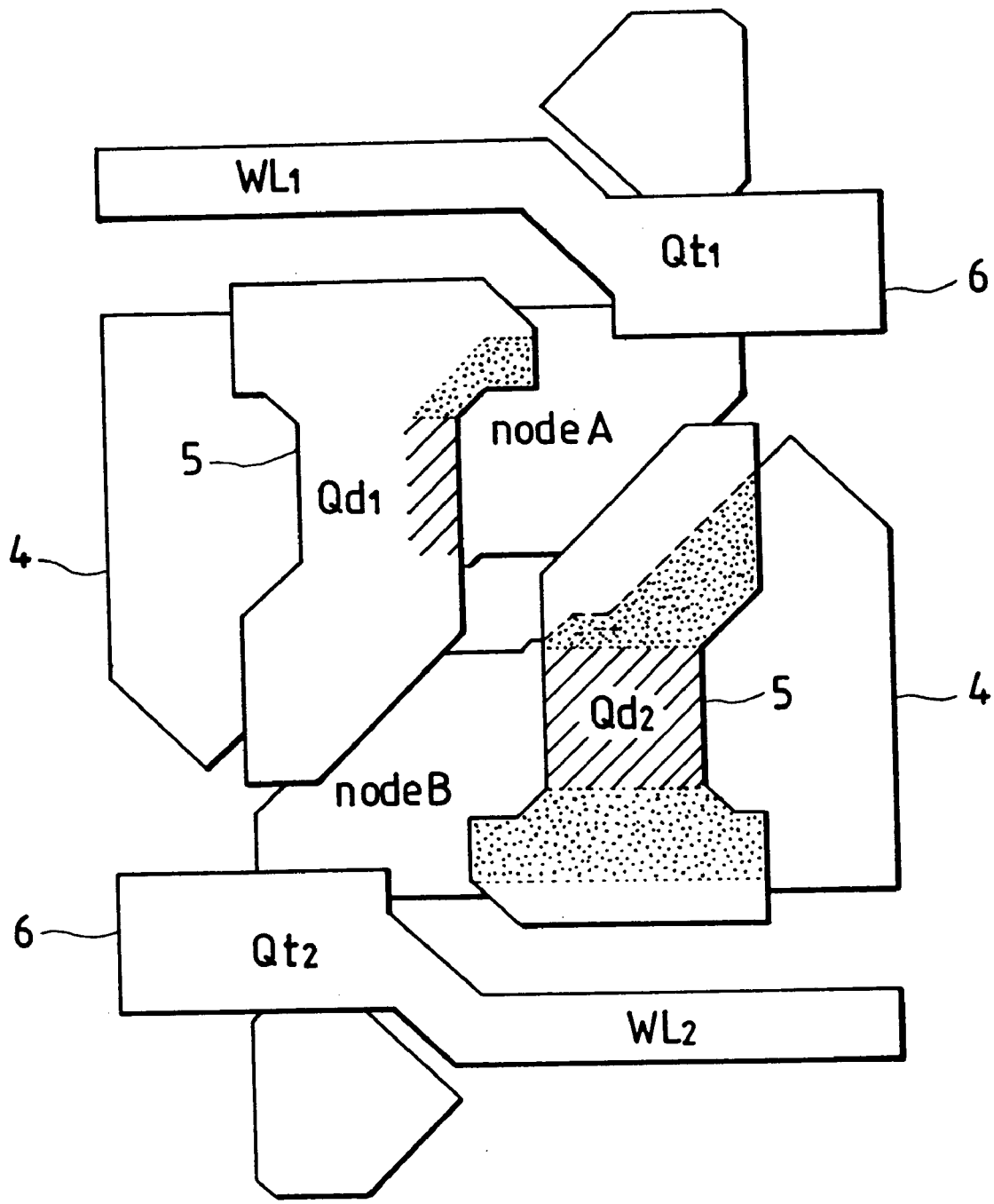
FIG. 41 is a plan view showing schematically the gate capacitance memory cell.

FIG. 41 is a plan view showing schematically the gate capacitance (Cox) of a memory cell embodying the invention, the gate capacitance being in effect when the storage node A is at the high potential level. As illustrated, the gate capacitance ($Cox_2$) of the driver MISFET $Qd_2$ being turned on comprises two components: one formed in a channel forming region (indicated by hatching pattern), the other in a capacitance-dedicated region (indicated by shadow pattern). The gate capacitance ($Cox_1$) of the driver MISFET $Qd_1$ being turned off is generated in the overlapping area between the gate and the drain electrode (indicated by hatching pattern).

Figure 47A:
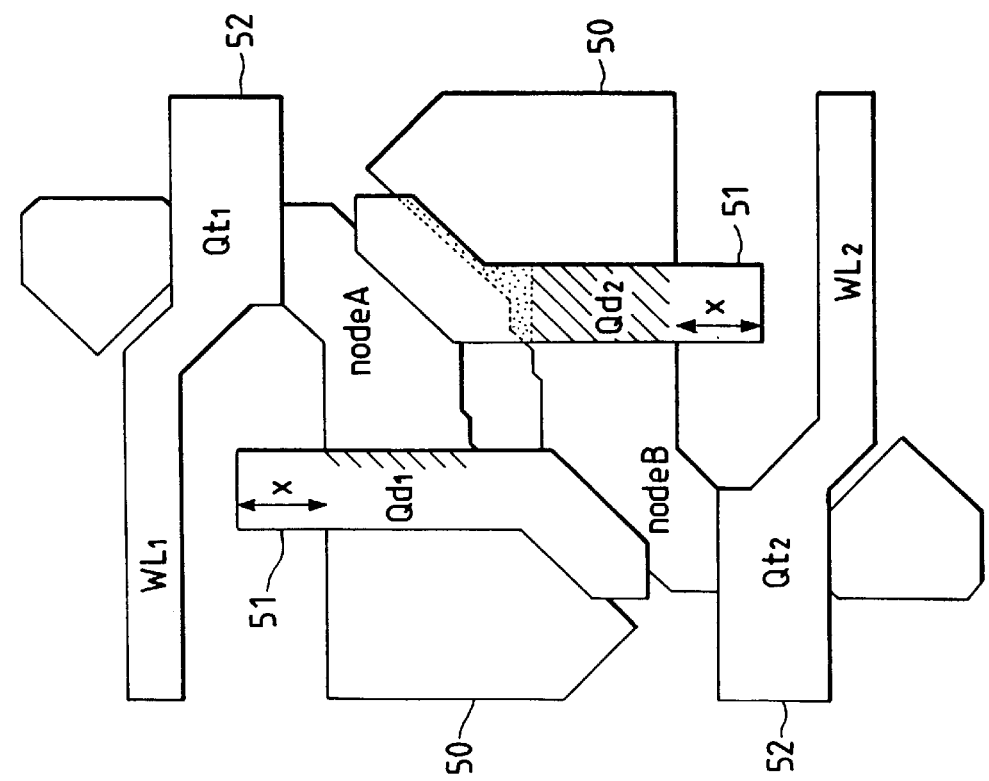
Figure 48:
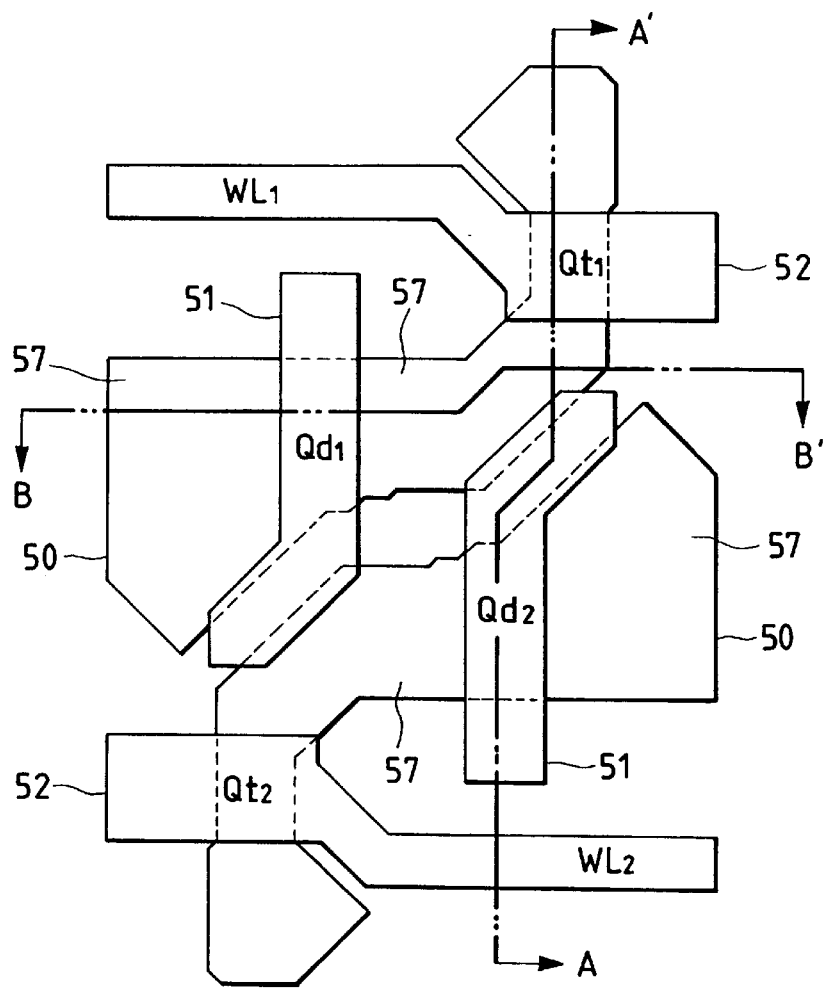
FIG. 48 is a schematic plan view of a semiconductor substrate, illustrating one phase of the conventional process for fabricating an SRAM memory cell.
Figure 49:
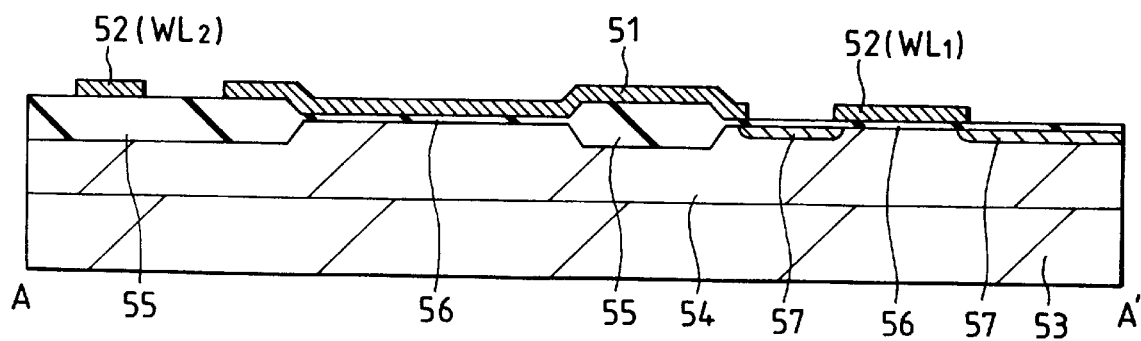
FIG. 49 is a cross-sectional view taken on line A–A' in FIG. 48.
Figure 50:
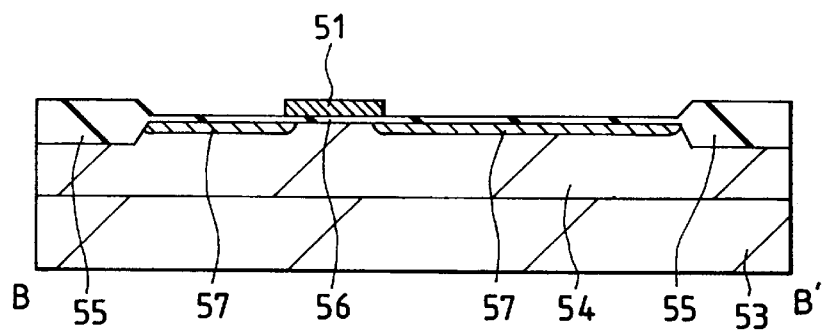
FIG. 50 is a cross-sectional view taken on line B–B' in FIG. 48.
Figure 51:
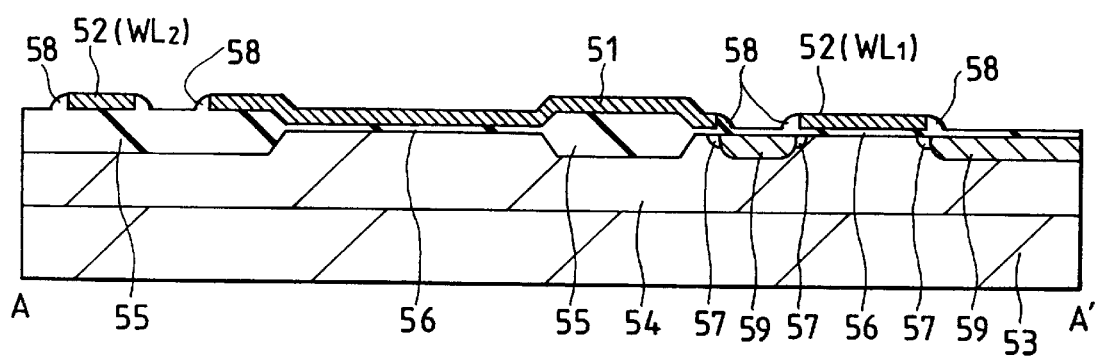
FIG. 51 is another schematic cross-sectional view of the semiconductor substrate, illustrating another phase of the conventional process for fabricating an SRAM memory cell.
Figure 52:
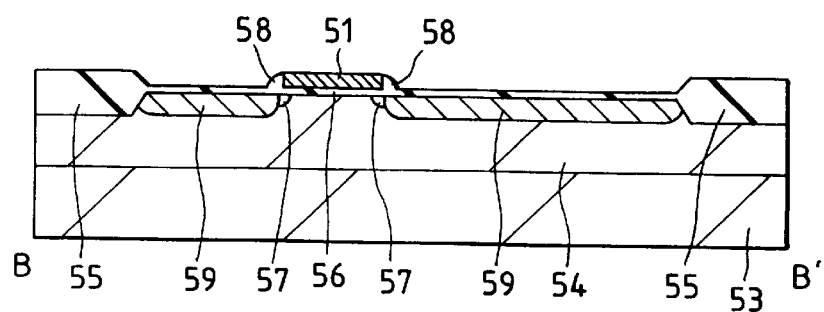
FIG. 52 another schematic cross-sectional view of the semiconductor substrate, illustrating another phase of the conventional process for fabricating an SRAM memory cell.
Figure 53:
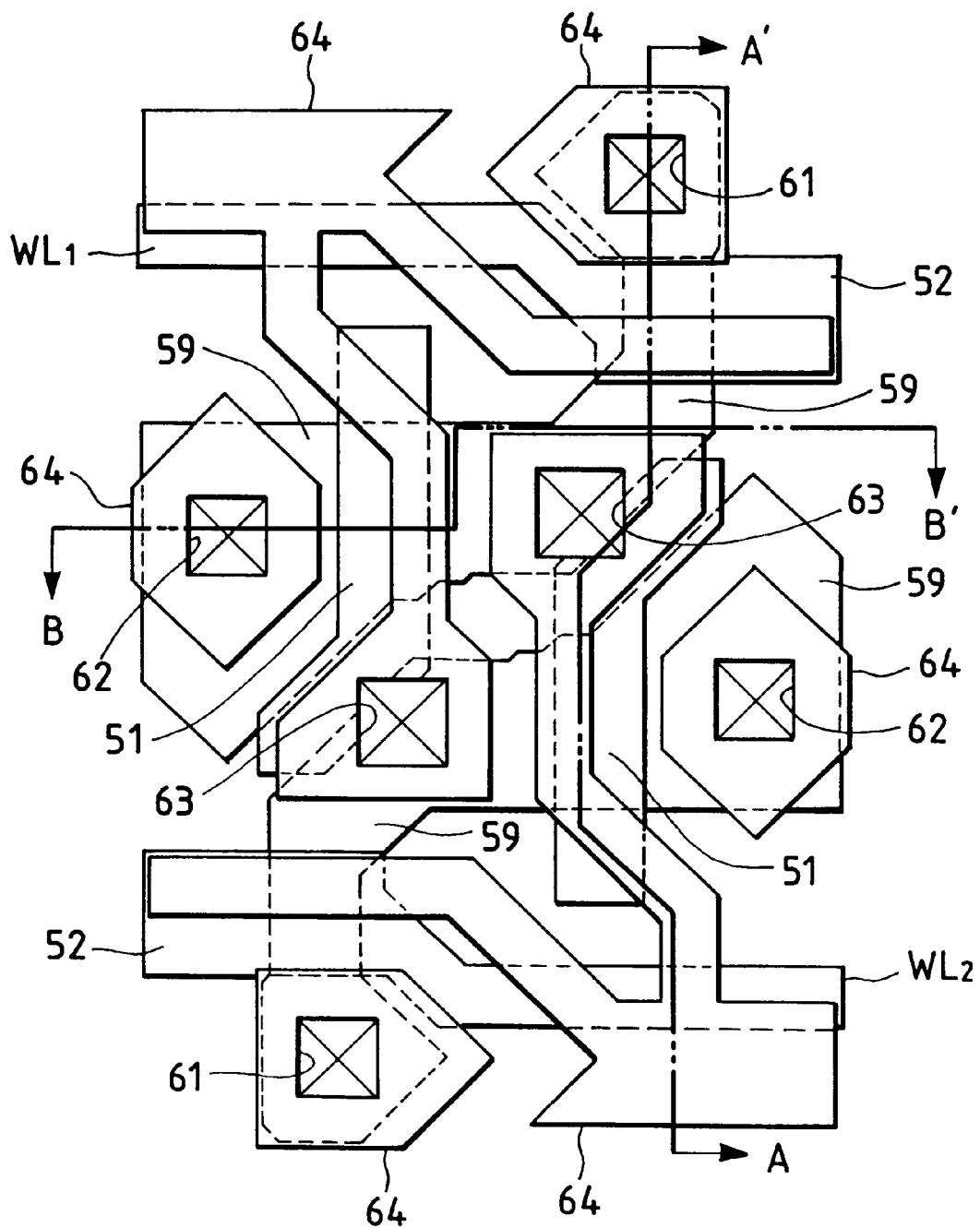
FIG. 53 a schematic plan view of the semiconductor substrate, showing another phase of the conventional process for fabricating an SRAM memory cell.
Figure 54:
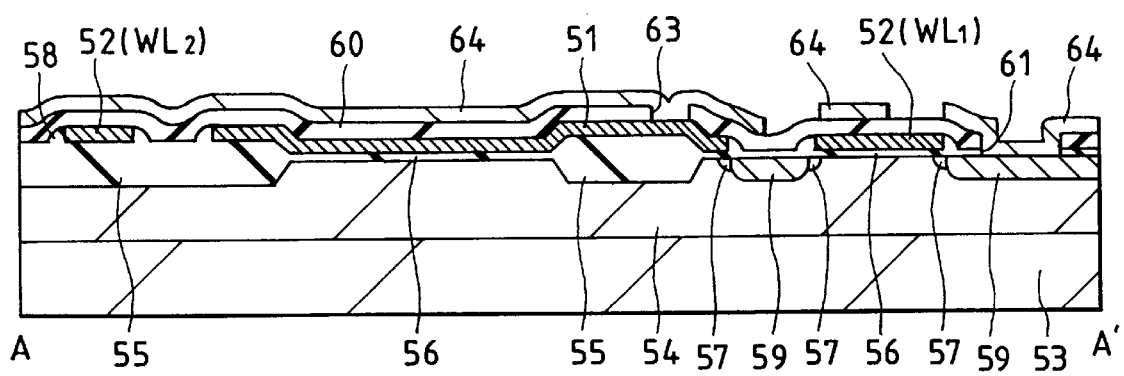
FIG. 54 is a cross-sectional view taken on line A–A' in FIG. 53.
Figure 55:
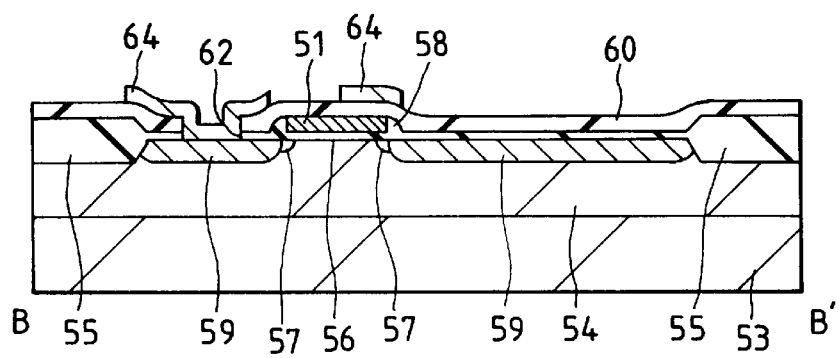
FIG. 55 is a cross-sectional view taken on line B–B' in FIG. 53.
Figure 56:
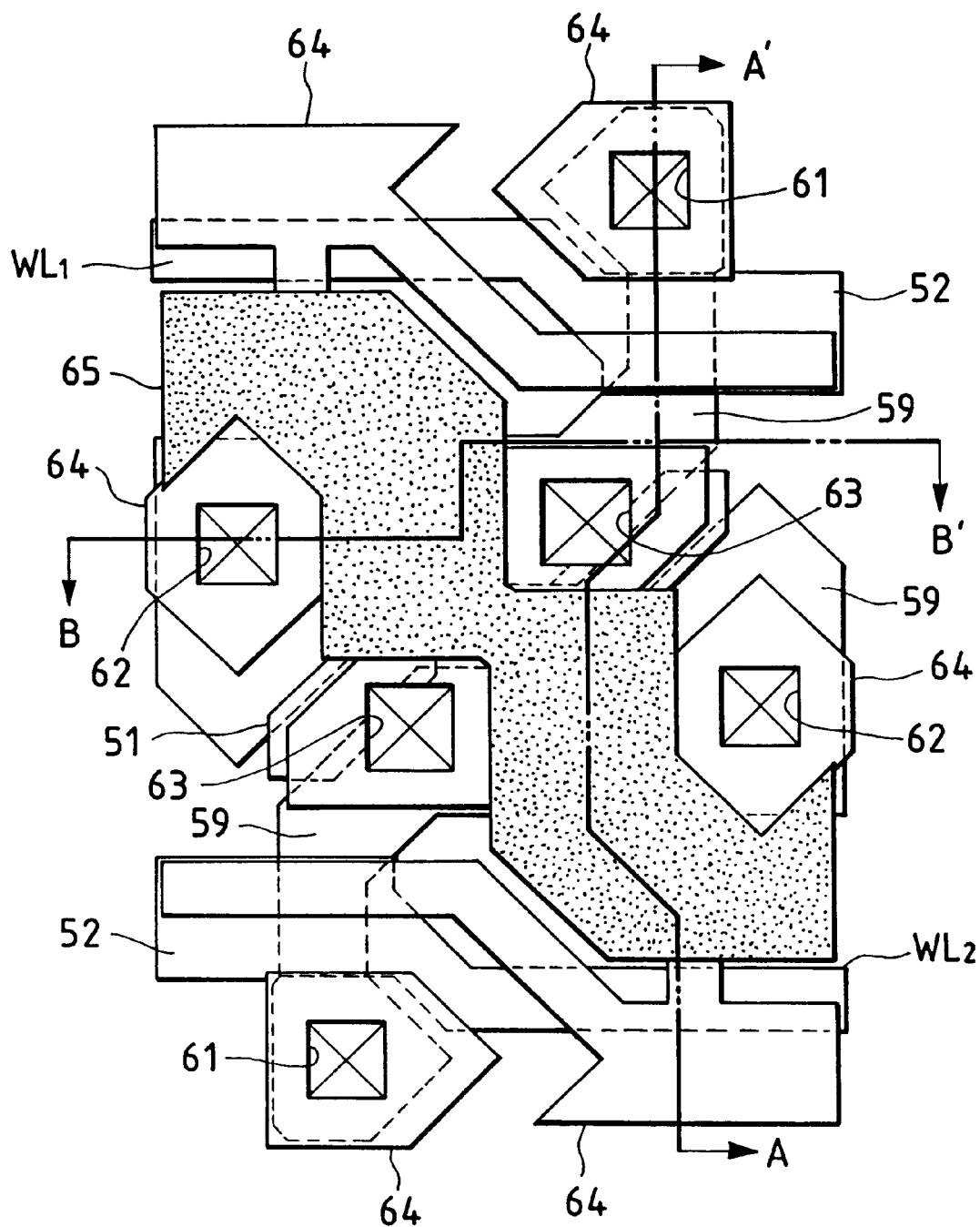
FIG. 56 is another schematic plan view of the semiconductor substrate, showing another phase of the conventional process for fabricating an SRAM memory cell.
Figure 57:
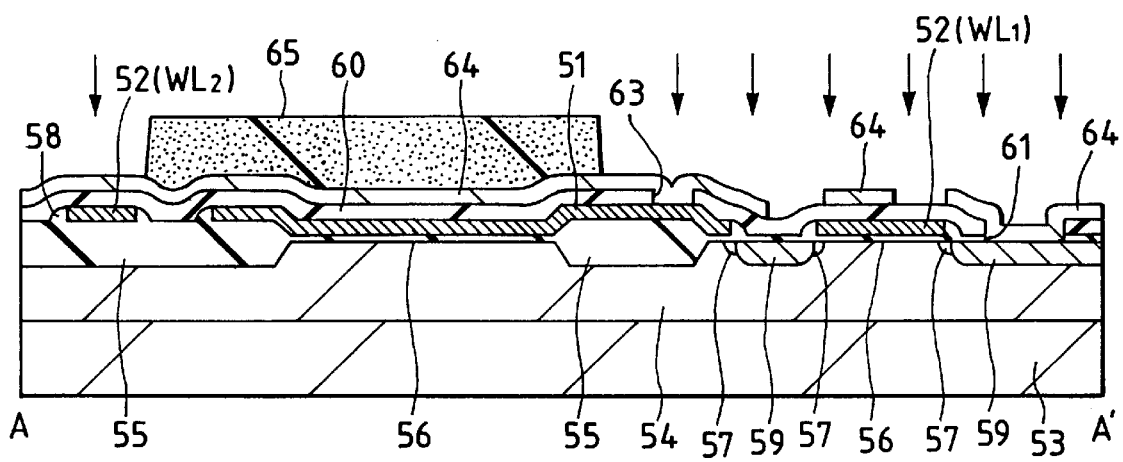
FIG. 57 is a cross-sectional view taken on line A–A' in FIG. 56.
Figure 58:
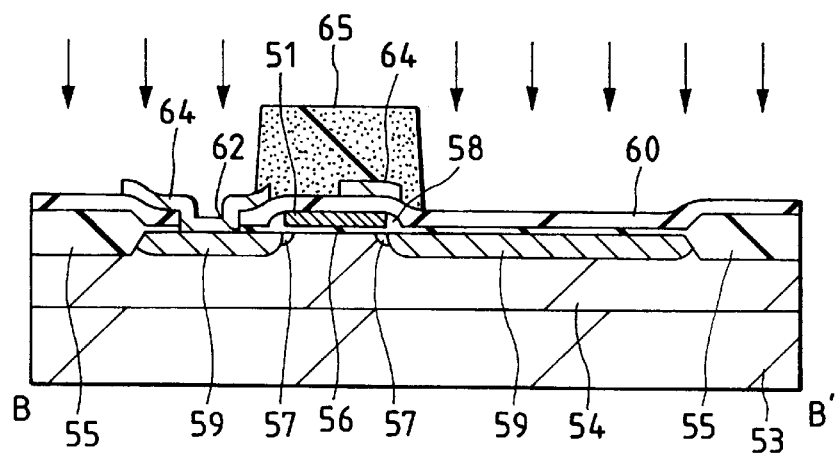
FIG. 58 is a cross-sectional view taken on line B–B' in FIG. 56.
Figure 59:
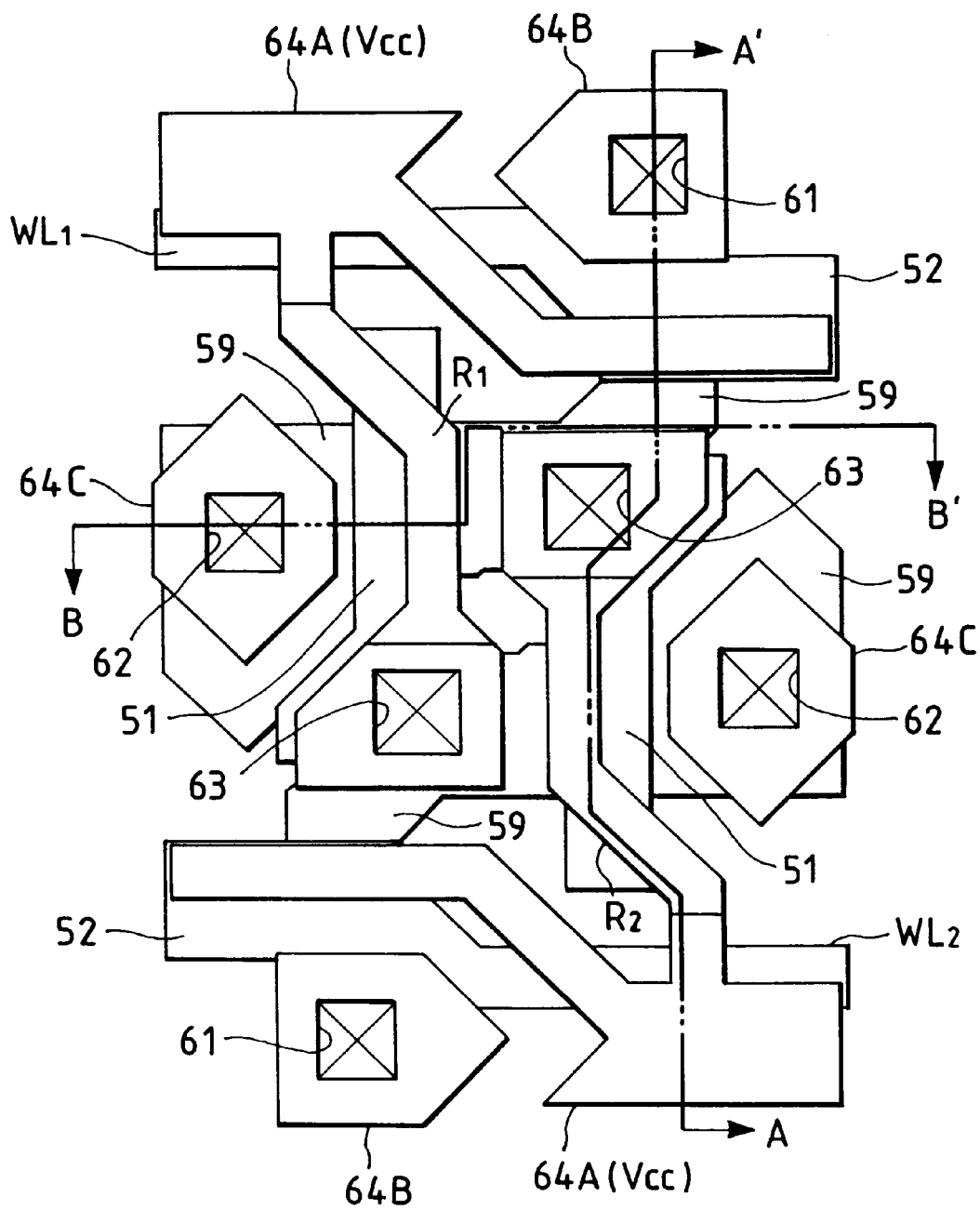
FIG. 59 is another schematic plan view of the semiconductor substrate, showing another phase of the conventional process for fabricating an SRAM memory cell.
Figure 60:
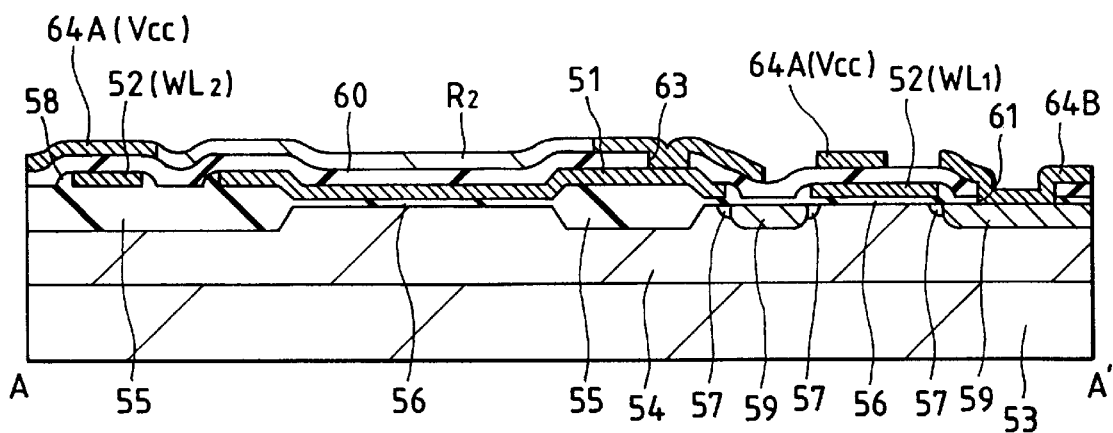
FIG. 60 is a cross-sectional view taken on line A–A' in FIG. 59.
Figure 61:
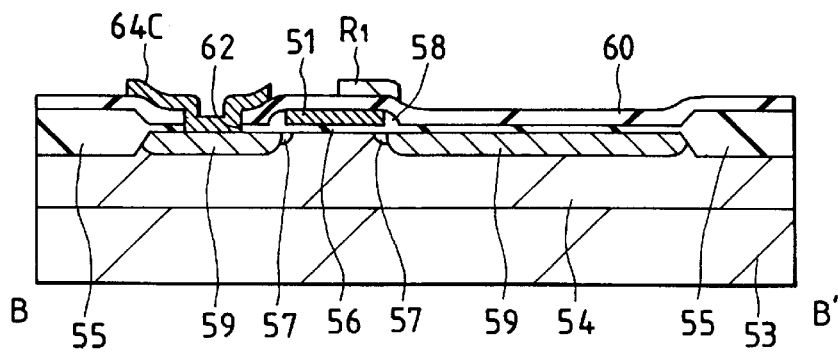
FIG. 61 is a cross-sectional view taken on line B–B' in FIG. 59.
Figure 62:
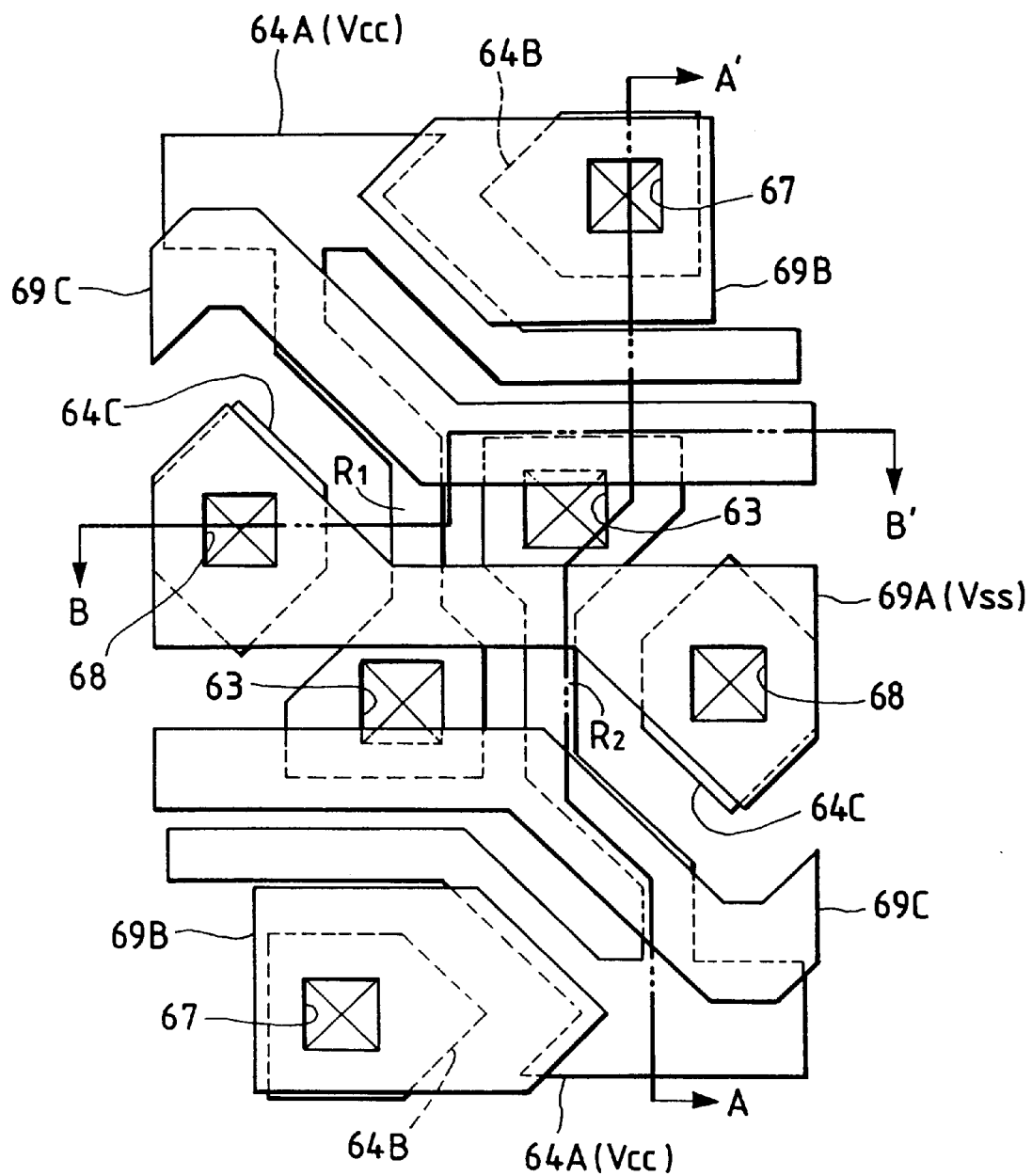
FIG. 62 is another schematic plan view of the semiconductor substrate, showing another phase of the conventional process for fabricating an SRAM memory cell.
Figure 63:
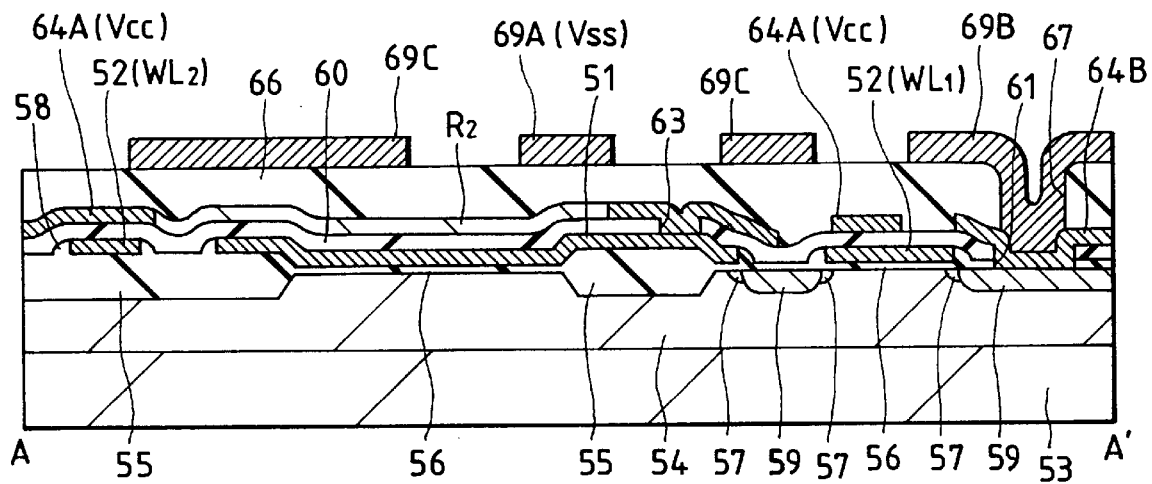
FIG. 63 is a cross-sectional view taken on line A–A' in FIG. 62.
Figure 64:
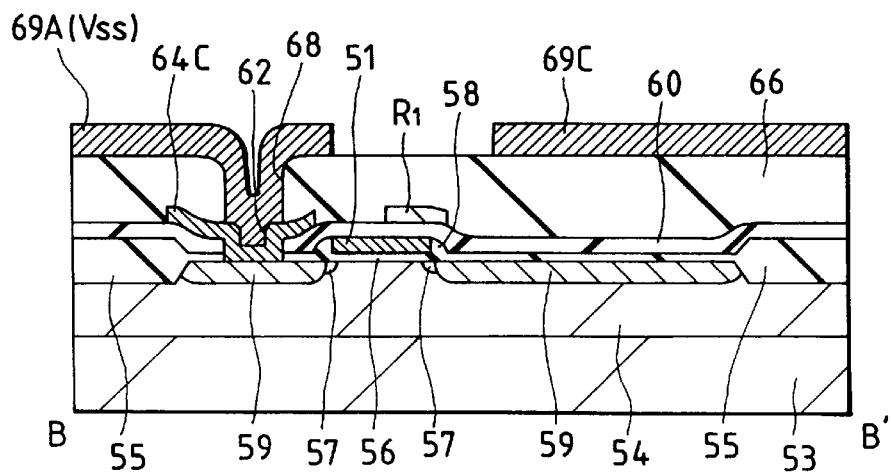
FIG. 64 is a cross-sectional view taken on line B–B' in FIG. 62.
Figure 65:
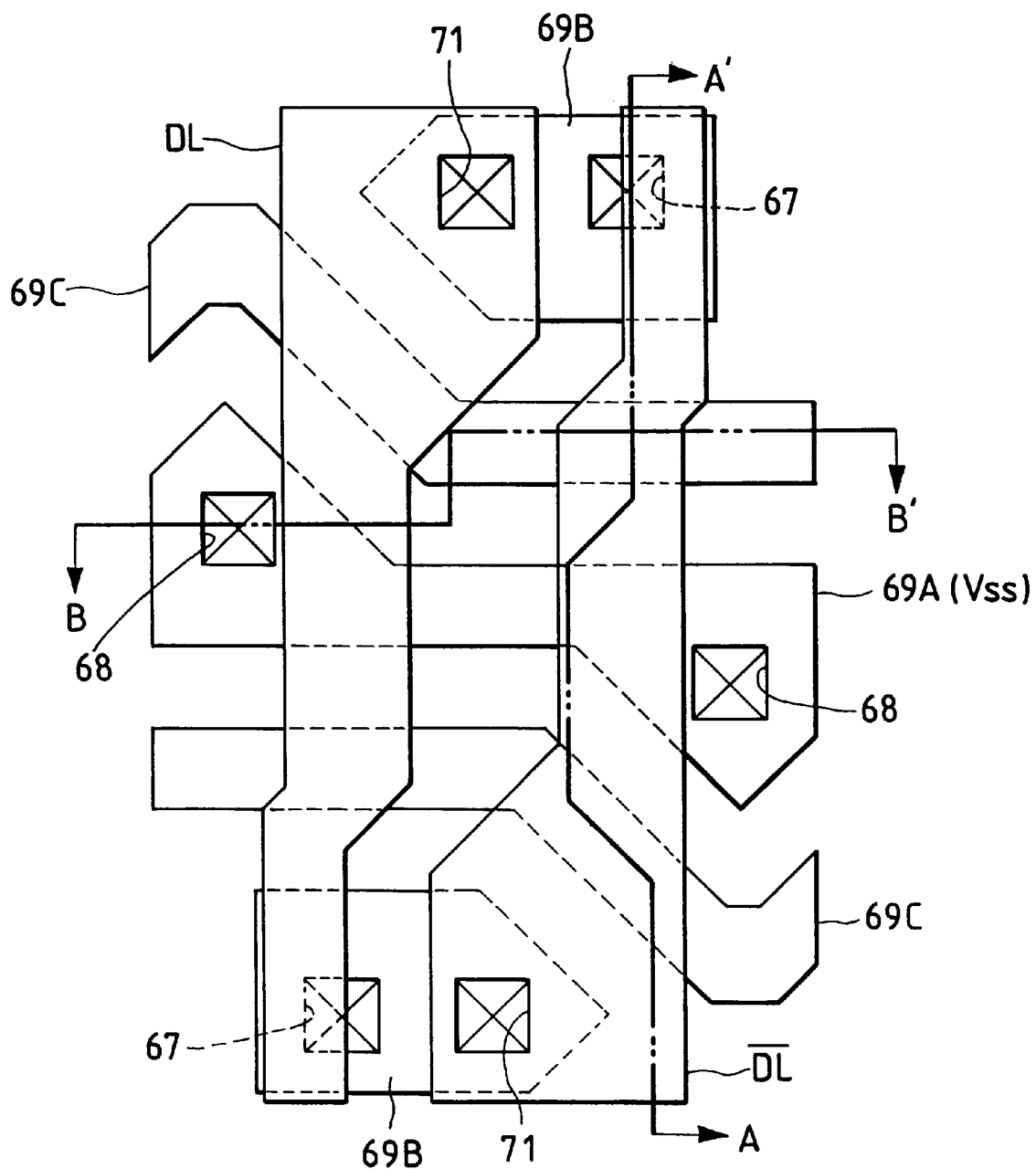
FIG. 65 is another schematic plan view of the semiconductor substrate, showing another phase of the conventional process for fabricating an SRAM memory cell.
Figure 66:
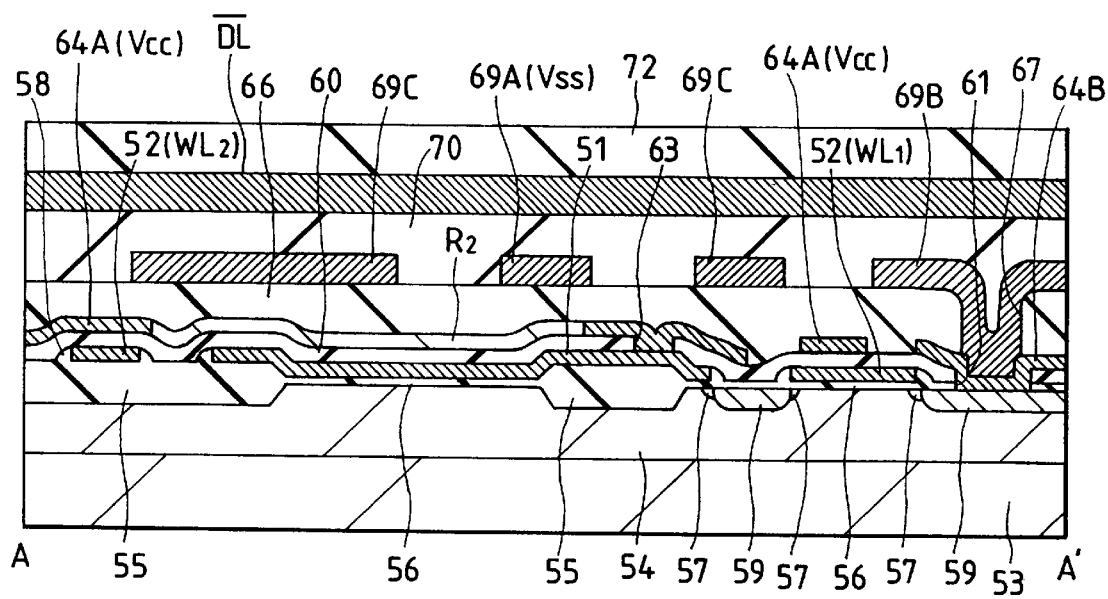
FIG. 66 is a cross-sectional view taken on line A–A' in FIG. 65.
Figure 67:
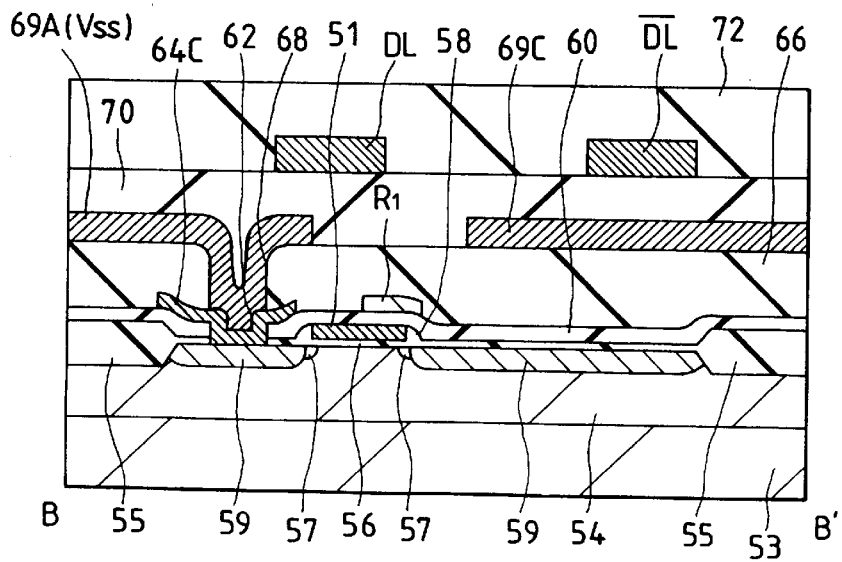
FIG. 67 is a cross-sectional view taken on line B–B' in FIG. 65.
Figure 69:
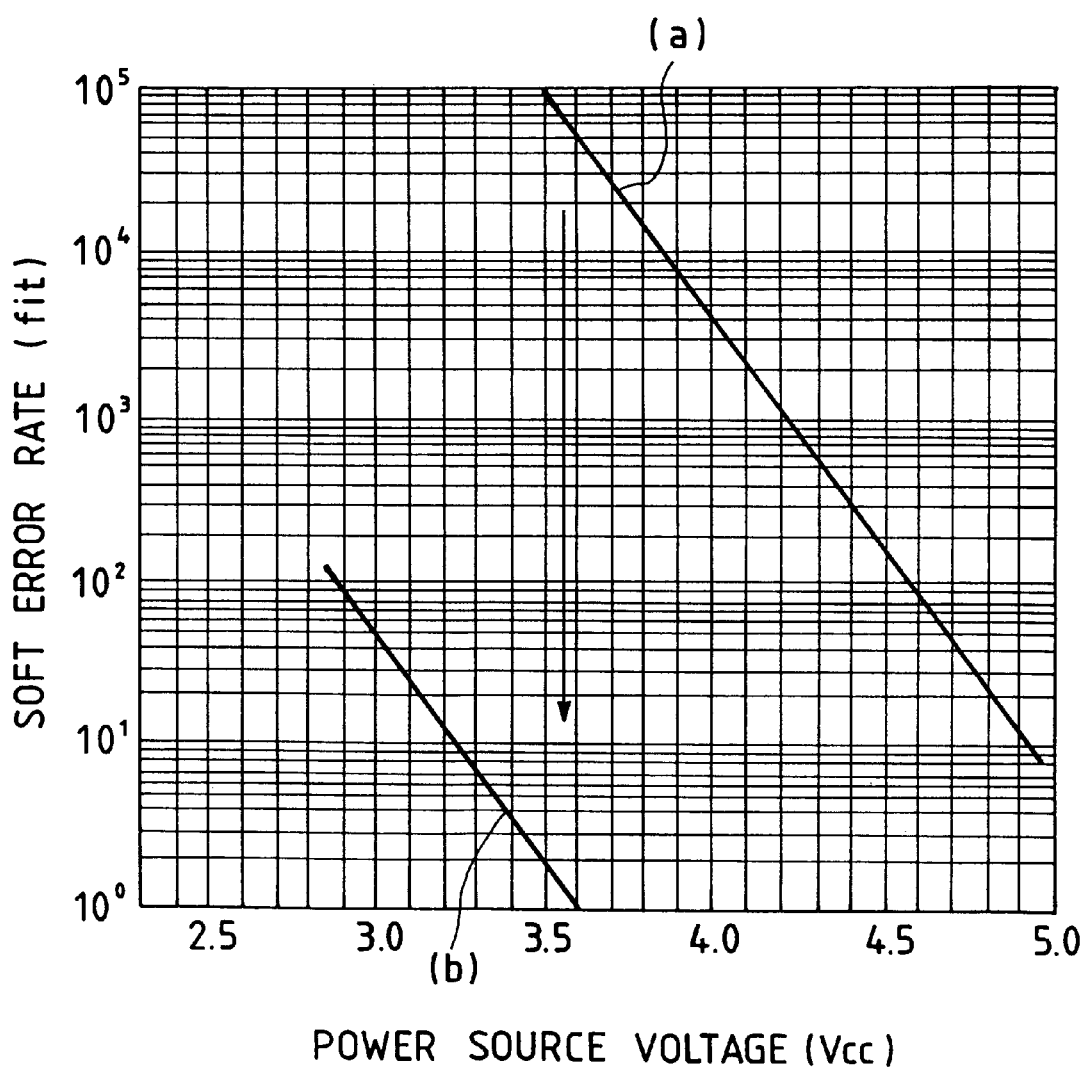
FIG. 69 is a graphic representation of typical relationships between the soft error rate and the operating voltage of SRAM memory cells.

If the gate insulating film 7 is 9 nm thick, the gate capacitance (Cox) component is raised to 11.3 fF from 2.1 fF for the memory cell shown in FIG. 47A. This increases the total storage node capacitance from 5.8 fF to 15 fF. As a result, as shown in FIG. 69, it becomes possible for the memory cells of the invention to attain the soft error rate of 50 Fit or less even when the power supply voltage (Vcc) is lowered from 5.0±0.3 V to 3.3±0.3 V.

Figure 42:
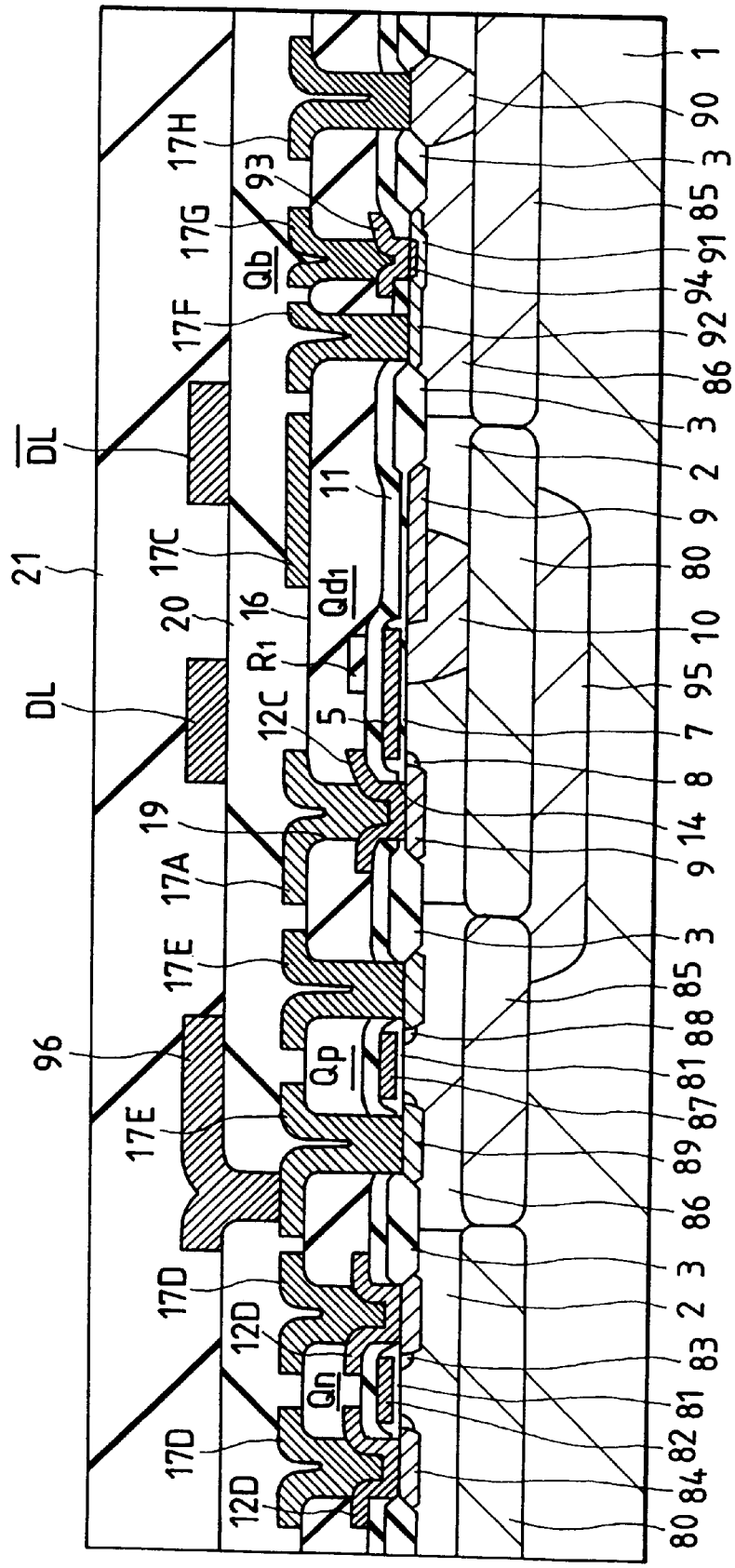
FIG. 42 is a schematic cross-sectional view of a semiconductor substrate, illustrating a bipolar CMOS SRAM embodying the invention.

FIG. 42 is a schematic cross-sectional view of a semiconductor substrate, illustrating a bipolar CMOS SRAM embodying the invention. This bipolar CMOS SRAM combines memory cells of the invention with peripheral circuits composed of n-channel MISFETs Qn of the LDD structure, p-channel MISFETs Qp, and npn bipolar transistors Qb.

Each n-channel MISFET Qn of the peripheral circuits is formed on the main surface of the p-type well 2 formed over a p-type buried layer 80 of high impurity density. The n-channel MISFET Qn is constituted by source and drain regions which comprise a gate insulating film 81, gate electrodes 82 made of the first layer polycrystal silicon film, an $n^-$ type semiconductor region 83 of low impurity density, and an $n^+$ type semiconductor region 84 of high impurity density. The source and drain regions are connected to wiring 17D via a pad layer 12D composed of the second layer polycrystal silicon film. The wiring 17D is made of the first layer aluminum film.

Each p-channel MISFET Qp is formed over the main surface of an n-type well 86 furnished on an $n^+$ type buried layer 85 of high impurity density. The p-channel MISFET Qp is constituted by source and drain regions which comprise the gate insulating film 81, the gate electrodes 87 made of the first layer polycrystal silicon film, a $p^-$ type semiconductor region 88 of low impurity density, and a $p^+$ type semiconductor region 89 of high impurity density. The source and drain regions are connected to wiring 96 via a pad layer 17E composed of the first layer aluminum film. The wiring 96 is made of the second layer aluminum film.

Each npn bipolar transistor Qb uses the n+ type buried layer 85 of high impurity density as a buried collector, on which is formed an n-type well that acts as an intrinsic collector. The npn bipolar transistor Qb is constituted by the $n^+$ type buried layer 85, the n-type well 86, a collector forming region 90 made of an n-type semiconductor region, an intrinsic base region 91, an external base region 92 formed simultaneously with the $p^+$ type semiconductor region 89 of the p-channel MISFET Qp, an emitter extraction electrode 93 made of the second layer polycrystal silicon film, and an emitter region 94 produced by thermally diffusing n-type impurities from the emitter extraction electrode 93 to part of the intrinsic base region 91. The external base region 92, emitter extraction electrode 93 and collector forming region 90 are connected respectively with the wiring portions 17F, 17G and 17H made of the first layer aluminum film.

Each memory cell is formed on the main surface of the p-type well 2 furnished over a p-type buried layer 80. To prevent destruction of data caused by noise from peripheral circuits, the entire memory cell array bottom is surrounded by an n-type buried layer 95, and the memory cell array sides are surrounded by the n+ type buried layer 85.

The drain regions (i.e., n-type semiconductor region 10 overlapping significantly with the gate electrodes 5) of the driver MISFETs $Qd_1$ and $Qd_2$ in a memory cell are in contact with the p-type buried layer 80 at the cell bottom. This arrangement increases the pn junction component (Cpn) of the storage node capacitance, so that the resistance to soft errors is further enhanced.

Although the description above contains many specificities, these should not be construed as limiting the scope of the invention but as merely providing illustrations of the presently preferred embodiments. Thus changes and variations may be made without departing from the spirit and scope of the present invention.

Figure 43:
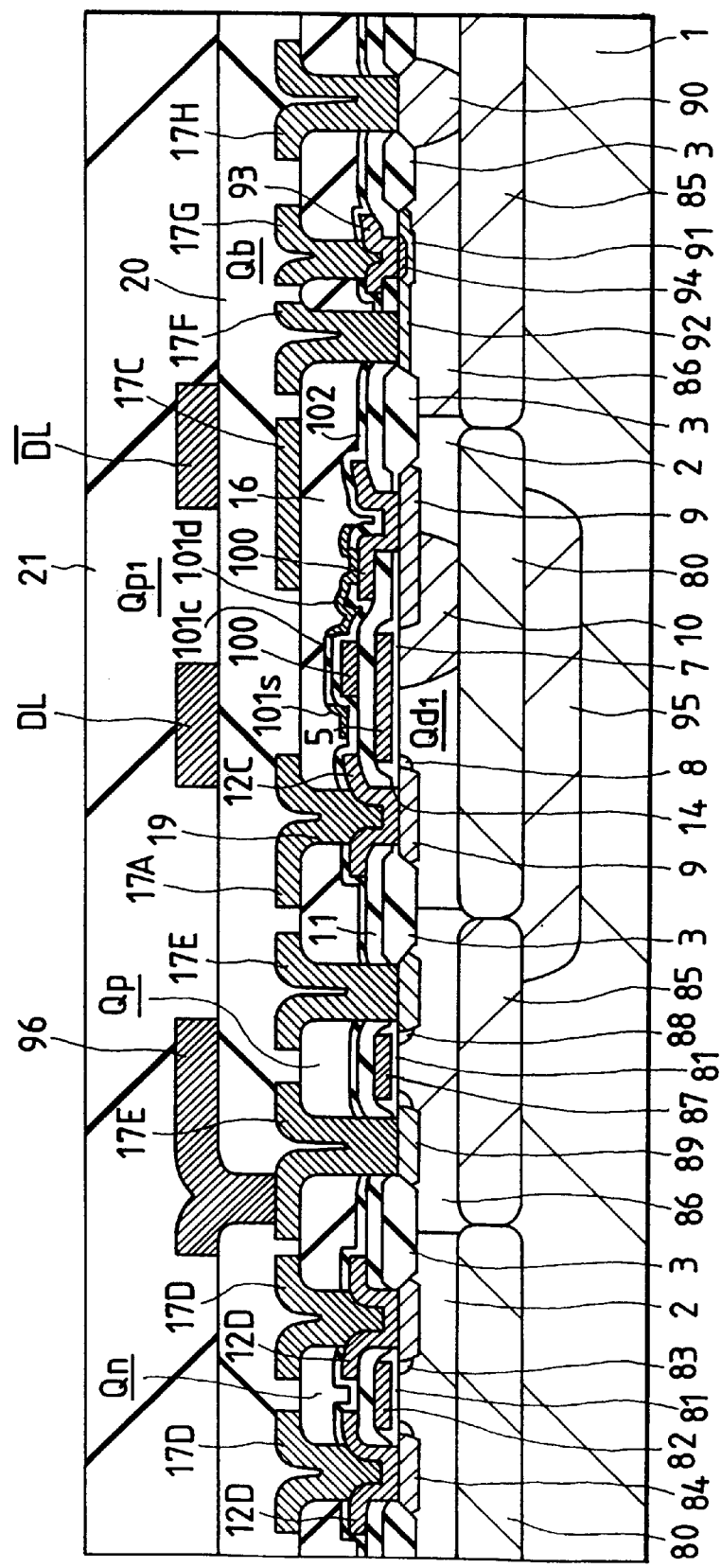
FIG. 43 is a schematic cross-sectional view of another semiconductor substrate, illustrating another bipolar CMOS SRAM embodying the invention.
Figure 44:
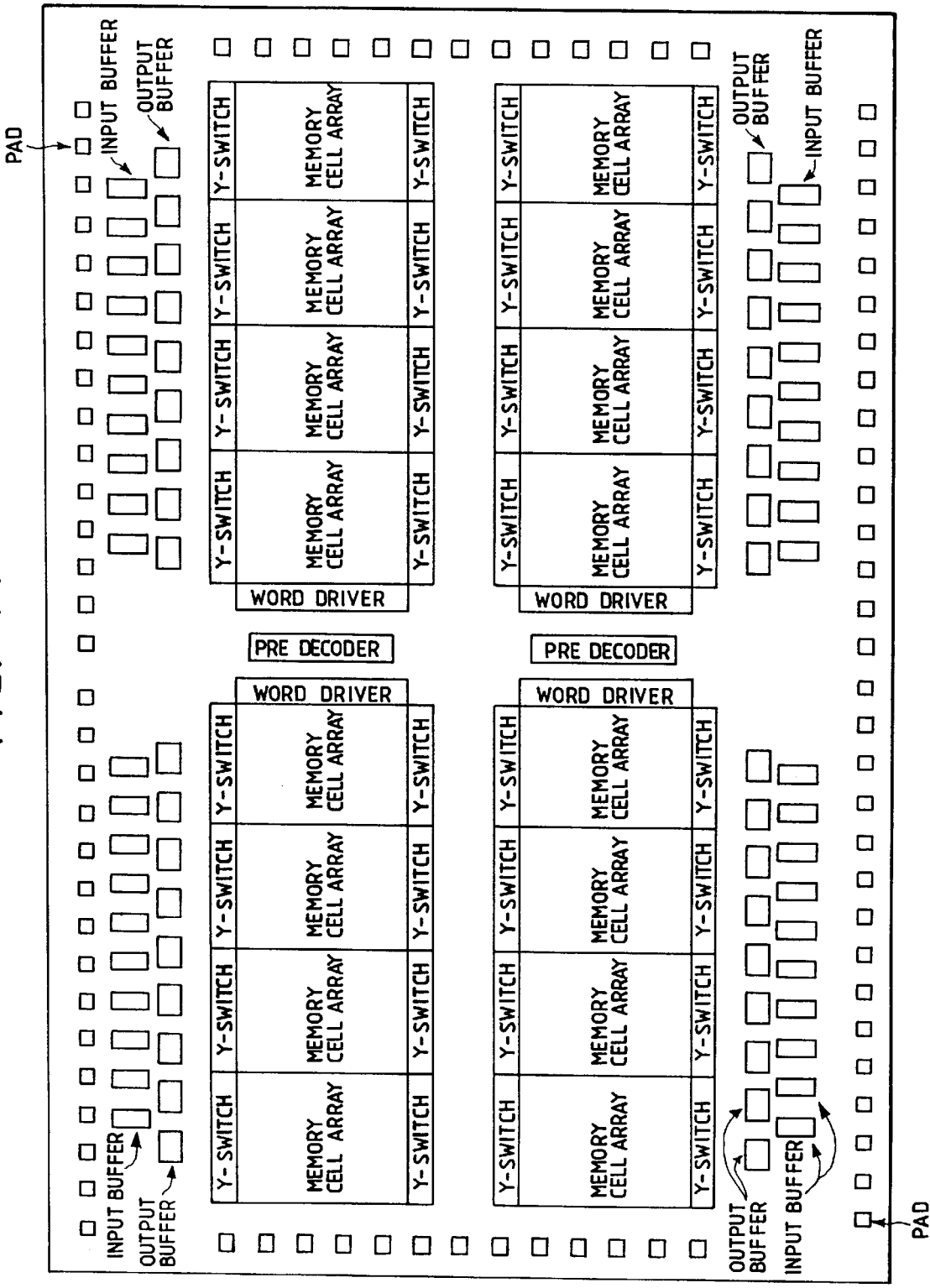
FIG. 44 is an overall plan view depicting an SRAM chip layout.
Figure 46:
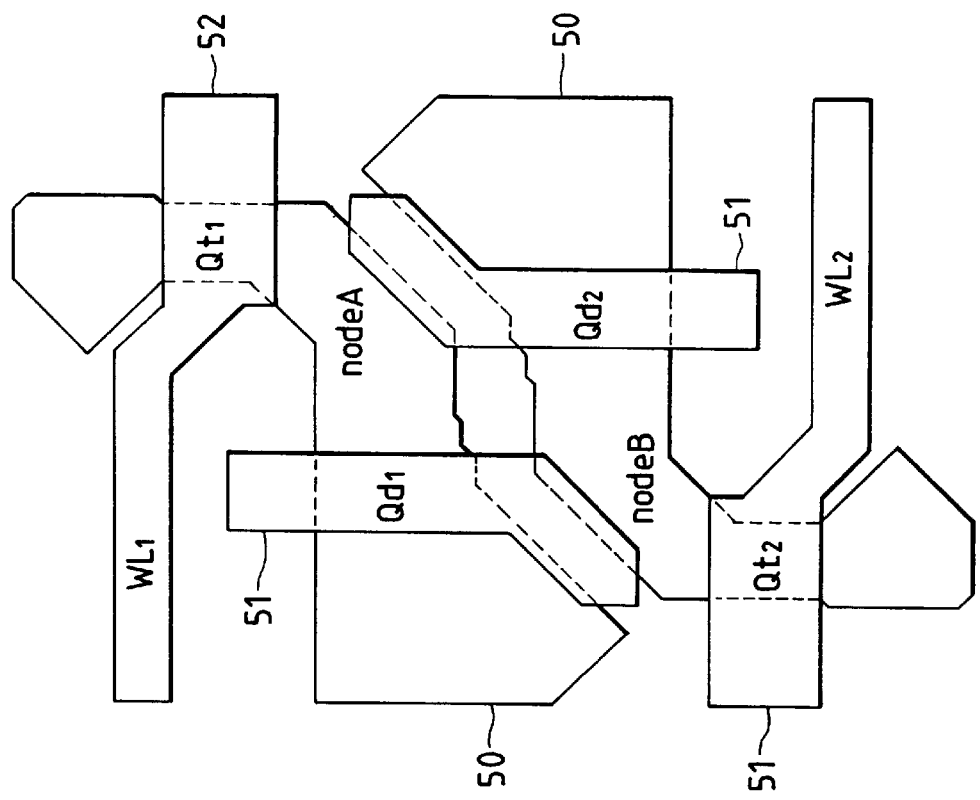
FIG. 46 is a plan view portraying a layout pattern including active regions, gate electrodes of driver MISFETs, and gate electrodes (word lines) of transfer MISFETs constituting a memory cell.
Figure 45:
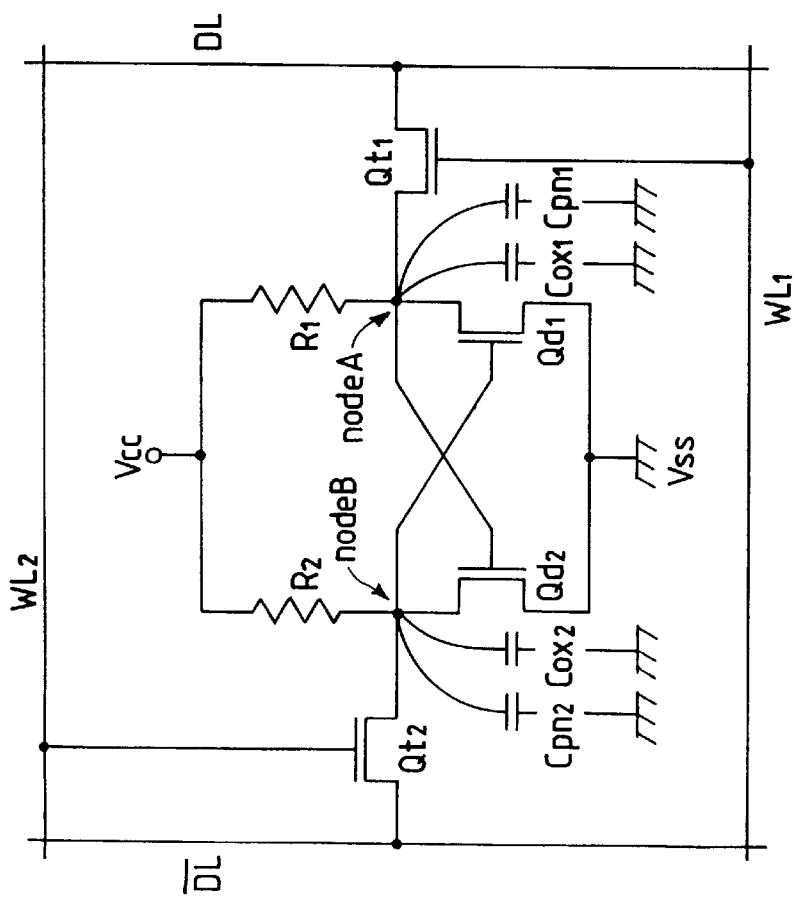
FIG. 45 is an equivalent circuit diagram of an SRAM memory cell.

For example, the memory cells, instead of being formed as high resistance load type memory cells in one embodiment described above, may be composed of complete CMOS memory cells comprising load p-channel MISFETs of a TFT (thin film transistor) structure deposited over the driver MISFETS. FIG. 43 is a schematic cross-sectional view of a semiconductor substrate, illustrating a bipolar CMOS SRAM combining complete CMOS memory cells with peripheral circuits which include n-channel MISFETs Qn of the LDD structure, p-channel MISFETs Qp and npn bipolar transistors Qb.

The load MISFET $Qp_1$ is constituted by a gate electrode 100 made of the second layer polycrystal silicon film, by a p-type source region 101s made of the third layer polycrystal silicon film deposited on the gate electrode 100 with a silicon oxide gate insulating film 102 interposed therebetween, by a p-type drain region 101d, and by a nondoped channel region 101c. The drain region 101d of the load MISFET $Qp_1$ is connected to the gate electrode 100 of another load MISFET $Qp_2$, not shown, and is further connected via the gate electrode 100 to the drain region ($n^+$ type semiconductor region 9) of the transfer MISFET Qt$_2$. The structure of the other parts in the memory cell and that of the associated peripheral circuits are the same as those of the bipolar CMOS SRAM shown in FIG. 42.

The present invention may also be applied to an SRAM having memory cells whose loads are constituted by bulk p-channel MISFETs formed on a semiconductor substrate. The memory cells may also be combined with a stacked capacitor structure involving three or more polycrystal silicon film layers. The arrangement if implemented increases the capacitance of storage nodes, whereby the operating voltage required is further reduced.

The invention may be applied to a CMOS SRAM or a bipolar CMOS SRAM with its devices separated by U-grooves formed on the semiconductor substrate. The invention may also be applied to a CMOS SRAM or a bipolar CMOS SRAM whose devices are formed on an SOI substrate having an insulating layer (e.g., silicon oxide layer) interposed between a semiconductor substrate and a buried layer.

The major features provided by the present invention are summarized as follows:

(1) According to the invention, near the edge of the active regions, at least one of the source and drain regions of the driver MISFET is offset against the gate electrode. This prevents leaks from occurring between the storage node (drain region) and the reference voltage (source region) even when the mask alignment allowance for the gate electrode edge is reduced to let the edge of the gate electrode on the field insulating film approach the active regions.

Because the mask alignment allowance for the gate electrode edge is reduced, it is possible to enlarge the area of the active regions without increasing the memory cell size and to enhance the effective area of the gate electrode of the driver MISFETs, whereby the gate capacitance component of the storage node capacitance is boosted.

(2) According to the invention, at one edge of the gate electrode for the driver MISFET, the spacing distance (or gap) between the gate electrode of the driver MISFET and that of the transfer MISFET is made substantially the same in at least two directions. The spacing distance (or gap) between the gate electrode of the driver MISFET in this cell and that of a driver MISFET in an adjacent memory cell is made substantially equal to the spacing distance (or gap) between the gate electrode of the driver MISFET and that of the transfer MISFET. This arrangement prevents the contraction of the photo resist pattern at the edge of the gate electrodes of the driver MISFETs.

Because the mask alignment allowance for the gate electrode edge is reduced, it is possible to enlarge the area of the active regions without increasing the memory cell size and to enhance the effective area of the gate electrode of the driver MISFETs, whereby the gate capacitance component of the storage node capacitance is boosted.

(3) According to the invention, the spacing distance (or gap) between the gate electrode of the driver MISFET and that of the transfer MISFET, the line width of the gate electrode of the transfer MISFET, and the spacing distance (or gap) between the gate electrode of the transfer MISFET and that of the transfer MISFET in the adjacent memory cell, are all made substantially the same. This arrangement affords periodicity to three kinds of spacing distances: the spacing distance (or gap) between the gate electrode of the driver MISFET and the gate electrode (word line) of the transfer MISFET, the line width of the word line, and the spacing distance (or gap) between adjacently disposed word lines, near the edge of the gate electrodes for the driver MISFETs.

Thus when the photo resist pattern is formed for use by the demagnifying projection aligner exposing the photo resist film to fabricate the gate electrodes of the driver MISFETs and the gate electrodes (word lines) of the transfer MISFETs, it is possible to prevent the contraction of the photo resist pattern at the edge of the gate electrodes of the driver MISFETs.

With the contraction of the photo resist pattern thus prevented, the mask alignment allowance for the edge portion of the gate electrode is reduced. As a result, the area of the active regions is increased without enlarging the memory cell size, and the effective area of the gate electrodes for the driver MISFETs is boosted so as to raise the gate capacitance component of the storage node capacitance.

(4) According to the invention, the gate length of the intrinsic channel forming region of the driver MISFET is made at least double the gate length of the MISFET which has the shortest gate length and which constitutes part of a memory cell or a peripheral circuit. This arrangement makes substantially negligible the amount of contraction of the gate electrode edge during gate electrode fabrication.

With the amount of gate electrode edge contraction reduced to a negligible quantity, the mask alignment allowance for the edge portion of the gate electrode is reduced. It follows that the area of the active regions is increased without enlarging the memory cell size, and that the effective area of the gate electrodes for the driver MISFETs is boosted so as to raise the gate capacitance component of the storage node capacitance. p (5) According to the invention, the overlapping length between the gate electrode and the drain region of the driver MISFET is made at least double the overlapping length between the gate electrode and the drain region of the MISFET having the minimum gate length in any memory cell or peripheral circuit. This arrangement prevents the driving capability from dropping when the gate length of the driver MISFET is prolonged.

(6) According to the invention, the gate length of the driver MISFET near the active regions is made longer than the gate length in the channel forming region. This makes it possible to enlarge the area of the gate electrodes of the driver MISFETs and to boost the gate capacitance component of the storage node capacitance.

(7) According to the invention, under the drain region of the driver MISFET is buried a semiconductor region which has a conductivity type different from that of the drain region and which has a higher level of impurity density than the semiconductor substrate. The semiconductor region is located so as to contact the drain region bottom. This arrangement increases the pn junction component of the storage node capacity.

(8) Because the features (1) through (7) above all contribute to boosting the storage node capacitance, the resistance of the SRAM to soft errors is enhanced appreciably.

What is claimed is:

1. A semiconductor integrated circuit device comprising:
   a semiconductor substrate having a main surface;
   memory cells of a static random access memory, each including at least one pair of a driver MISFET and a transfer MISFET;
   an element isolating film defining a first active region of said main surface,
   wherein said driver MISFET has a source region, a drain region and a channel forming region formed, within said first active region in said semiconductor substrate, and has a gate electrode formed over said first active region and a gate insulating film formed between said first active region and said gate electrode, wherein said gate electrode of said driver MISFET includes a conductive layer and is extended in a first direction such that said channel forming region is arranged, in a second direction substantially perpendicular to said first direction, between said source region and said drain region, and such that an edge portion of said gate electrode of said driver MISFET is extended over said element isolating film and said first active region, wherein said edge portion positioned over said first active region has a length, in said second direction, at least double the minimum resolution increment of a demagnifying projection aligner in use for said conductive layer for the formation of said gate electrode of said driver MISFET under design rules in accordance with the minimum resolution increment, wherein said gate electrode of said driver MISFET includes a first portion spaced apart from said edge portion in said first direction, said first portion being positioned over said channel forming region of said driver MISFET, and wherein the length of said edge portion, in said second direction, is greater than that of a length of said first portion in said second direction; and word lines formed over said main surface and substantially extending in said second direction, each of said word lines being electrically connected to gate electrodes of transfer MISFETs corresponding thereto and being formed by a same level layer as that of said gate electrode of said driver MISFET, wherein a first spacing distance, in said first direction, between said word line and one edge portion of said gate electrode of said driver MISFET is substantially equal to a second spacing distance, in a direction different from said first direction, between said word line and another edge portion of said gate electrode of said driver MISFET, and wherein said first spacing distance is substantially equal to a third spacing distance, in said second direction, between gate electrodes of adjacent driver MISFETs each of which corresponds to a different one of a pair of adjacently disposed memory cells in said second direction.

2. A semiconductor integrated circuit device according to claim 1, wherein said first spacing distance is substantially equal to that of a width, measured in said first direction, of said word line, and wherein said first spacing distance is substantially equal to a fourth spacing distance, in said first direction, between two adjacently disposed word lines in said first direction.

3. A semiconductor integrated circuit device comprising:

a semiconductor substrate having a main surface;

memory cells of a static random access memory provided at said main surface, each including at least one pair of a driver MISFET and a transfer MISFET; and word lines formed over said main surface and arranged in a first direction, each word line being extended in a second direction substantially perpendicular to said first direction and electrically connected to gate electrodes of transfer MISFETs corresponding thereto;

wherein said driver MISFET has a gate electrode, a source region, a drain region and a channel forming region, wherein said gate electrode of said driver MISFET includes a conductive layer and is extended in said first direction such that said channel forming region is arranged in said second direction between said source region and said drain region, wherein said word line is formed by a same level layer as that of said gate electrode of said driver MISFET, wherein a first spacing distance, in said first direction, between said word line and one edge portion of said gate electrode of said driver MISFET is substantially equal to a second spacing distance, in a direction different from said first direction, between said word line and another edge portion of said gate electrode of said driver MISFET, and wherein said first spacing distance is substantially equal to a third spacing distance, in said second direction, between gate electrodes of adjacent driver MISFETs each of which corresponds to a different one of a pair of adjacently disposed memory cells in said second direction.

4. A semiconductor integrated circuit device according to claim 3, wherein said first spacing distance is substantially equal to that of a width, measured in said first direction, of said word line, and wherein said first spacing distance is substantially equal to a fourth spacing distance, in said first direction, between two adjacently disposed word lines in said first direction.

5. A semiconductor integrated circuit device comprising:

a semiconductor substrate having a main surface; and memory cells of a static random access memory, each including at least one pair of a driver MISFET and a transfer MISFET;

an element isolating film defining a first active region of said main surface, wherein said driver MISFET has a source region, a drain region and a channel forming region formed, within said first active region, in said semiconductor substrate, and has a gate electrode formed over said first active region and a gate insulating film formed between said first active region and said sate electrode, and wherein said gate electrode of said driver MISFET is extended in a first direction such that said channel forming region is arranged, in a second direction substantially perpendicular to said first direction, between said source region and said drain region, and such that an edge portion of said gate electrode of said driver MISFET is extended over said element isolating film and said first active region; and word lines formed over said main surface and substantially extending in a second direction, each word line being electrically connected to gate electrodes of transfer MISFETs corresponding thereto and being formed by a same level layer as that of said gate electrode of said driver MISFET, wherein a first spacing distance, in said first direction, between said word line and one edge portion of said gate electrode of said driver MISFET is substantially equal to a second spacing distance, in a direction different from said first direction, between said word line and another edge portion of said gate electrode of said driver MISFET, and wherein said first spacing distance is substantially equal to a third spacing distance, in said second direction, between gate electrodes of adjacent driver MISFETs each of which corresponds to a different one of a pair of adjacently disposed memory cells in said second direction.

6. A semiconductor integrated circuit device according to claim 5, wherein said first spacing distance is substantially equal to that of the a width, measured in said first direction, of said word line, and wherein said first spacing distance is substantially equal to a fourth spacing distance, in said first direction, between two adjacently disposed word lines is said first direction.

7. A semiconductor integrated circuit device comprising:

semiconductor substrate having a main surface;

memory cells of a static random access memory, each including at least one pair of a driver MISFET and a transfer MISFET, said driver MISFET being formed on a first active region of said main surface, and said driver MISFET having a source and a drain region formed in said semiconductor substrate and a gate electrode formed over said first active region; and word lines formed over said main surface and arranged in a first direction, each word line being formed integrally with gate electrodes of said transfer MISFETs corresponding thereto and being formed by a same level layer as that of said gate electrode of said driver MISFET, said gate electrode of said driver MISFET extending in said first direction and said word lines, respectively, are substantially extended in a second direction, perpendicular to said first direction, in such a manner that said drain region and said source region are arranged in said second direction, wherein a first spacing distance, in said first direction, between said word line and one edge portion of said gate electrode of said driver MISFET is substantially equal to a second spacing distance, in a direction different from said first direction, between said word line and another edge portion of said gate electrode of said driver MISFET, wherein said first spacing distance is substantially equal to a third spacing distance, in said second direction, between said gate electrodes of adjacent driver MISFETs each of which corresponds to a different one of a pair of adjacently disposed memory cells in said second direction, and wherein said first spacing distance is substantially equal to that of a width, measured in said first direction, of said word line, and wherein said first spacing distance is substantially equal to a fourth spacing distance, in said first direction, between two adjacently disposed word lines in said first direction.

8. A semiconductor integrated circuit device according to claim 7, further comprising:

a MISFET for a peripheral circuit having a gate electrode formed over said main surface, wherein said gate electrode of said MISFET of said peripheral circuit has a gate length corresponding to a minimum gate length in said peripheral circuit and is formed by a same level layer as that of said gate electrode of said driver MISFET, and wherein said gate electrode of said driver MISFET has a gate length which is at least two times greater than said gate length of said MISFET of said peripheral circuit.

9. A semiconductor integrated circuit device comprising:

a semiconductor substrate having a main surface;

memory cells of a static random access memory, each including at least one pair of a driver MISFET and a transfer MISFET;

an element isolating film defining a first active region of said main surface, wherein said driver MISFET has a source region, a drain region and a channel forming region formed, within said first active region, in said semiconductor substrate, and has a gate electrode formed over said first active region and a gate insulating film formed between said first active region and said gate electrode, wherein said gate electrode of said driver MISFET includes a conductive layer and is extended in a first direction such that said channel forming region is arranged, in a second direction substantially perpendicular to said first direction, between said source region and said drain region, and such that an edge portion of said gate electrode of said driver MISFET is extended over said element isolating film and said first active region, wherein said edge portion positioned over said first active region has a length, in said second direction, at least double the minimum resolution increment of a demagnifying projection aligner in use for said conductive layer for the formation of said gate electrode of said driver MISFET under design rules in accordance with the minimum resolution increment, wherein said gate electrode of said driver MISFET includes a first portion spaced apart from said edge portion in said first direction, said first portion being positioned over said channel forming region of said driver MISFET, and wherein the length of said edge portion, in said second direction, is greater than that of a length of said first portion in said second direction; and a MISFET for a peripheral circuit having a gate electrode formed over said main surface, wherein said gate electrode of said driver MISFET is formed by a same level layer as that for forming said gate electrode of said MISFET of said peripheral circuit, and wherein said edge portion of said gate electrode of said driver MISFET has a length, in said second direction, at least two times greater than said gate length of said MISFET of said peripheral circuit.

10. A semiconductor integrated circuit device according to claim 9, wherein an overlapping length between said drain region of said driver MISFET and said first portion of said gate electrode thereof is at least two times greater than an overlapping length between a drain region of said MISFET of said peripheral circuit and said gate electrode thereof.

11. A semiconductor integrated circuit device comprising:

a semiconductor substrate having a main surface;

memory cells of a static random access memory, each including at least one pair of a driver MISFET and a transfer MISFET;

an element isolating film defining a first active region of said main surface, wherein said driver MISFET has a source region, a drain region and a channel forming region formed, within said first active region, in said semiconductor substrate, and has a gate electrode formed over said first active region and a gate insulating film formed between said first active region and said gate electrode, wherein said gate electrode of said driver MISFET includes a conductive layer and is extended in a first direction such that said channel forming region is arranged, in a second direction substantially perpendicular to said first direction, between said source region and said drain region, and such that an edge portion of said gate electrode of said driver MISFET is extended over said element isolating film and said first active region, wherein said edge portion positioned over said first active region has a length, in said second direction, at least double the minimum resolution increment of a demagnifying projection aligner in use for said conductive layer for the formation of said gate electrode of said driver MISFET under design rules in accordance with the minimum resolution increment, wherein said gate electrode of said driver MISFET includes a first portion spaced apart from said edge portion in said first direction, said first portion being positioned over said channel forming region of said driver MISFET, and wherein the length of said edge portion, in said second direction, is greater than that of a length of said first portion in said second direction; and a MISFET for a peripheral circuit having a gate electrode formed over said main surface, wherein an overlapping length between said drain region of said driver MISFET and said first portion of said gate electrode thereof is at least two times greater than an overlapping length between a drain region of said MISFET of said peripheral circuit and said gate electrode thereof.

12. A semiconductor integrated circuit device according to claim 11, wherein, in a plane view in parallel with said main surface, at least one of said source and drain regions of said driver MISFET is not formed, within said first active region, near said edge portion, positioned over said first active region, of said gate electrode of said driver MISFET.

13. A semiconductor integrated circuit device according to claim 12, wherein said at least one of said source and drain regions of each driver MISFET is the source region thereof.

14. A semiconductor integrated circuit device according to claim 13, wherein the gate electrodes of said driver and transfer MISFETs are formed from a same first layer polycrystalline silicon film, and wherein each word line is integrally formed with the gate electrodes of transfer MISFETs associated therewith and is extended principally over said element isolating film.

15. A semiconductor integrated circuit device comprising:

a semiconductor substrate having a main surface;

memory cells of a static random access memory arranged in a matrix as rows and columns of memory cells, each memory cell including first and second driver MISFETs, first and second transfer MISFETs and first and second load elements, the first driver MISFET having a drain region electrically connected to a first end of the first load element, to a source region of the first transfer MISFET and to a gate electrode of the second driver MISFET, and the second driver MISFET having a drain region electrically connected to a first end of the second load element, to a source region of the second transfer MISFET and to a gate electrode of the first driver MISFET, the load elements having second ends thereof to be applied with an operating voltage and source regions of the driver MISFETs to be applied with a reference potential; and a plurality of pairs of first and second word lines formed over said main surface and arranged in a first, column direction, each pair of first and second word lines substantially extending in a second, row direction and being formed integrally with the gate electrodes of the first and second transfer MISFETs, respectively, of a corresponding row of memory cells, said first word line of one row being disposed near said first word line of the next, adjacent row in the column direction and said second word line of said one row being disposed near said second word line of the opposing adjacent row in the matrix arrangement, wherein the word lines and gate electrodes of driver MISFETs are formed by a same level conductive layer, wherein said first and second driver MISFETs are formed on first and second active regions of said main surface and the source and drain regions of which are formed in said semiconductor substrate, respectively, wherein a first spacing distance, in said first direction, between said first word line of a row and one edge portion of said gate electrode of each said first driver MISFET of that row and between said second word line of a row and one edge portion of said gate electrode of each said second driver MISFET of that row are substantially equal to a second spacing distance, in a direction different from said first direction, between said first and second word lines with that of another edge portion of said gate electrode of said first and second driver MISFETs of that row, wherein said first spacing distance is substantially equal to a third spacing distance, in said second direction, between that of said gate electrodes of adjacent said first driver MISFETs in the row direction and between that of said gate electrodes of adjacent said second driver MISFETs in said second direction, and wherein said first spacing distance is substantially equal to that of a width, measured in said first direction, of each said word line, and is substantially equal to a fourth spacing distance, in said first direction, between that of any two adjacently disposed first word lines and between that of any two adjacently disposed second word lines in said first direction.

16. A semiconductor integrated circuit device according to claim 15, further comprising:

a MISFET for a peripheral circuit having a gate electrode formed over said main surface, wherein said gate electrode of said MISFET of said peripheral circuit has a gate length corresponding to a minimum gate length in said peripheral circuit and is formed by a same level layer as that of said gate electrode of said first and second driver MISFETs, and wherein said gate electrode of each of said first and second driver MISFETs has a gate length which is at least two times greater than said gate length of said MISFET of said peripheral circuit.

17. A semiconductor integrated circuit device according to claim 16, wherein, in a plane view in parallel with said main surface, at least one of said source and drain regions of both said first and second driver MISFETs are not formed, within said first and second active regions, respectively, near said edge portion, positioned over said first and second active regions, of said gate electrode of said first and second driver MISFETs.

18. A semiconductor integrated circuit device according to claim 17, further comprising element isolating films which define the first and second active regions of memory cells.

* * * * *